US010205484B2

(12) United States Patent
Henry et al.

(10) Patent No.: US 10,205,484 B2
(45) Date of Patent: *Feb. 12, 2019

(54) METHOD AND APPARATUS FOR RESPONDING TO EVENTS AFFECTING COMMUNICATIONS IN A COMMUNICATION NETWORK

(71) Applicant: AT&T Intellectual Property I, L.P., Atlanta, GA (US)

(72) Inventors: Paul Shala Henry, Holmdel, NJ (US); Robert Bennett, Southold, NY (US); Irwin Gerszberg, Kendall Park, NJ (US); Farhad Barzegar, Branchburg, NJ (US); Donald J. Barnickel, Flemington, NJ (US); Thomas M. Willis, Tinton Falls, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/665,592

(22) Filed: Aug. 1, 2017

(65) Prior Publication Data
US 2017/0331517 A1 Nov. 16, 2017

Related U.S. Application Data

(63) Continuation of application No. 14/519,373, filed on Oct. 21, 2014, now Pat. No. 9,769,020.

(51) Int. Cl.
*H01P 3/10* (2006.01)
*H01P 3/00* (2006.01)
(Continued)

(52) U.S. Cl.
CPC ............ *H04B 3/46* (2013.01); *G01R 31/021* (2013.01); *G01R 31/08* (2013.01); *H04B 3/06* (2013.01);
(Continued)

(58) Field of Classification Search
CPC ..... H04B 3/52; H01P 3/10; H01P 3/16; H01P 5/107; H01P 5/00; H01P 5/087; H01P 5/1022; H01P 5/103; H01P 5/18
See application file for complete search history.

(56) References Cited

U.S. PATENT DOCUMENTS 2,685,068 A 7/1954 Goubau
2,852,753 A 9/1958 Walter et al.
(Continued)

FOREIGN PATENT DOCUMENTS

CA 2515560 A1 2/2007
JP 2004088771 A 3/2004
(Continued)

OTHER PUBLICATIONS

"International Preliminary Report on Patentability & Written Opinion", PCT/US2015/051193, dated May 4, 2017, 8 pages.
(Continued)

*Primary Examiner* — Marsha D Banks Harold
*Assistant Examiner* — Elton Williams
(74) *Attorney, Agent, or Firm* — Guntin & Gust, PLC; Robert Gingher

(57) ABSTRACT

Aspects of the subject disclosure may include, for example, a waveguide system for determining an event associated with a mode of transmitting or receiving electromagnetic waves on a surface of a transmission medium, identifying according to the event an updated mode for transmitting or receiving adjusted electromagnetic waves on the surface of a transmission medium, and transmitting or receiving the adjusted electromagnetic waves based on the updated mode. Other embodiments are disclosed.

20 Claims, 27 Drawing Sheets

(51) Int. Cl.

| | |
|---|---|
| *H01P 5/107* | (2006.01) |
| *H04B 3/46* | (2015.01) |
| *H04L 12/24* | (2006.01) |
| *H04B 3/06* | (2006.01) |
| *H04B 3/52* | (2006.01) |
| *H04B 3/54* | (2006.01) |
| *H04W 24/02* | (2009.01) |
| *G01R 31/02* | (2006.01) |
| *G01R 31/08* | (2006.01) |
| *H04L 29/08* | (2006.01) |

(52) U.S. Cl.
CPC .............. *H04B 3/52* (2013.01); *H04B 3/54* (2013.01); *H04B 3/542* (2013.01); *H04L 41/0816* (2013.01); *H04L 41/12* (2013.01); *H04W 24/02* (2013.01); *H04L 67/10* (2013.01)

(56) References Cited

U.S. PATENT DOCUMENTS

| | | | |
|---|---|---|---|
| 2,921,277 | A | 1/1960 | Goubau |
| 5,889,449 | A | 3/1999 | Fiedziuszko |
| 6,239,377 | B1 | 5/2001 | Nishikawa et al. |
| 7,009,471 | B2 | 3/2006 | Elmore |
| 7,567,154 | B2 | 7/2009 | Elmore |
| 7,590,404 | B1 | 9/2009 | Johnson et al. |
| 8,159,385 | B2 | 4/2012 | Farneth et al. |
| 8,212,635 | B2 | 7/2012 | Miller, II et al. |
| 8,253,516 | B2 | 8/2012 | Miller, II et al. |
| 8,269,583 | B2 | 9/2012 | Miller, II et al. |
| 8,344,829 | B2 | 1/2013 | Miller, II et al. |
| 10,003,364 | B1 | 6/2018 | Willis, III et al. |
| 10,009,065 | B2 | 6/2018 | Henry et al. |
| 10,009,901 | B2 | 6/2018 | Gerszberg |
| 10,027,397 | B2 | 7/2018 | Kim |
| 10,027,427 | B2 | 7/2018 | Vannucci et al. |
| 10,033,107 | B2 | 7/2018 | Henry et al. |
| 10,033,108 | B2 | 7/2018 | Henry et al. |
| 10,044,409 | B2 | 8/2018 | Barzegar et al. |
| 2004/0113756 | A1 | 6/2004 | Mollenkopf et al. |
| 2005/0042989 | A1 | 2/2005 | Ho et al. |
| 2005/0258920 | A1 | 11/2005 | Elmore |
| 2007/0189182 | A1 | 8/2007 | Berkman et al. |
| 2008/0064331 | A1 | 3/2008 | Washiro et al. |
| 2008/0211727 | A1 | 9/2008 | Elmore et al. |
| 2008/0252541 | A1 | 10/2008 | Diaz et al. |
| 2009/0079660 | A1 | 3/2009 | Elmore et al. |
| 2009/0258652 | A1 | 10/2009 | Lambert et al. |
| 2010/0225426 | A1 | 9/2010 | Unger et al. |
| 2010/0277003 | A1 | 11/2010 | Von et al. |
| 2011/0110404 | A1 | 5/2011 | Washiro |
| 2011/0132658 | A1 | 6/2011 | Miller, II et al. |
| 2011/0140911 | A1 | 6/2011 | Pant et al. |
| 2011/0187578 | A1 | 8/2011 | Farneth et al. |
| 2012/0250752 | A1 | 10/2012 | McHann et al. |
| 2013/0064311 | A1 | 3/2013 | Turner et al. |
| 2014/0269260 | A1 | 9/2014 | Xue et al. |
| 2014/0285277 | A1 | 9/2014 | Herbsommer et al. |
| 2015/0326274 | A1 | 11/2015 | Flood |
| 2016/0080839 | A1 | 3/2016 | Fuchs et al. |
| 2016/0112093 | A1 | 4/2016 | Barzegar |
| 2016/0112263 | A1 | 4/2016 | Henry et al. |
| 2016/0164571 | A1 | 6/2016 | Bennett et al. |
| 2016/0182096 | A1 | 6/2016 | Panioukov et al. |
| 2016/0315662 | A1 | 10/2016 | Henry |
| 2016/0359541 | A1 | 12/2016 | Bennett |
| 2016/0359546 | A1 | 12/2016 | Bennett |
| 2016/0359547 | A1 | 12/2016 | Bennett et al. |
| 2016/0360533 | A1 | 12/2016 | Bennett et al. |
| 2016/0365966 | A1 | 12/2016 | Bennett et al. |
| 2017/0012667 | A1 | 1/2017 | Bennett |
| 2017/0018856 | A1 | 1/2017 | Henry et al. |
| 2017/0033465 | A1 | 2/2017 | Henry et al. |
| 2017/0033953 | A1 | 2/2017 | Henry et al. |
| 2017/0033954 | A1 | 2/2017 | Henry et al. |
| 2017/0079037 | A1 | 3/2017 | Gerszberg et al. |
| 2017/0079038 | A1 | 3/2017 | Gerszberg et al. |
| 2017/0079039 | A1 | 3/2017 | Gerszberg et al. |
| 2017/0085003 | A1 | 3/2017 | Johnson et al. |
| 2017/0093693 | A1 | 3/2017 | Barzegar et al. |
| 2017/0110795 | A1 | 4/2017 | Henry |
| 2017/0110804 | A1 | 4/2017 | Henry et al. |
| 2017/0111805 | A1 | 4/2017 | Barzegar et al. |
| 2017/0229782 | A1 | 8/2017 | Adriazola et al. |
| 2018/0048497 | A1 | 2/2018 | Henry et al. |
| 2018/0054232 | A1 | 2/2018 | Henry et al. |
| 2018/0159243 | A1 | 6/2018 | Britz et al. |

FOREIGN PATENT DOCUMENTS

| | | |
|---|---|---|
| JP | 2004248181 A | 9/2004 |
| JP | 2011114443 A | 6/2011 |
| JP | 2014526820 A | 10/2014 |
| WO | 2016060761 A1 | 4/2016 |
| WO | 2016064505 A1 | 4/2016 |

OTHER PUBLICATIONS

"International Search Report & Written Opinion", PCT/US2015/051193, dated Nov. 27, 2015.

Akalin, Tahsin et al., "Single-Wire Transmission Lines at Terahertz Frequencies", IEEE Transactions on Microwave Theory and Techniques, vol. 54, No. 6, 2006, 2762-2767.

Barlow, H. M. et al., "Surface Waves", 621.396.11 : 538.566, Paper No. 1482 Radio Section, 1953, pp. 329-341.

Corridor Systems, "A New Approach to Outdoor DAS Network Physical Layer Using E-Line Technology", Mar. 2011, 5 pages.

Goubau, Georg et al., "Investigation of a Surface-Wave Line for Long Distance Transmission", 1952, 263-267.

Goubau, Georg et al., "Investigations with a Model Surface Wave Transmission Line", IRE Transactions on Antennas and Propagation, 1957, 222-227.

Goubau, Georg, "Open Wire Lines", IRE Transactions on Microwave Theory and Techniques, 1956, 197-200.

Goubau, Georg, "Single-Conductor Surface-Wave Transmission Lines", Proceedings of the I.R.E., 1951, 619-624.

Goubau, Georg, "Surface Waves and Their Application to Transmission Lines", Radio Communication Branch, Coles Signal Laboratory, Mar. 10, 1950, 1119-1128.

Goubau, Georg, "Waves on Interfaces", IRE Transactions on Antennas and Propagation, Dec. 1959, 140-146.

Rappaport, Theodore S. et al., "Mobile's Millimeter-Wave Makeover", Spectrum.IEEE.Org, Sep. 2014, 8 pages.

Ren-Bin, Zhong et al., "Surface plasmon wave propagation along single metal wire", Chin. Phys. B, vol. 21, No. 11, May 2, 2012, 9 pages.

Sommerfeld, A., "On the propagation of electrodynamic waves along a wire", Annals of Physics and Chemistry New Edition, vol. 67, No. 2, 1899, 72 pages.

Wang, Kanglin, "Dispersion of Surface Plasmon Polaritons on Metal Wires in the Terahertz Frequency Range", Physical Review Letters, PRL 96, 157401, 2006, 4 pages.

"EP Office Action dated Aug. 3, 2018", 4 pages.

"International Search Report and Written Opinion", PCT/US2018/015634, dated Jun. 25, 2018, 8 pages.

Alam, M. N. et al., "Novel Surface Wave Exciters for Power Line Fault Detection and Communications", Department of Electrical Engineering, University of South Carolina, Antennas and Propagation (APSURSI), 2011 IEEE International Symposium, IEEE, 2011, 1-4.

Elmore, Glenn et al., "A Surface Wave Transmission Line", QEX, May/Jun. 2012, pp. 3-9.

Elmore, Glenn, "Introduction to the Propagating Wave on a Single Conductor", www.corridor.biz, Jul. 27, 2009, 30 pages.

Friedman, M et al., "Low-Loss RF Transport Over Long Distances", IEEE Transactions on Microwave Theory and Techniques, vol. 49, No. 2, Feb. 2001, 8 pages.

(56) References Cited

OTHER PUBLICATIONS

Wang, Hao et al., "Dielectric Loaded Substrate Integrated Waveguide (SIW)—Plan Horn Antennas", IEEE Transactions on Antennas and Propagation, IEEE Service Center, Piscataway, NJ, US, vol. 56, No. 3, Mar. 1, 2010, 640-647.

METHOD AND APPARATUS FOR RESPONDING TO EVENTS AFFECTING COMMUNICATIONS IN A COMMUNICATION NETWORK

CROSS-REFERENCE TO RELATED APPLICATION(S)

This application is a continuation of U.S. patent application Ser. No. 14/519,373 filed Oct. 21, 2014 by Paul Shala Henry et al., entitled "Method and Apparatus for Responding to Events Affecting Communications in a Communication Network." All sections of the aforementioned application(s) are incorporated herein by reference in its entirety.

FIELD OF THE DISCLOSURE

The subject disclosure relates to a method and apparatus for responding to events affecting communications in a communication network.

BACKGROUND

As smart phones and other portable devices increasingly become ubiquitous, and data usage increases, macrocell base station devices and existing wireless infrastructure in turn require higher bandwidth capability in order to address the increased demand. To provide additional mobile bandwidth, small cell deployment is being pursued, with microcells and picocells providing coverage for much smaller areas than traditional macrocells.

DETAILED DESCRIPTION

Figure 1:
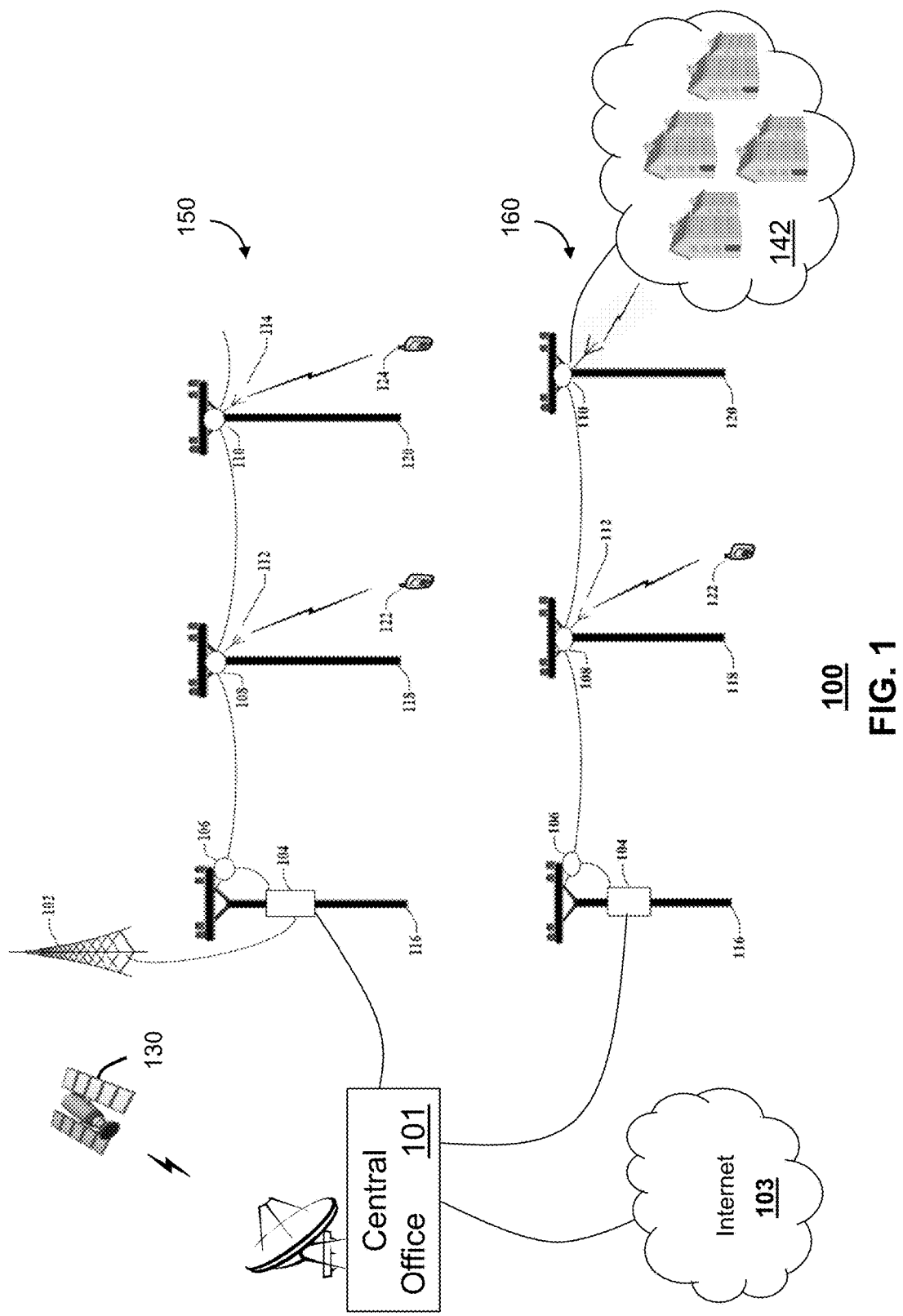
FIG. 1 is a block diagram illustrating an example, non-limiting embodiment of a guided wave communications system in accordance with various aspects described herein.

One or more embodiments are now described with reference to the drawings, wherein like reference numerals are used to refer to like elements throughout. In the following description, for purposes of explanation, numerous details are set forth in order to provide a thorough understanding of the various embodiments. It is evident, however, that the various embodiments can be practiced without these details (and without applying to any particular networked environment or standard).

To provide network connectivity to additional base station devices, the backhaul network that links the communication cells (e.g., microcells and macrocells) to network devices of the core network correspondingly expands. Similarly, to provide network connectivity to a distributed antenna system, an extended communication system that links base station devices and their distributed antennas is desirable. A guided wave communication system can be provided to enable alternative, increased or additional network connectivity and a waveguide coupling system can be provided to transmit and/or receive guided wave (e.g., surface wave) communications on a wire, such as a wire that operates as a single-wire transmission line (e.g., a utility line), that operates as a waveguide and/or that otherwise operates to guide the transmission of an electromagnetic wave.

In an embodiment, a waveguide coupler that is utilized in a waveguide coupling system can be made of a dielectric material, or other low-loss insulator (e.g., Teflon, polyethylene and etc.), or even be made of a conducting (e.g., metallic, non-metallic, etc.) material, or any combination of the foregoing materials. Reference throughout the detailed description to "dielectric waveguide" is for illustration purposes and does not limit embodiments to being constructed solely of dielectric materials. In other embodiments, other dielectric or insulating materials are possible. It will be appreciated that a variety of transmission media can be utilized with guided wave communications without departing from example embodiments. Examples of such transmission media can include one or more of the following, either alone or in one or more combinations: wires, whether insulated or not, and whether single-stranded or multi-stranded; conductors of other shapes or configurations including wire bundles, cables, rods, rails, pipes; non-conductors such as dielectric pipes, rods, rails, or other dielectric members; combinations of conductors and dielectric materials; or other guided wave transmission media.

For these and/or other considerations, in one or more embodiments, an apparatus comprises a waveguide that facilitates propagation of a first electromagnetic wave at least in part on a waveguide surface, wherein the waveguide surface does not surround in whole or in substantial part a wire surface of a wire, and, in response to the waveguide being positioned with respect to the wire, the first electromagnetic wave couples at least in part to the wire surface and travels at least partially around the wire surface as a second electromagnetic wave, and wherein the second electromagnetic wave has at least one wave propagation mode for propagating longitudinally along the wire.

In another embodiment, an apparatus comprises a waveguide that has a waveguide surface that defines a cross sectional area of the waveguide wherein a wire is positioned outside of the cross-sectional area of the waveguide such that a first electromagnetic wave, traveling along the wire at least in part on the wire surface, couples at least in part to the waveguide surface and travels at least partially around the waveguide surface as a second electromagnetic wave.

In an embodiment, a method comprises emitting, by a transmission device, a first electromagnetic wave that propagates at least in part on a waveguide surface of a waveguide, wherein the waveguide is not coaxially aligned with a wire. The method can also include configuring the waveguide in proximity of the wire to facilitate coupling of at least a part of the first electromagnetic wave to a wire surface, forming a second electromagnetic wave that propagates longitudinally along the wire and at least partially around the wire surface.

In another embodiment, an apparatus comprises, in one or more embodiments, a waveguide having a slot formed by opposing slot surfaces that are non-parallel, wherein the opposing slot surfaces are separated by a distance that enables insertion of a wire in the slot, wherein the waveguide facilitates propagation of a first electromagnetic wave at least in part on a waveguide surface, and, in response to the waveguide being positioned with respect to the wire, the first electromagnetic wave couples at least in part to a wire surface of the wire and travels at least partially around the wire surface as a second electromagnetic wave for propagating longitudinally along the wire, and wherein the second electromagnetic wave has at least one wave propagation mode.

In another embodiment, an apparatus comprises, in one or more embodiments, a waveguide, wherein the waveguide comprises a material that is not electrically conductive and is suitable for propagating electromagnetic waves on a waveguide surface of the waveguide, wherein the waveguide facilitates propagation of a first electromagnetic wave at least in part on the waveguide surface, and, in response to the waveguide being positioned with respect to a wire, the first electromagnetic wave couples at least in part to a wire surface of the wire and travels at least partially around the wire surface as a second electromagnetic wave, and wherein the second electromagnetic wave has at least one wave propagation mode for propagating longitudinally along the wire.

One embodiment of the subject disclosure includes an apparatus having a waveguide that facilitates transmission or reception of electromagnetic waves along a surface of a wire of a power grid that also facilitates delivery of electric energy to devices. The apparatus can further include one or more sensors that facilitate sensing of a disturbance that is adverse to the waveguide, the wire, the transmission or reception of electromagnetic waves that propagate along the surface or waveguide surface, or any combination thereof.

One embodiment of the subject disclosure includes a method for transmitting, by an apparatus having a waveguide and a sensor, electromagnetic waves that propagate along a surface of a wire that facilitates delivery of electric energy to devices, and sensing, by the sensor, a disturbance that is adverse to the electromagnetic waves that propagate along the surface.

One embodiment of the subject disclosure includes a machine-readable (e.g., computer-readable, processor-readable, etc.) storage medium having executable instructions that, when executed by a processor, facilitate performance of operations, including inducing with or via a waveguide, electromagnetic waves guided along a surface of a transmission medium, and collecting sensing data from a sensor, the sensing data associated with a disturbance that is adverse to the electromagnetic waves guided along the surface of the transmission medium.

One embodiment of the subject disclosure includes an apparatus having a processor and a memory. The processor can perform an operation of receiving telemetry information from a waveguide system coupled to a sensor, detecting from the telemetry information a disturbance that is adverse to one of operations of the waveguide system, the transmission or reception of the electromagnetic waves along the wire surface or the waveguide surface, or a combination thereof, and reporting the disturbance. The waveguide system can comprise a waveguide that can be positioned with respect to a wire of a power grid that facilitates delivery of electric energy to devices. The waveguide can also facilitate transmission or reception of electromagnetic waves along a wire surface of the wire, while the sensor can facilitate sensing disturbances adverse to electromagnetic waves.

One embodiment of the subject disclosure includes a method for receiving, by a network element comprising a processor, telemetry information from a waveguide system, determining, by the network element, a disturbance from sensing data included in the telemetry information, and transmitting, by the network element, instructions to the waveguide system to adjust a route of the electromagnetic waves to avoid or compensate for the disturbance determined. The waveguide system can facilitate transmission of electromagnetic waves along a surface of a wire of a power grid and sensing of disturbances adverse to the transmission or reception of the electromagnetic waves.

One embodiment of the subject disclosure includes a machine-readable (e.g., computer-readable, processor-readable, etc.) storage medium having executable instructions that, when executed by a processor, facilitate performance of operations, including receiving telemetry information from an apparatus that induces electromagnetic waves on a surface of a wire of a power grid for delivery of communication signals to a recipient communication device coupled to the power grid, and detecting a disturbance from the telemetry information that is adverse to a delivery of the communication signals to the recipient communication device.

One embodiment of the subject disclosure includes a waveguide system comprising a first waveguide, a second waveguide, and a memory including instructions executable by a processor. The first waveguide can be positioned with respect to a first wire of a power grid that facilitates delivery of electric power to devices. The first waveguide facilitates transmission or reception of electromagnetic waves that propagate along a first surface of the first wire for transporting communications data. The second waveguide can be positioned with respect to a second wire of the power grid for facilitating transmission or reception of electromagnetic waves that propagate along a second surface of the second wire. In an example embodiment, the first wire corresponds to a primary communication link of the power grid, while the second wire corresponds to a secondary communication link of the power grid. The processor can perform operations including detecting a communication fault in the primary communication link that is adverse to the transmission or reception of electromagnetic waves that transport the communications data, and redirecting via the second waveguide the transmission or reception of electromagnetic waves transporting the communications data to the secondary communication link responsive to detecting the communication fault.

One embodiment of the subject disclosure includes a communication system comprising a plurality of waveguide systems and a memory including instructions executable by a processor. Each of the plurality of waveguide systems can facilitate transmission or reception of electromagnetic waves that transport communications data directed to a recipient device and that propagate along surfaces of a first wire or a second wire of a power grid. In an example embodiment, the first wire of the power grid is used as a primary communication link, while the second wire of the power grid is used as a backup communication link. The processor can perform operations including instructing a first waveguide system of the plurality of waveguide systems to redirect transmission or reception of electromagnetic waves transporting the communications data to the backup communication link responsive to detecting a communication fault in the primary communication link.

One embodiment of the subject disclosure includes a method for detecting a communication fault in a first wire of a power grid that affects a transmission or reception of electromagnetic waves that transport data and that propagate along surfaces of the first wire, selecting a backup communication medium from a plurality of backup communication mediums according to selection criteria, and redirecting the transmission or reception of electromagnetic waves that transport the data to the backup communication medium to circumvent the communication fault.

One embodiment of the subject disclosure includes a method for detecting an impairment associated with a wire, the impairment adversely affecting a propagation of electromagnetic waves on a surface of the wire, and adjusting a mode of communication for transmitting or receiving electromagnetic waves on the surface of the wire to mitigate the impairment.

One embodiment of the subject disclosure includes a waveguide system including a waveguide that facilitates transmission or reception of electromagnetic waves that propagate along a surface of a wire, a memory that stores instructions, and a processor coupled thereto. The processor can perform operations including detecting a condition in the wire that adversely affects a propagation of electromagnetic waves on a surface of the wire, and adjusting a wave propagation mode of the electromagnetic waves transmitted or received by the waveguide to reduce adverse effects caused by the condition.

One embodiment of the subject disclosure includes a machine-readable device, including instructions. Responsive to executing the instructions, a processor can perform operations including detecting a source of signal interference in a wire that adversely affects a propagation of electromagnetic waves generated by a waveguide system on a surface of the wire, and adjusting characteristics of the electromagnetic waves generated by the waveguide system to reduce adverse effects caused by the source of signal interference.

One embodiment of the subject disclosure includes a method for transmitting, by a waveguide system, electromagnetic test waves on a power line of the power grid, wherein the electromagnetic test waves propagate at least in part on an outer surface of the power line and are directed to another waveguide system coupled to the power line, and determining, by the waveguide system, an updated mode of communication between the waveguide system and the another waveguide system according to an analysis associated with the transmitting One embodiment of the subject disclosure includes a waveguide system having a waveguide that facilitates transmission or reception of electromagnetic waves that propagate at least in part along a surface of a wire, a memory that stores instructions and a processor. Responsive to executing the instructions, the processor can perform operations including transmitting electromagnetic test waves on the surface of the wire; and determining an updated mode of communication for transmitting or receiving adjusted electromagnetic waves on the surface of the wire based on the transmitting One embodiment of the subject disclosure includes a machine-readable device, including instructions, which when executed by a processor of a waveguide system, cause the processor to perform operations including detecting an event associated with a mode of transmitting or receiving electromagnetic waves on a surface of a transmission medium, identifying according to the event an updated mode for transmitting or receiving adjusted electromagnetic waves on the surface of a transmission medium, and transmitting or receiving the adjusted electromagnetic waves based on the updated mode.

Various embodiments described herein relate to a waveguide coupling system for launching and extracting guided wave (e.g., surface wave communications that are electromagnetic waves) transmissions from a wire. At millimeter-wave frequencies (e.g., 30 to 300 GHz), wherein the wavelength can be small compared to the size of the equipment, transmissions can propagate as waves guided by a waveguide, such as a strip or length of dielectric material or other coupler. The electromagnetic field structure of the guided wave can be inside and/or outside of the waveguide. When this waveguide is brought into close proximity to a wire (e.g., a utility line or other transmission line), at least a portion of the guided waves decouples from the waveguide and couples to the wire, and continue to propagate as guided waves, such as surface waves about the surface of the wire.

According to an example embodiment, a surface wave is a type of guided wave that is guided by a surface of the wire, which can include an exterior or outer surface of the wire, or another surface of the wire that is adjacent to or exposed to another type of medium having different properties (e.g., dielectric properties). Indeed, in an example embodiment, a surface of the wire that guides a surface wave can represent a transitional surface between two different types of media. For example, in the case of a bare or uninsulated wire, the surface of the wire can be the outer or exterior conductive surface of the bare or uninsulated wire that is exposed to air or free space. As another example, in the case of insulated wire, the surface of the wire can be the conductive portion of the wire that meets the insulator portion of the wire, or can otherwise be the insulator surface of the wire that is exposed to air or free space, or can otherwise be any material region between the insulator surface of the wire and the conductive portion of the wire that meets the insulator portion of the wire, depending upon the relative differences in the properties (e.g., dielectric properties) of the insulator, air, and/or the conductor and further dependent on the frequency and propagation mode or modes of the guided wave.

According to an example embodiment, guided waves such as surface waves can be contrasted with radio transmissions over free space/air or conventional propagation of electrical power or signals through the conductor of the wire. Indeed, with surface wave or guided wave systems described herein, conventional electrical power or signals can still propagate or be transmitted through the conductor of the wire, while guided waves (including surface waves and other electromagnetic waves) can propagate or be transmitted about the surface of the wire, according to an example embodiment. In an embodiment, a surface wave can have a field structure (e.g., an electromagnetic field structure) that lies primarily or substantially outside of the line, wire, or transmission medium that serves to guide the surface wave.

According to an example embodiment, the electromagnetic waves traveling along the wire and around the outer surface of the wire are induced by other electromagnetic waves traveling along a waveguide in proximity to the wire. The inducement of the electromagnetic waves can be independent of any electrical potential, charge or current that is injected or otherwise transmitted through the wires as part of an electrical circuit. It is to be appreciated that while a small current in the wire may be formed in response to the propagation of the electromagnetic wave along the wire, this can be due to the propagation of the electromagnetic wave along the wire surface, and is not formed in response to electrical potential, charge or current that is injected into the wire as part of an electrical circuit. The electromagnetic waves traveling on the wire therefore do not require a circuit to propagate along the wire surface. The wire therefore is a single wire transmission line that is not part of a circuit. Also, in some embodiments, a wire is not necessary, and the electromagnetic waves can propagate along a single line transmission medium that is not a wire.

According to an example embodiment, the term "about" a wire used in conjunction with a guided wave (e.g., surface wave) can include fundamental wave propagation modes and other guided waves having a circular or substantially circular field distribution (e.g., electric field, magnetic field, electromagnetic field, etc.) at least partially around a wire or other transmission medium. In addition, when a guided wave propagates "about" a wire or other transmission medium, it can do so according to a wave propagation mode that includes not only the fundamental wave propagation modes (e.g., zero order modes), but additionally or alternatively other non-fundamental wave propagation modes such as higher-order guided wave modes (e.g., $1^{st}$ order modes, $2^{nd}$ order modes, etc.), asymmetrical modes and/or other guided (e.g., surface) waves that have non-circular field distributions around a wire or other transmission medium.

For example, such non-circular field distributions can be unilateral or multi-lateral with one or more axial lobes characterized by relatively higher field strength and/or one or more nulls or null regions characterized by relatively low-field strength, zero-field strength or substantially zero field strength. Further, the field distribution can otherwise vary as a function of a longitudinal axial orientation around the wire such that one or more regions of axial orientation around the wire have an electric or magnetic field strength (or combination thereof) that is higher than one or more other regions of axial orientation, according to an example embodiment. It will be appreciated that the relative positions of the wave higher order modes or asymmetrical modes can vary as the guided wave travels along the wire.

Referring now to FIG. 1, a block diagram illustrating an example, non-limiting embodiment of a guided wave communication system 100 is shown. Guided wave communication system 100 depicts an exemplary environment in which a dielectric waveguide coupling system can be used.

Guided wave communication system 100 can comprise a first instance of a distributed system 150 that includes one or more base station devices (e.g., base station device 104) that are communicably coupled to a central office 101 and/or a macrocell site 102. Base station device 104 can be connected by a wired (e.g., fiber and/or cable), or by a wireless (e.g., microwave wireless) connection to the macrocell site 102 and the central office 101. A second instance of the distributed system 160 can be used to provide wireless voice and data services to mobile device 122 and to residential and/or commercial establishments 142 (herein referred to as establishments 142). System 100 can have additional instances of the distribution systems 150 and 160 for providing voice and/or data services to mobile devices 122-124 and establishments 142 as shown in FIG. 1.

Macrocells such as macrocell site 102 can have dedicated connections to the mobile network and base station device 104 can share and/or otherwise use macrocell site 102's connection. Central office 101 can be used to distribute media content and/or provide internet service provider (ISP) services to mobile devices 122-124 and establishments 142. The central office 101 can receive media content from a constellation of satellites 130 (one of which is shown in FIG. 1) or other sources of content, and distribute such content to mobile devices 122-124 and establishments 142 via the first and second instances of the distribution system 15 and 160. The central office 101 can also be communicatively coupled to the Internet 103 for providing internet data services to mobile devices 122-124 and establishments 142.

Base station device 104 can be mounted on, or attached to, utility pole 116. In other embodiments, base station device 104 can be near transformers and/or other locations situated nearby a power line. Base station device 104 can facilitate connectivity to a mobile network for mobile devices 122 and 124. Antennas 112 and 114, mounted on or near utility poles 118 and 120, respectively, can receive signals from base station device 104 and transmit those signals to mobile devices 122 and 124 over a much wider area than if the antennas 112 and 114 were located at or near base station device 104.

It is noted that FIG. 1 displays three utility poles, in each instance of the distribution systems 150 and 160, with one base station device, for purposes of simplicity. In other embodiments, utility pole 116 can have more base station devices, and more utility poles with distributed antennas and/or tethered connections to establishments 142.

A dielectric waveguide coupling device 106 can transmit the signal from base station device 104 to antennas 112 and 114 via utility or power line(s) that connect the utility poles 116, 118, and 120. To transmit the signal, radio source and/or coupler 106 upconverts the signal (e.g., via frequency mixing) from base station device 104 or otherwise converts the signal from the base station device 104 to a millimeter-wave band signal and the dielectric waveguide coupling device 106 launches a millimeter-wave band wave that propagates as a guided wave (e.g., surface wave or other electromagnetic wave) traveling along the utility line or other wire. At utility pole 118, another dielectric waveguide coupling device 108 receives the guided wave (and optionally can amplify it as needed or desired or operate as a digital repeater to receive it and regenerate it) and sends it forward as a guided wave (e.g., surface wave or other electromagnetic wave) on the utility line or other wire. The dielectric waveguide coupling device 108 can also extract a signal from the millimeter-wave band guided wave and shift it down in frequency or otherwise convert it to its original cellular band frequency (e.g., 1.9 GHz or other defined cellular frequency) or another cellular (or non-cellular) band frequency. An antenna 112 can transmit (e.g., wirelessly transmit) the downshifted signal to mobile device 122. The process can be repeated by dielectric waveguide coupling device 110, antenna 114 and mobile device 124, as necessary or desirable.

Transmissions from mobile devices 122 and 124 can also be received by antennas 112 and 114 respectively. Repeaters on dielectric waveguide coupling devices 108 and 110 can upshift or otherwise convert the cellular band signals to millimeter-wave band and transmit the signals as guided wave (e.g., surface wave or other electromagnetic wave) transmissions over the power line(s) to base station device 104.

Media content received by the central office 101 can be supplied to the second instance of the distribution system 160 via the base station device 104 for distribution to mobile devices 122 and establishments 142. The dielectric waveguide coupling device 110 can be tethered to the establishments 142 by one or more wired connections or a wireless interface. The one or more wired connections, may include without limitation, a power line, a coaxial cable, a fiber cable, a twisted pair cable, or other suitable wired mediums for distribution of media content and/or for providing internet services. In an example embodiment, the wired connections from the waveguide coupling device 110 can be communicatively coupled to one or more very high bit rate digital subscriber line (VDSL) modems located at one or more corresponding service area interfaces (SAIs—not shown), each SAI providing services to a portion of the establishments 142. The VDSL modems can be used to selectively distribute media content and/or provide internet services to gateways (not shown) located in the establishments 142. The SAIs can also be communicatively coupled to the establishments 142 over a wired medium such as a power line, a coaxial cable, a fiber cable, a twisted pair cable, or other suitable wired mediums. In other example embodiments, the waveguide coupling device 110 can be communicatively coupled directly to establishments 142 without intermediate interfaces such as the SAIs.

In another example embodiment, system 100 can employ diversity paths, where two or more utility lines or other wires are strung between the utility poles 116, 118, and 120 (e.g., for example, two or more wires between poles 116 and 120) and redundant transmissions from base station 104 are transmitted as guided waves down the surface of the utility lines or other wires. The utility lines or other wires can be either insulated or uninsulated, and depending on the environmental conditions that cause transmission losses, the coupling devices can selectively receive signals from the insulated or uninsulated utility lines or other wires. The selection can be based on measurements of the signal-to-noise ratio of the wires, or based on determined weather/environmental conditions (e.g., moisture detectors, weather forecasts, etc.). The use of diversity paths with system 100 can enable alternate routing capabilities, load balancing, increased load handling, concurrent bi-directional or synchronous communications, spread spectrum communications, etc. (See FIG. 8 for more illustrative details).

It is noted that the use of the dielectric waveguide coupling devices 106, 108, and 110 in FIG. 1 are by way of example only, and that in other embodiments, other uses are possible. For instance, dielectric waveguide coupling devices can be used in a backhaul communication system, providing network connectivity to base station devices. Dielectric waveguide coupling devices can be used in many circumstances where it is desirable to transmit guided wave communications over a wire, whether insulated or not insulated. Dielectric waveguide coupling devices are improvements over other coupling devices due to no contact or limited physical and/or electrical contact with the wires that may carry high voltages. With dielectric waveguide coupling devices, the apparatus can be located away from the wire (e.g., spaced apart from the wire) and/or located on the wire so long as it is not electrically in contact with the wire, as the dielectric acts as an insulator, allowing for cheap, easy, and/or less complex installation. However, as previously noted conducting or non-dielectric couplers can be employed, for example in configurations where the wires correspond to a telephone network, cable television network, broadband data service, fiber optic communications system or other network employing low voltages or having insulated transmission lines.

It is further noted, that while base station device 104 and macrocell site 102 are illustrated in an embodiment, other network configurations are likewise possible. For example, devices such as access points or other wireless gateways can be employed in a similar fashion to extend the reach of other networks such as a wireless local area network, a wireless personal area network or other wireless network that operates in accordance with a communication protocol such as a 802.11 protocol, WIMAX protocol, Ultra-Wideband protocol, Bluetooth protocol, ZigBee protocol or other wireless protocol.

Figure 2:
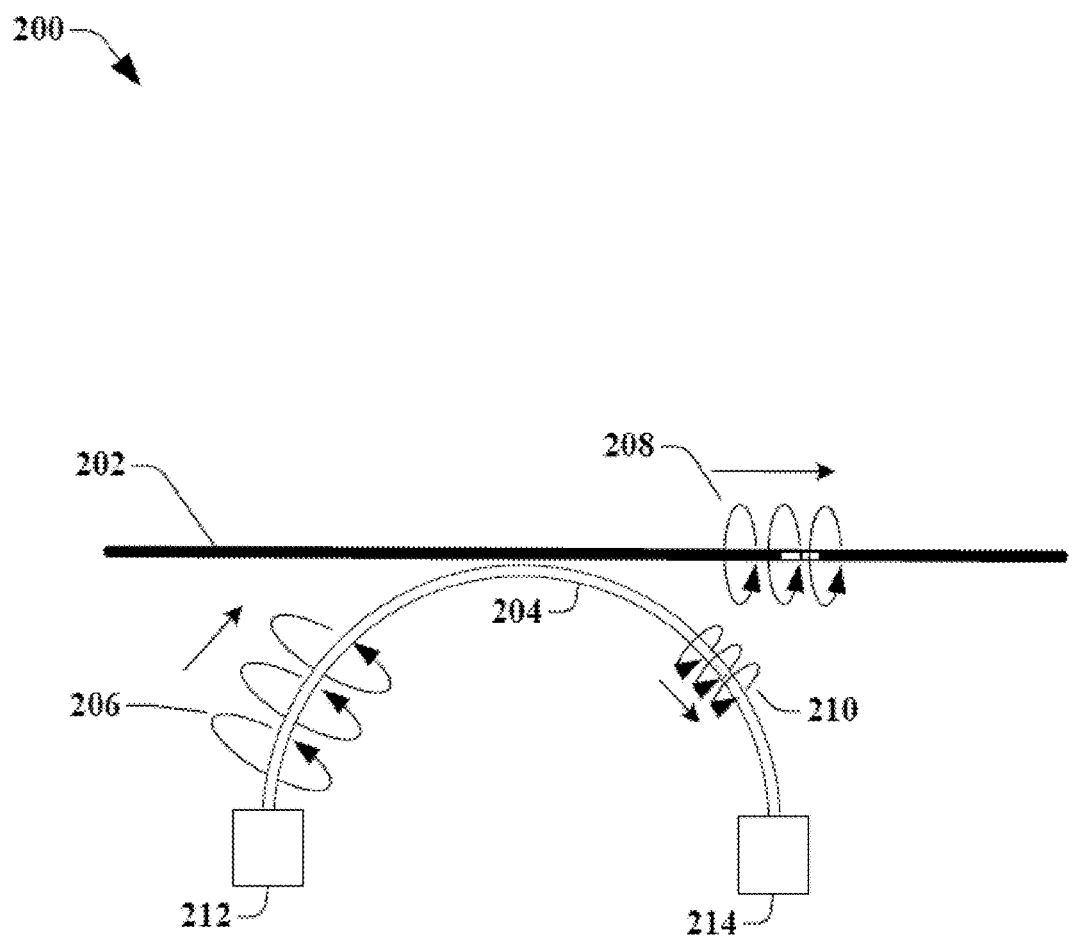
FIG. 2 is a block diagram illustrating an example, non-limiting embodiment of a dielectric waveguide coupler in accordance with various aspects described herein.

Turning now to FIG. 2, illustrated is a block diagram of an example, non-limiting embodiment of a dielectric waveguide coupling system 200 in accordance with various aspects described herein. System 200 comprises a dielectric waveguide 204 that has a wave 206 propagating as a guided wave about a waveguide surface of the dielectric waveguide 204. In an embodiment, the dielectric waveguide 204 is curved, and at least a portion of the waveguide 204 can be placed near a wire 202 in order to facilitate coupling between the waveguide 204 and the wire 202, as described herein. The dielectric waveguide 204 can be placed such that a portion of the curved dielectric waveguide 204 is parallel or substantially parallel to the wire 202. The portion of the dielectric waveguide 204 that is parallel to the wire can be an apex of the curve, or any point where a tangent of the curve is parallel to the wire 202. When the dielectric waveguide 204 is positioned or placed thusly, the wave 206 travelling along the dielectric waveguide 204 couples, at least in part, to the wire 202, and propagates as guided wave 208 around or about the wire surface of the wire 202 and longitudinally along the wire 202. The guided wave 208 can be characterized as a surface wave or other electromagnetic wave, although other types of guided waves 208 can supported as well without departing from example embodiments. A portion of the wave 206 that does not couple to the wire 202 propagates as wave 210 along the dielectric waveguide 204. It will be appreciated that the dielectric waveguide 204 can be configured and arranged in a variety of positions in relation to the wire 202 to achieve a desired level of coupling or non-coupling of the wave 206 to the wire 202. For example, the curvature and/or length of the dielectric waveguide 2014 that is parallel or substantially parallel, as well as its separation distance (which can include zero separation distance in an embodiment), to the wire 202 can be varied without departing for example embodiments. Likewise, the arrangement of dielectric waveguide 204 in relation to the wire 202 may be varied based upon considerations of the respective intrinsic characteristics (e.g., thickness, composition, electromagnetic properties, etc.) of the wire 202 and the dielectric waveguide 204, as well as the characteristics (e.g., frequency, energy level, etc.) of the waves 206 and 208.

The guided wave 208 stays parallel or substantially parallel to the wire 202, even as the wire 202 bends and flexes. Bends in the wire 202 can increase transmission losses, which are also dependent on wire diameters, frequency, and materials. If the dimensions of the dielectric waveguide 204 are chosen for efficient power transfer, most of the power in the wave 206 is transferred to the wire 202, with little power remaining in wave 210. It will be appreciated that the guided wave 208 can still be multi-modal in nature (discussed herein), including having modes that are non-fundamental or asymmetric, while traveling along a path that is parallel or substantially parallel to the wire 202, with or without a fundamental transmission mode. In an embodiment, non-fundamental or asymmetric modes can be utilized to minimize transmission losses and/or obtain increased propagation distances.

It is noted that the term parallel is generally a geometric construct which often is not exactly achievable in real systems. Accordingly, the term parallel as utilized in the subject disclosure represents an approximation rather than an exact configuration when used to describe embodiments disclosed in the subject disclosure. In an embodiment, substantially parallel can include approximations that are within 30 degrees of true parallel in all dimensions.

In an embodiment, the wave 206 can exhibit one or more wave propagation modes. The dielectric waveguide modes can be dependent on the shape and/or design of the waveguide 204. The one or more dielectric waveguide modes of wave 206 can generate, influence, or impact one or more wave propagation modes of the guided wave 208 propagating along wire 202. In an embodiment, the wave propagation modes on the wire 202 can be similar to the dielectric waveguide modes since both waves 206 and 208 propagate about the outside of the dielectric waveguide 204 and wire 202 respectively. In some embodiments, as the wave 206 couples to the wire 202, the modes can change form, or new modes can be created or generated, due to the coupling between the dielectric waveguide 204 and the wire 202. For example, differences in size, material, and/or impedances of the dielectric waveguide 204 and wire 202 may create additional modes not present in the dielectric waveguide modes and/or suppress some of the dielectric waveguide modes. The wave propagation modes can comprise the fundamental transverse electromagnetic mode (Quasi-$TEM_{00}$), where only small electric and/or magnetic fields extend in the direction of propagation, and the electric and magnetic fields extend radially outwards while the guided wave propagates along the wire. This guided wave mode can be donut shaped, where few of the electromagnetic fields exist within the dielectric waveguide 204 or wire 202.

Waves 206 and 208 can comprise a fundamental TEM mode where the fields extend radially outwards, and also comprise other, non-fundamental (e.g., asymmetric, higher-level, etc.) modes. While particular wave propagation modes are discussed above, other wave propagation modes are likewise possible such as transverse electric (TE) and transverse magnetic (TM) modes, based on the frequencies employed, the design of the dielectric waveguide 204, the dimensions and composition of the wire 202, as well as its surface characteristics, its optional insulation, the electromagnetic properties of the surrounding environment, etc. It should be noted that, depending on the frequency, the electrical and physical characteristics of the wire 202 and the particular wave propagation modes that are generated, guided wave 208 can travel along the conductive surface of an oxidized uninsulated wire, an unoxidized uninsulated wire, an insulated wire and/or along the insulating surface of an insulated wire.

In an embodiment, a diameter of the dielectric waveguide 204 is smaller than the diameter of the wire 202. For the millimeter-band wavelength being used, the dielectric waveguide 204 supports a single waveguide mode that makes up wave 206. This single waveguide mode can change as it couples to the wire 202 as surface 208. If the dielectric waveguide 204 were larger, more than one waveguide mode can be supported, but these additional waveguide modes may not couple to the wire 202 as efficiently, and higher coupling losses can result. However, in some alternative embodiments, the diameter of the dielectric waveguide 204 can be equal to or larger than the diameter of the wire 202, for example, where higher coupling losses are desirable or when used in conjunction with other techniques to otherwise reduce coupling losses (e.g., impedance matching with tapering, etc.).

In an embodiment, the wavelength of the waves 206 and 208 are comparable in size, or smaller than a circumference of the dielectric waveguide 204 and the wire 202. In an example, if the wire 202 has a diameter of 0.5 cm, and a corresponding circumference of around 1.5 cm, the wavelength of the transmission is around 1.5 cm or less, corresponding to a frequency of 20 GHz or greater. In another embodiment, a suitable frequency of the transmission and the carrier-wave signal is in the range of 30-100 GHz, perhaps around 30-60 GHz, and around 38 GHz in one example. In an embodiment, when the circumference of the dielectric waveguide 204 and wire 202 is comparable in size to, or greater, than a wavelength of the transmission, the waves 206 and 208 can exhibit multiple wave propagation modes including fundamental and/or non-fundamental (symmetric and/or asymmetric) modes that propagate over sufficient distances to support various communication systems described herein. The waves 206 and 208 can therefore comprise more than one type of electric and magnetic field configuration. In an embodiment, as the guided wave 208 propagates down the wire 202, the electrical and magnetic field configurations will remain the same from end to end of the wire 202. In other embodiments, as the guided wave 208 encounters interference or loses energy due to transmission losses, the electric and magnetic field configurations can change as the guided wave 208 propagates down wire 202.

In an embodiment, the dielectric waveguide 204 can be composed of nylon, Teflon, polyethylene, a polyamide, or other plastics. In other embodiments, other dielectric materials are possible. The wire surface of wire 202 can be metallic with either a bare metallic surface, or can be insulated using plastic, dielectric, insulator or other sheathing. In an embodiment, a dielectric or otherwise non-conducting/insulated waveguide can be paired with either a bare/metallic wire or insulated wire. In other embodiments, a metallic and/or conductive waveguide can be paired with a bare/metallic wire or insulated wire. In an embodiment, an oxidation layer on the bare metallic surface of the wire 202 (e.g., resulting from exposure of the bare metallic surface to oxygen/air) can also provide insulating or dielectric properties similar to those provided by some insulators or sheathings.

It is noted that the graphical representations of waves 206, 208 and 210 are presented merely to illustrate the principles that wave 206 induces or otherwise launches a guided wave 208 on a wire 202 that operates, for example, as a single wire transmission line. Wave 210 represents the portion of wave 206 that remains on the dielectric waveguide 204 after the generation of guided wave 208. The actual electric and magnetic fields generated as a result of such wave propagation may vary depending on the frequencies employed, the particular wave propagation mode or modes, the design of the dielectric waveguide 204, the dimensions and composition of the wire 202, as well as its surface characteristics, its optional insulation, the electromagnetic properties of the surrounding environment, etc.

It is noted that dielectric waveguide 204 can include a termination circuit or damper 214 at the end of the dielectric waveguide 204 that can absorb leftover radiation or energy from wave 210. The termination circuit or damper 214 can prevent and/or minimize the leftover radiation or energy from wave 210 reflecting back toward transmitter circuit 212. In an embodiment, the termination circuit or damper 214 can include termination resistors, and/or other components that perform impedance matching to attenuate reflection. In some embodiments, if the coupling efficiencies are high enough, and/or wave 210 is sufficiently small, it may not be necessary to use a termination circuit or damper 214. For the sake of simplicity, these transmitter and termination circuits or dampers 212 and 214 are not depicted in the other figures, but in those embodiments, transmitter and termination circuits or dampers may possibly be used.

Further, while a single dielectric waveguide 204 is presented that generates a single guided wave 208, multiple dielectric waveguides 204 placed at different points along the wire 202 and/or at different axial orientations about the wire can be employed to generate and receive multiple guided waves 208 at the same or different frequencies, at the same or different phases, at the same or different wave propagation modes. The guided wave or waves 208 can be modulated to convey data via a modulation technique such as phase shift keying, frequency shift keying, quadrature amplitude modulation, amplitude modulation, multi-carrier modulation and via multiple access techniques such as frequency division multiplexing, time division multiplexing, code division multiplexing, multiplexing via differing wave propagation modes and via other modulation and access strategies.

Figure 3:
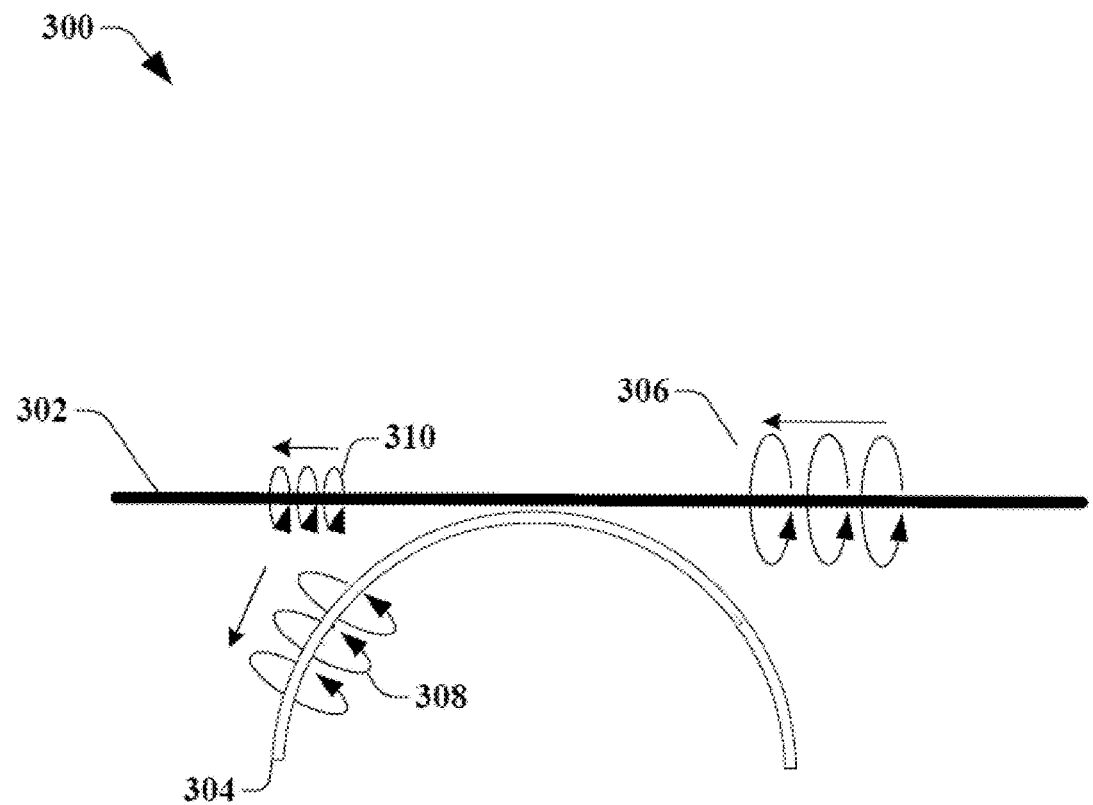
FIG. 3 is a block diagram illustrating an example, non-limiting embodiment of a dielectric waveguide coupler in accordance with various aspects described herein.

Turning now to FIG. 3, illustrated is a block diagram of an example, non-limiting embodiment of a dielectric waveguide coupling system 300 in accordance with various aspects described herein. System 300 comprises a dielectric waveguide 304 and a wire 302 that has a wave 306 propagating as a guided wave about a wire surface of the wire 302. In an example embodiment, the wave 306 can be characterized as a surface wave or other electromagnetic wave.

In an example embodiment, the dielectric waveguide 304 is curved or otherwise has a curvature, and can be placed near a wire 302 such that a portion of the curved dielectric waveguide 304 is parallel or substantially parallel to the wire 302. The portion of the dielectric waveguide 304 that is parallel to the wire can be an apex of the curve, or any point where a tangent of the curve is parallel to the wire 302. When the dielectric waveguide 304 is near the wire, the guided wave 306 travelling along the wire 302 can couple to the dielectric waveguide 304 and propagate as guided wave 308 about the dielectric waveguide 304. A portion of the guided wave 306 that does not couple to the dielectric waveguide 304 propagates as guided wave 310 (e.g., surface wave or other electromagnetic wave) along the wire 302.

The guided waves 306 and 308 stay parallel to the wire 302 and dielectric waveguide 304, respectively, even as the wire 302 and dielectric waveguide 304 bend and flex. Bends can increase transmission losses, which are also dependent on wire diameters, frequency, and materials. If the dimensions of the dielectric waveguide 304 are chosen for efficient power transfer, most of the energy in the guided wave 306 is coupled to the dielectric waveguide 304 and little remains in guided wave 310.

In an embodiment, a receiver circuit can be placed on the end of waveguide 304 in order to receive wave 308. A termination circuit can be placed on the opposite end of the waveguide 304 in order to receive guided waves traveling in the opposite direction to guided wave 306 that couple to the waveguide 304. The termination circuit would thus prevent and/or minimize reflections being received by the receiver circuit. If the reflections are small, the termination circuit may not be necessary.

It is noted that the dielectric waveguide 304 can be configured such that selected polarizations of the surface wave 306 are coupled to the dielectric waveguide 304 as guided wave 308. For instance, if guided wave 306 is made up of guided waves or wave propagation modes with respective polarizations, dielectric waveguide 304 can be configured to receive one or more guided waves of selected polarization(s). Guided wave 308 that couples to the dielectric waveguide 304 is thus the set of guided waves that correspond to one or more of the selected polarization(s), and further guided wave 310 can comprise the guided waves that do not match the selected polarization(s).

The dielectric waveguide 304 can be configured to receive guided waves of a particular polarization based on an angle/rotation around the wire 302 that the dielectric waveguide 304 is placed. For instance, if the guided wave 306 is polarized horizontally, most of the guided wave 306 transfers to the dielectric waveguide as wave 308. As the dielectric waveguide 304 is rotated 90 degrees around the wire 302, though, most of the energy from guided wave 306 would remain coupled to the wire as guided wave 310, and only a small portion would couple to the wire 302 as wave 308.

It is noted that waves 306, 308, and 310 are shown using three circular symbols in FIG. 3 and in other figures in the specification. These symbols are used to represent a general guided wave, but do not imply that the waves 306, 308, and 310 are necessarily circularly polarized or otherwise circularly oriented. In fact, waves 306, 308, and 310 can comprise a fundamental TEM mode where the fields extend radially outwards, and also comprise other, non-fundamental (e.g. higher-level, etc.) modes. These modes can be asymmetric (e.g., radial, bilateral, trilateral, quadrilateral, etc.) in nature as well.

It is noted also that guided wave communications over wires can be full duplex, allowing simultaneous communications in both directions. Waves traveling one direction can pass through waves traveling in an opposite direction. Electromagnetic fields may cancel out at certain points and for short times due to the superposition principle as applied to waves. The waves traveling in opposite directions propagate as if the other waves weren't there, but the composite effect to an observer may be a stationary standing wave pattern. As the guided waves pass through each other and are no longer in a state of superposition, the interference subsides. As a guided wave (e.g., surface wave or other electromagnetic wave) couples to a waveguide and move away from the wire, any interference due to other guided waves (e.g., surface waves or other electromagnetic wave) decreases. In an embodiment, as guided wave 306 (e.g., surface wave or other electromagnetic wave) approaches dielectric waveguide 304, another guided wave (e.g., surface wave or other electromagnetic wave) (not shown) traveling from left to right on the wire 302 passes by causing local interference. As guided wave 306 couples to dielectric waveguide 304 as wave 308, and moves away from the wire 302, any interference due to the passing guided wave subsides.

It is noted that the graphical representations of waves 306, 308 and 310 are presented merely to illustrate the principles that guided wave 306 induces or otherwise launches a wave 308 on a dielectric waveguide 304. Guided wave 310 represents the portion of guided wave 306 that remains on the wire 302 after the generation of wave 308. The actual electric and magnetic fields generated as a result of such guided wave propagation may vary depending on one or more of the shape and/or design of the dielectric waveguide, the relative position of the dielectric waveguide to the wire, the frequencies employed, the design of the dielectric waveguide 304, the dimensions and composition of the wire 302, as well as its surface characteristics, its optional insulation, the electromagnetic properties of the surrounding environment, etc.

Figure 4:
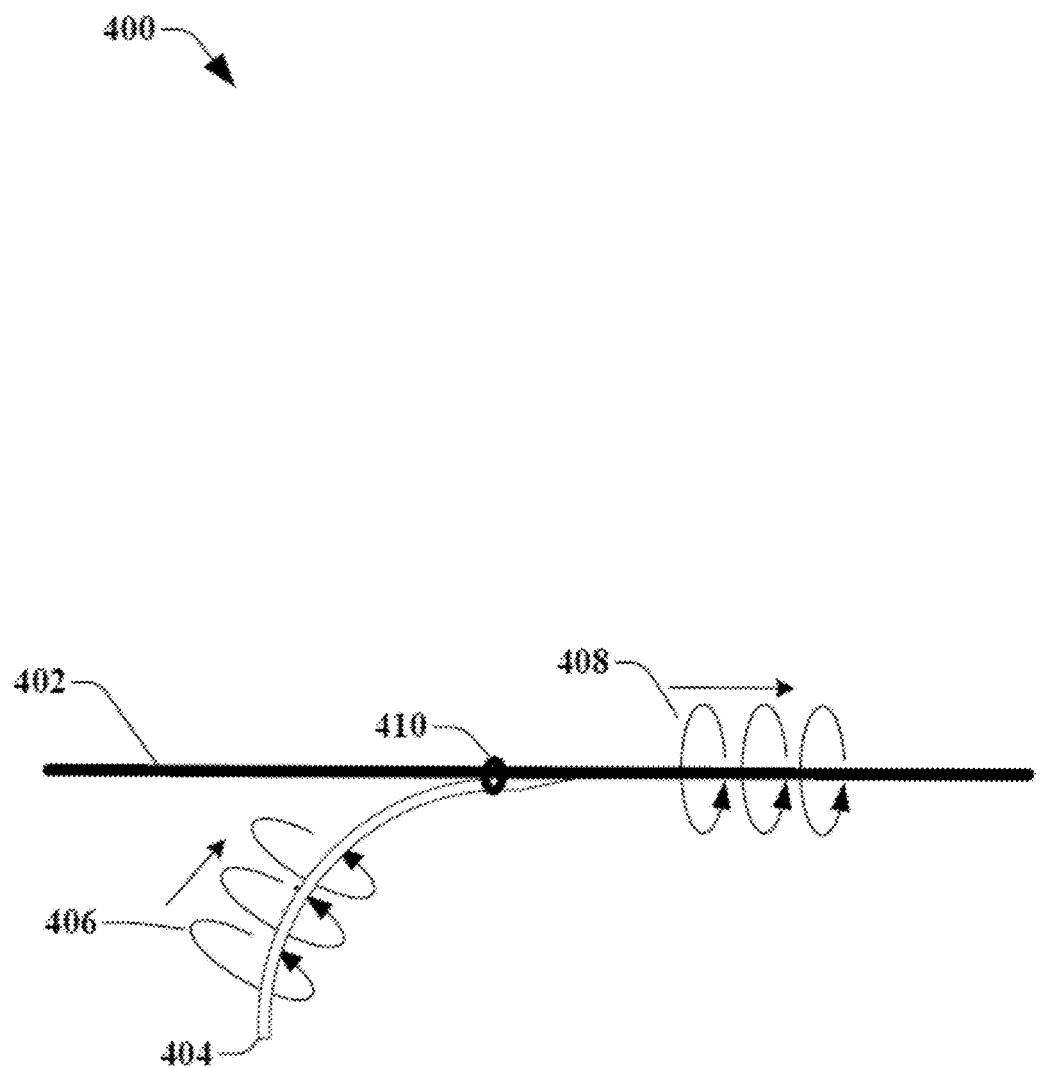
FIG. 4 is a block diagram illustrating an example, non-limiting embodiment of a dielectric waveguide coupler in accordance with various aspects described herein.

Turning now to FIG. 4, illustrated is a block diagram of an example, non-limiting embodiment of a dielectric waveguide coupling system 400 in accordance with various aspects described herein. System 400 comprises a dielectric waveguide 404 that has a wave 406 propagating as a guided wave about a waveguide surface of the dielectric waveguide 404. In an embodiment, the dielectric waveguide 404 is curved, and an end of the dielectric waveguide 404 can be tied, fastened, or otherwise mechanically coupled to a wire 402. When the end of the dielectric waveguide 404 is fastened to the wire 402, the end of the dielectric waveguide 404 is parallel or substantially parallel to the wire 402. Alternatively, another portion of the dielectric waveguide beyond an end can be fastened or coupled to wire 402 such that the fastened or coupled portion is parallel or substantially parallel to the wire 402. The coupling device 410 can be a nylon cable tie or other type of non-conducting/dielectric material that is either separate from the dielectric waveguide 404 or constructed as an integrated component of the dielectric waveguide 404. The dielectric waveguide 404 can be adjacent to the wire 402 without surrounding the wire 402.

When the dielectric waveguide 404 is placed with the end parallel to the wire 402, the guided wave 406 travelling along the dielectric waveguide 404 couples to the wire 402, and propagates as guided wave 408 about the wire surface of the wire 402. In an example embodiment, the guided wave 408 can be characterized as a surface wave or other electromagnetic wave.

It is noted that the graphical representations of waves 406 and 408 are presented merely to illustrate the principles that wave 406 induces or otherwise launches a guided wave 408 on a wire 402 that operates, for example, as a single wire transmission line. The actual electric and magnetic fields generated as a result of such wave propagation may vary depending on one or more of the shape and/or design of the dielectric waveguide, the relative position of the dielectric waveguide to the wire, the frequencies employed, the design of the dielectric waveguide 404, the dimensions and composition of the wire 402, as well as its surface characteristics, its optional insulation, the electromagnetic properties of the surrounding environment, etc.

In an embodiment, an end of dielectric waveguide 404 can taper towards the wire 402 in order to increase coupling efficiencies. Indeed, the tapering of the end of the dielectric waveguide 404 can provide impedance matching to the wire 402, according to an example embodiment of the subject disclosure. For example, an end of the dielectric waveguide 404 can be gradually tapered in order to obtain a desired level of coupling between waves 406 and 408 as illustrated in FIG. 4.

In an embodiment, the coupling device 410 can be placed such that there is a short length of the dielectric waveguide 404 between the coupling device 410 and an end of the dielectric waveguide 404. Maximum coupling efficiencies are realized when the length of the end of the dielectric waveguide 404 that is beyond the coupling device 410 is at least several wavelengths long for whatever frequency is being transmitted.

Figure 5:
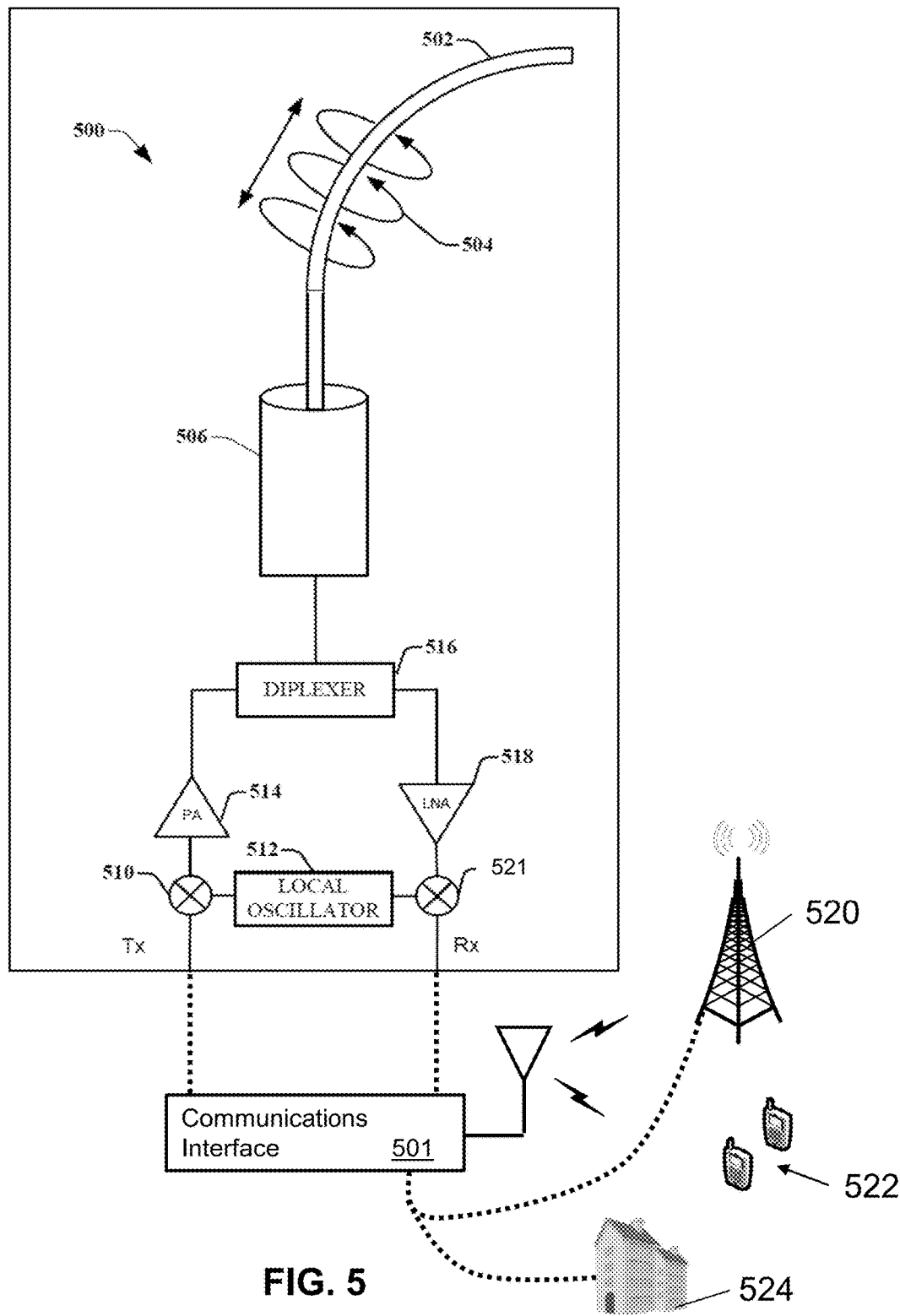
FIG. 5 is a block diagram illustrating an example, non-limiting embodiment of a dielectric waveguide coupler and transceiver in accordance with various aspects described herein.

Turning now to FIG. 5, illustrated is a block diagram of an example, non-limiting embodiment of a dielectric waveguide coupler and transceiver system 500 (referred to herein collectively as system 500) in accordance with various aspects described herein. System 500 comprises a transmitter/receiver device 506 that launches and receives waves (e.g., guided wave 504 onto dielectric waveguide 502). The guided waves 504 can be used to transport signals received from and sent to a base station 520, mobile devices 522, or a building 524 by way of a communications interface 501. The communications interface 501 can be an integral part of system 500. Alternatively, the communications interface 501 can be tethered to system 500. The communications interface 501 can comprise a wireless interface for interfacing to the base station 520, the mobile devices 522, or building 524 utilizing any of various wireless signaling protocols (e.g., LTE, WiFi, WiMAX, IEEE 802.xx, etc.). The communications interface 501 can also comprise a wired interface such as a fiber optic line, coaxial cable, twisted pair, or other suitable wired mediums for transmitting signals to the base station 520 or building 524. For embodiments where system 500 functions as a repeater, the communications interface 501 may not be necessary.

The output signals (e.g., Tx) of the communications interface 501 can be combined with a millimeter-wave carrier wave generated by a local oscillator 512 at frequency mixer 510. Frequency mixer 510 can use heterodyning techniques or other frequency shifting techniques to frequency shift the output signals from communications interface 501. For example, signals sent to and from the communications interface 501 can be modulated signals such as orthogonal frequency division multiplexed (OFDM) signals formatted in accordance with a Long-Term Evolution (LTE) wireless protocol or other wireless 3G, 4G, 5G or higher voice and data protocol, a ZigBee, WIMAX, Ultra-Wideband or IEEE 802.11 wireless protocol or other wireless protocol. In an example embodiment, this frequency conversion can be done in the analog domain, and as a result, the frequency shifting can be done without regard to the type of communications protocol that the base station 520, mobile devices 522, or in-building devices 524 use. As new communications technologies are developed, the communications interface 501 can be upgraded or replaced and the frequency shifting and transmission apparatus can remain, simplifying upgrades. The carrier wave can then be sent to a power amplifier ("PA") 514 and can be transmitted via the transmitter receiver device 506 via the diplexer 516.

Signals received from the transmitter/receiver device 506 that are directed towards the communications interface 501 can be separated from other signals via diplexer 516. The transmission can then be sent to low noise amplifier ("LNA") 518 for amplification. A frequency mixer 521, with help from local oscillator 512 can downshift the transmission (which is in the millimeter-wave band or around 38 GHz in some embodiments) to the native frequency. The communications interface 501 can then receive the transmission at an input port (Rx).

In an embodiment, transmitter/receiver device 506 can include a cylindrical or non-cylindrical metal (which, for example, can be hollow in an embodiment, but not necessarily drawn to scale) or other conducting or non-conducting waveguide and an end of the dielectric waveguide 502 can be placed in or in proximity to the waveguide or the transmitter/receiver device 506 such that when the transmitter/receiver device 506 generates a transmission, the guided wave couples to dielectric waveguide 502 and propagates as a guided wave 504 about the waveguide surface of the dielectric waveguide 502. In some embodiments, the guided wave 504 can propagate in part on the outer surface of the dielectric waveguide 502 and in part inside the dielectric waveguide 502. In other embodiments, the guided wave 504 can propagate substantially or completely on the outer surface of the dielectric waveguide 502. In yet other embodiments, the guided wave 504 can propagate substantially or completely inside the dielectric waveguide 502. In this latter embodiment, the guide wave 504 can radiate at an end of the dielectric waveguide 502 (such as the tapered end shown in FIG. 4) for coupling to a transmission medium such as a wire 402 of FIG. 4. Similarly, if guided wave 504 is incoming (coupled to the dielectric waveguide 502 from a wire), guided wave 504 then enters the transmitter/receiver device 506 and couples to the cylindrical waveguide or conducting waveguide. While transmitter/receiver device 506 is shown to include a separate waveguide—an antenna, cavity resonator, klystron, magnetron, travelling wave tube, or other radiating element can be employed to induce a guided wave on the waveguide 502, without the separate waveguide.

In an embodiment, dielectric waveguide 502 can be wholly constructed of a dielectric material (or another suitable insulating material), without any metallic or otherwise conducting materials therein. Dielectric waveguide 502 can be composed of nylon, Teflon, polyethylene, a polyamide, other plastics, or other materials that are non-conducting and suitable for facilitating transmission of electromagnetic waves at least in part on an outer surface of such materials. In another embodiment, dielectric waveguide 502 can include a core that is conducting/metallic, and have an exterior dielectric surface. Similarly, a transmission medium that couples to the dielectric waveguide 502 for propagating electromagnetic waves induced by the dielectric waveguide 502 or for supplying electromagnetic waves to the dielectric waveguide 502 can be wholly constructed of a dielectric material (or another suitable insulating material), without any metallic or otherwise conducting materials therein.

It is noted that although FIG. 5A shows that the opening of transmitter receiver device 506 is much wider than the dielectric waveguide 502, this is not to scale, and that in other embodiments the width of the dielectric waveguide 502 is comparable or slightly smaller than the opening of the hollow waveguide. It is also not shown, but in an embodiment, an end of the waveguide 502 that is inserted into the transmitter/receiver device 506 tapers down in order to reduce reflection and increase coupling efficiencies.

The transmitter/receiver device 506 can be communicably coupled to a communications interface 501, and alternatively, transmitter/receiver device 506 can also be communicably coupled to the one or more distributed antennas 112 and 114 shown in FIG. 1. In other embodiments, transmitter receiver device 506 can comprise part of a repeater system for a backhaul network.

Before coupling to the dielectric waveguide 502, the one or more waveguide modes of the guided wave generated by the transmitter/receiver device 506 can couple to the dielectric waveguide 502 to induce one or more wave propagation modes of the guided wave 504. The wave propagation modes of the guided wave 504 can be different than the hollow metal waveguide modes due to the different characteristics of the hollow metal waveguide and the dielectric waveguide. For instance, wave propagation modes of the guide wave 504 can comprise the fundamental transverse electromagnetic mode (Quasi-TEM$_{00}$), where only small electrical and/or magnetic fields extend in the direction of propagation, and the electric and magnetic fields extend radially outwards from the dielectric waveguide 502 while the guided waves propagate along the dielectric waveguide 502. The fundamental transverse electromagnetic mode wave propagation mode may not exist inside a waveguide that is hollow. Therefore, the hollow metal waveguide modes that are used by transmitter/receiver device 506 are waveguide modes that can couple effectively and efficiently to wave propagation modes of dielectric waveguide 502.

Figure 6:
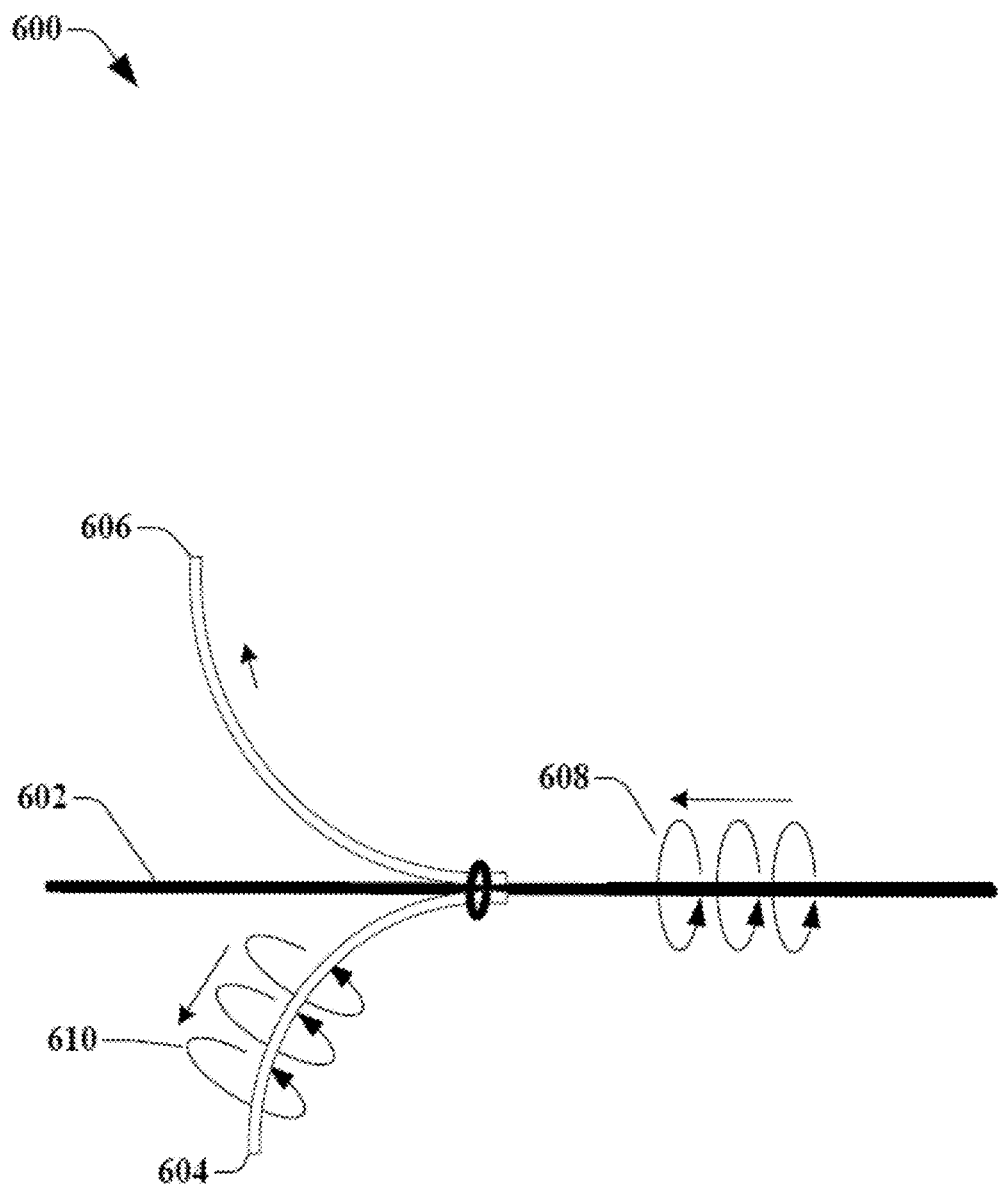
FIG. 6 is a block diagram illustrating an example, non-limiting embodiment of a dual dielectric waveguide coupler in accordance with various aspects described herein.

Turning now to FIG. 6, illustrated is a block diagram illustrating an example, non-limiting embodiment of a dual dielectric waveguide coupling system 600 in accordance with various aspects described herein. In an embodiment, two or more dielectric waveguides (e.g., 604 and 606) can be positioned around a wire 602 in order to receive guided wave 608. In an embodiment, the guided wave 608 can be characterized as a surface wave or other electromagnetic wave. In an embodiment, one dielectric waveguide is enough to receive the guided wave 608. In that case, guided wave 608 couples to dielectric waveguide 604 and propagates as guided wave 610. If the field structure of the guided wave 608 oscillates or undulates around the wire 602 due to various outside factors, then dielectric waveguide 606 can be placed such that guided wave 608 couples to dielectric waveguide 606. In some embodiments, four or more dielectric waveguides can be placed around a portion of the wire 602, e.g., at 90 degrees or another spacing with respect to each other, in order to receive guided waves that may oscillate or rotate around the wire 602, that have been induced at different axial orientations or that have non-fundamental or higher order modes that, for example, have lobes and/or nulls or other asymmetries that are orientation dependent. However, it will be appreciated that there may be less than or more than four dielectric waveguides placed around a portion of the wire 602 without departing from example embodiments. It will also be appreciated that while some example embodiments have presented a plurality of dielectric waveguides around at least a portion of a wire 602, this plurality of dielectric waveguides can also be considered as part of a single dielectric waveguide system having multiple dielectric waveguide subcomponents. For example, two or more dielectric waveguides can be manufactured as single system that can be installed around a wire in a single installation such that the dielectric waveguides are either pre-positioned or adjustable relative to each other (either manually or automatically) in accordance with the single system. Receivers coupled to dielectric waveguides 606 and 604 can use diversity combining to combine signals received from both dielectric waveguides 606 and 604 in order to maximize the signal quality. In other embodiments, if one or the other of a dielectric waveguides 604 and 606 receive a transmission that is above a predetermined threshold, receivers can use selection diversity when deciding which signal to use.

It is noted that the graphical representations of waves 608 and 610 are presented merely to illustrate the principles that guided wave 608 induces or otherwise launches a wave 610 on a dielectric waveguide 604. The actual electric and magnetic fields generated as a result of such wave propagation may vary depending on the frequencies employed, the design of the dielectric waveguide 604, the dimensions and composition of the wire 602, as well as its surface characteristics, its optional insulation, the electromagnetic properties of the surrounding environment, etc.

Figure 7:
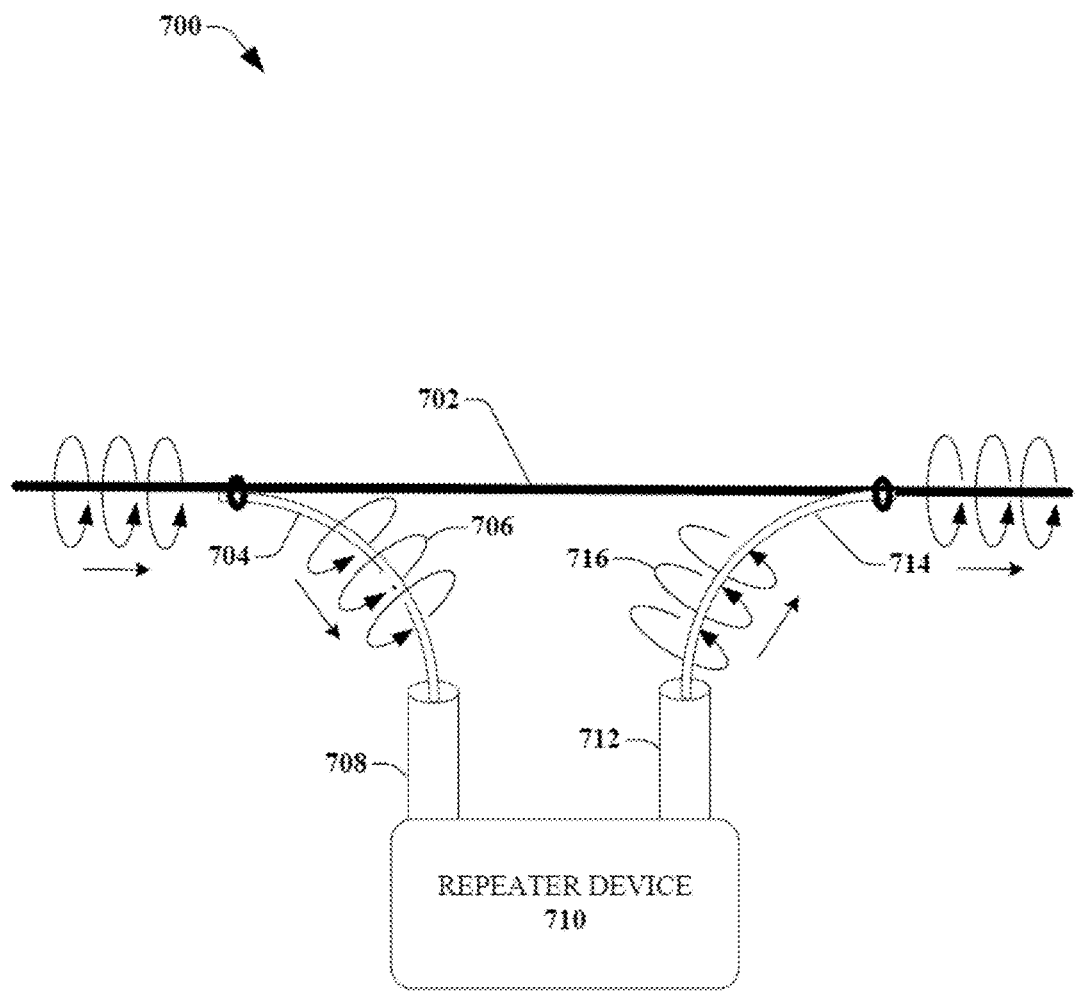
FIG. 7 is a block diagram illustrating an example, non-limiting embodiment of a bidirectional dielectric waveguide coupler in accordance with various aspects described herein.

Turning now to FIG. 7, illustrated is a block diagram of an example, non-limiting embodiment of a bidirectional dielectric waveguide coupling system 700 in accordance with various aspects described herein. In system 700, two dielectric waveguides 704 and 714 can be placed near a wire 702 such that guided waves (e.g., surface waves or other electromagnetic waves) propagating along the wire 702 are coupled to dielectric waveguide 704 as wave 706, and then are boosted or repeated by repeater device 710 and launched as a guided wave 716 onto dielectric waveguide 714. The guided wave 716 can then couple to wire 702 and continue to propagate along the wire 702. In an embodiment, the repeater device 710 can receive at least a portion of the power utilized for boosting or repeating through magnetic coupling with the wire 702, which can be a power line.

In some embodiments, repeater device 710 can repeat the transmission associated with wave 706, and in other embodiments, repeater device 710 can be associated with a distributed antenna system and/or base station device located near the repeater device 710. Receiver waveguide 708 can receive the wave 706 from the dielectric waveguide 704 and transmitter waveguide 712 can launch guided wave 716 onto dielectric waveguide 714. Between receiver waveguide 708 and transmitter waveguide 712, the signal can be amplified to correct for signal loss and other inefficiencies associated with guided wave communications or the signal can be received and processed to extract the data contained therein and regenerated for transmission. In an embodiment, a signal can be extracted from the transmission and processed and otherwise emitted to mobile devices nearby via distributed antennas communicably coupled to the repeater device 710. Similarly, signals and/or communications received by the distributed antennas can be inserted into the transmission that is generated and launched onto dielectric waveguide 714 by transmitter waveguide 712. Accordingly, the repeater system 700 depicted in FIG. 7 can be comparable in function to the dielectric waveguide coupling device 108 and 110 in FIG. 1.

It is noted that although FIG. 7 shows guided wave transmissions 706 and 716 entering from the left and exiting to the right respectively, this is merely a simplification and is not intended to be limiting. In other embodiments, receiver waveguide 708 and transmitter waveguide 712 can also function as transmitters and receivers respectively, allowing the repeater device 710 to be bi-directional.

In an embodiment, repeater device 710 can be placed at locations where there are discontinuities or obstacles on the wire 702. These obstacles can include transformers, connections, utility poles, and other such power line devices. The repeater device 710 can help the guided (e.g., surface) waves jump over these obstacles on the line and boost the transmission power at the same time. In other embodiments, a dielectric waveguide can be used to jump over the obstacle without the use of a repeater device. In that embodiment, both ends of the dielectric waveguide can be tied or fastened to the wire, thus providing a path for the guided wave to travel without being blocked by the obstacle.

Figure 8:
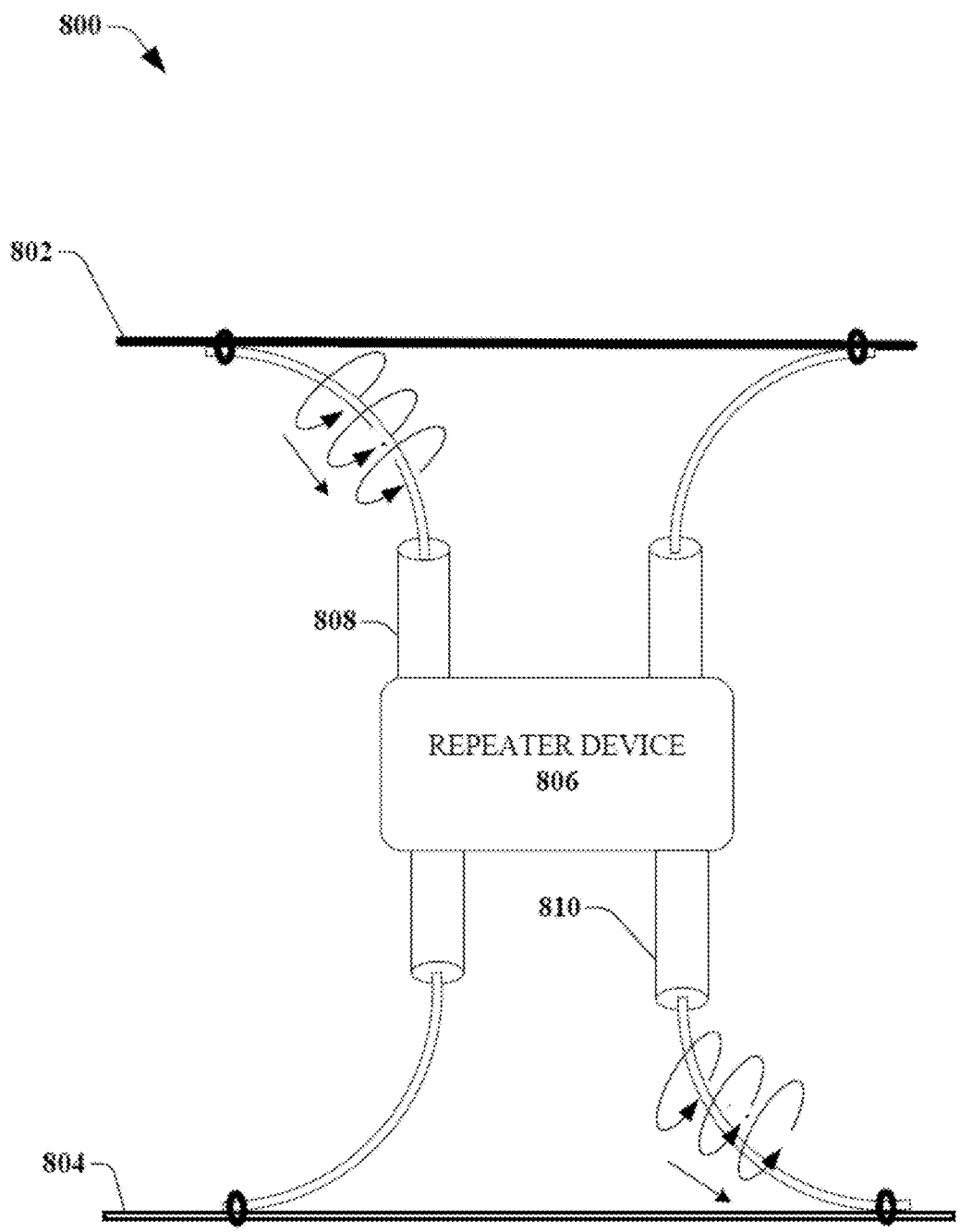
FIG. 8 illustrates a block diagram illustrating an example, non-limiting embodiment of a bidirectional dielectric waveguide coupler in accordance with various aspects described herein.

Turning now to FIG. 8, illustrated is a block diagram of an example, non-limiting embodiment of a bidirectional dielectric waveguide coupler 800 in accordance with various aspects described herein. The bidirectional dielectric waveguide coupler 800 can employ diversity paths in the case of when two or more wires are strung between utility poles. Since guided wave transmissions have different transmission efficiencies and coupling efficiencies for insulated wires and un-insulated wires based on weather, precipitation and atmospheric conditions, it can be advantageous to selectively transmit on either an insulated wire or un-insulated wire at certain times.

In the embodiment shown in FIG. 8, repeater device uses a receiver waveguide 808 to receive a guided wave traveling along uninsulated wire 802 and repeats the transmission using transmitter waveguide 810 as a guided wave along insulated wire 804. In other embodiments, repeater device can switch from the insulated wire 804 to the un-insulated wire 802, or can repeat the transmissions along the same paths. Repeater device 806 can include sensors, or be in communication with sensors that indicate conditions that can affect the transmission. Based on the feedback received from the sensors, the repeater device 806 can make the determination about whether to keep the transmission along the same wire, or transfer the transmission to the other wire.

Figure 9:
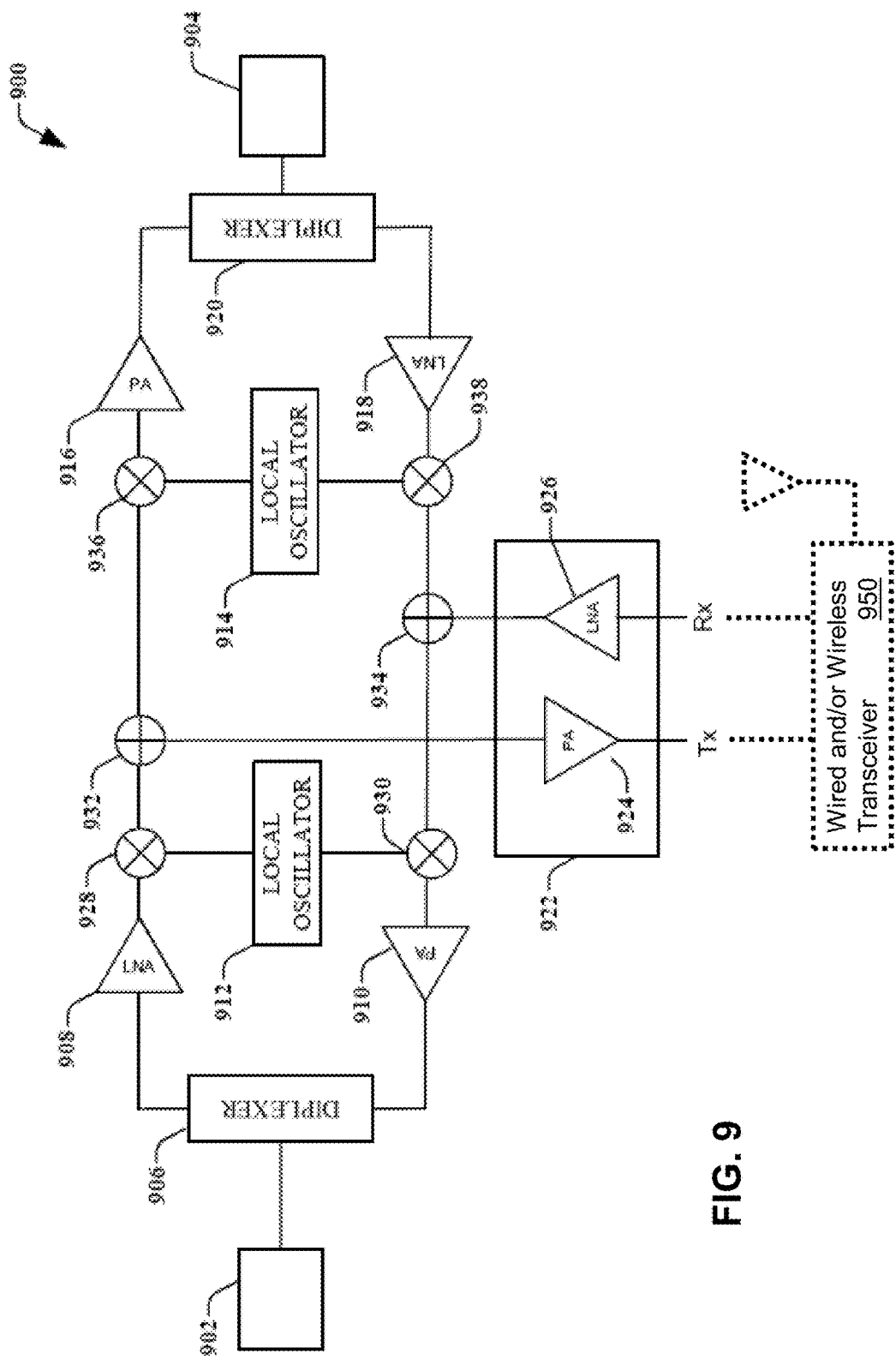
FIG. 9 illustrates a block diagram illustrating an example, non-limiting embodiment of a bidirectional repeater system in accordance with various aspects described herein.

Turning now to FIG. 9, illustrated is a block diagram illustrating an example, non-limiting embodiment of a bidirectional repeater system 900. Bidirectional repeater system 900 includes waveguide coupling devices 902 and 904 that receive and transmit transmissions from other coupling devices located in a distributed antenna system or backhaul system.

In various embodiments, waveguide coupling device 902 can receive a transmission from another waveguide coupling device, wherein the transmission has a plurality of subcarriers. Diplexer 906 can separate the transmission from other transmissions, and direct the transmission to low-noise amplifier ("LNA") 908. A frequency mixer 928, with help from a local oscillator 912, can downshift the transmission (which is in the millimeter-wave band or around 38 GHz in some embodiments) to a lower frequency, whether it is a cellular band (~1.9 GHz) for a distributed antenna system, a native frequency, or other frequency for a backhaul system. An extractor 932 can extract the signal on the subcarrier that corresponds to antenna or other output component 922 and direct the signal to the output component 922. For the signals that are not being extracted at this antenna location, extractor 932 can redirect them to another frequency mixer 936, where the signals are used to modulate a carrier wave generated by local oscillator 914. The carrier wave, with its subcarriers, is directed to a power amplifier ("PA") 916 and is retransmitted by waveguide coupling device 904 to another repeater system, via diplexer 920.

At the output device 922 (antenna in a distributed antenna system), a PA 924 can boost the signal for transmission to the mobile device. An LNA 926 can be used to amplify weak signals that are received from the mobile device and then send the signal to a multiplexer 934 which merges the signal with signals that have been received from waveguide coupling device 904. The signals received from coupling device 904 have been split by diplexer 920, and then passed through LNA 918, and downshifted in frequency by frequency mixer 938. When the signals are combined by multiplexer 934, they are upshifted in frequency by frequency mixer 930, and then boosted by PA 910, and transmitted back to the launcher or on to another repeater by waveguide coupling device 902. In an embodiment bidirectional repeater system 900 can be just a repeater without the antenna/output device 922. It will be appreciated that in some embodiments, a bidirectional repeater system 900 could also be implemented using two distinct and separate uni-directional repeaters. In an alternative embodiment, a bidirectional repeater system 900 could also be a booster or otherwise perform retransmissions without downshifting and upshifting. Indeed in example embodiment, the retransmissions can be based upon receiving a signal or guided wave and performing some signal or guided wave processing or reshaping, filtering, and/or amplification, prior to retransmission of the signal or guided wave.

Figure 10A:
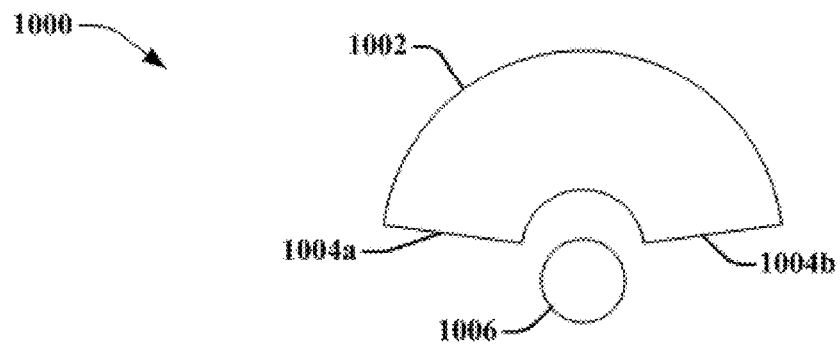
FIGS. 10A, 10B, and 10C are block diagrams illustrating example, non-limiting embodiments of a slotted waveguide coupler in accordance with various aspects described herein.
Figure 10B:
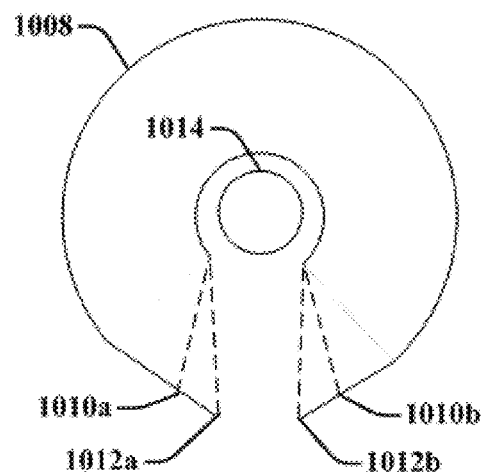
Figure 10C:
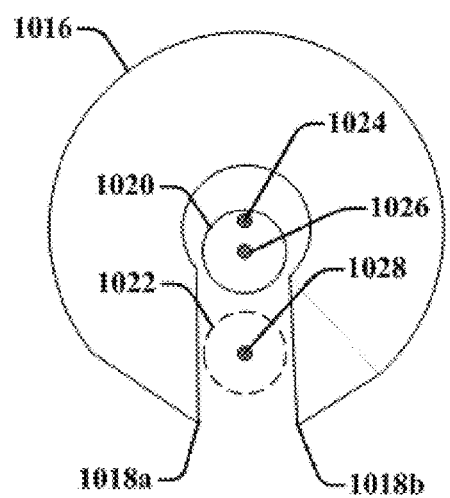

Turning now to FIGS. 10A, 10B, and 10C, illustrated are block diagrams of example, non-limiting embodiments of a slotted waveguide coupler system 1000 in accordance with various aspects described herein. In FIG. 10A, the waveguide coupler system comprises a wire 1006 that is positioned with respect to a waveguide 1002, such that the wire 1006 fits within or near a slot formed in the waveguide 1002 that runs longitudinally with respect to the wire 1004. The opposing ends 1004a and 1004b of the waveguide 1002, and the waveguide 1002 itself, surrounds less than 180 degrees of the wire surface of the wire 1006.

In FIG. 10B the waveguide coupler system comprises a wire 1014 that is positioned with respect to a waveguide 1008, such that the wire 1014 fits within or near a slot formed in the waveguide 1008 that runs longitudinally with respect to the wire 1004. The slot surfaces of the waveguide 1008 can be non-parallel, and two different exemplary embodiments are shown in FIG. 10B. In the first, slot surfaces 1010a and 1010b can be non-parallel and aim outwards, slightly wider than the width of the wire 1014. In the other embodiment, the slots surfaces 1012a and 1012b can still be non-parallel, but narrow to form a slot opening smaller than a width of the wire 1014. Any range of angles of the non-parallel slot surfaces are possible, of which these are two exemplary embodiments.

In FIG. 10C, the waveguide coupler system shows a wire 1020 that fits within a slot formed in waveguide 1016. The slot surfaces 1018a and 1018b in this exemplary embodiment can be parallel, but the axis 1026 of the wire 1020 is not aligned with the axis 1024 of the waveguide 1016. The waveguide 1016 and the wire 1020 are therefore not coaxially aligned. In another embodiment, shown, a possible position of the wire at 1022 also has an axis 1028 that is not aligned with the axis 1024 of the waveguide 1016.

It is to be appreciated that while three different embodiments showing a) waveguide surfaces that surround less than 180 degrees of the wire, b) non parallel slot surfaces, and c) coaxially unaligned wires and waveguide were shown separately in FIGS. 10A, 10B, and 10C, in various embodiments, diverse combinations of the listed features are possible.

Figure 11:
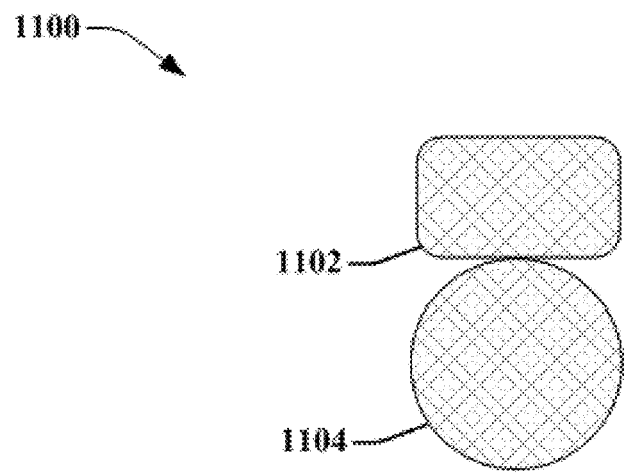
FIG. 11 is a block diagram illustrating an example, non-limiting embodiment of a waveguide coupling system in accordance with various aspects described herein

Turning now to FIG. 11, illustrated is an example, non-limiting embodiment of a waveguide coupling system 1100 in accordance with various aspects described herein. FIG. 11 depicts a cross sectional representation of the waveguide and wire embodiments shown in FIGS. 2, 3, 4, and etc. As can be seen in 1100, the wire 1104 can be positioned directly next to and touching waveguide 1102. In other embodiments, as shown in waveguide coupling system 1200 in FIG. 12, the wire 1204 can still be placed near, but not actually touching waveguide strip 1202. In both cases, electromagnetic waves traveling along the waveguides can induce other electromagnetic waves on to the wires and vice versa. Also, in both embodiments, the wires 1104 and 1204 are placed outside the cross-sectional area defined by the outer surfaces of waveguides 1102 and 1202.

For the purposes of this disclosure, a waveguide does not surround, in substantial part, a wire surface of a wire when the waveguide does not surround an axial region of the surface, when viewed in cross-section, of more than 180 degrees. For avoidance of doubt, a waveguide does not surround, in substantial part a surface of a wire when the waveguide surrounds an axial region of the surface, when viewed in cross-section, of 180 degrees or less.

Figure 12:
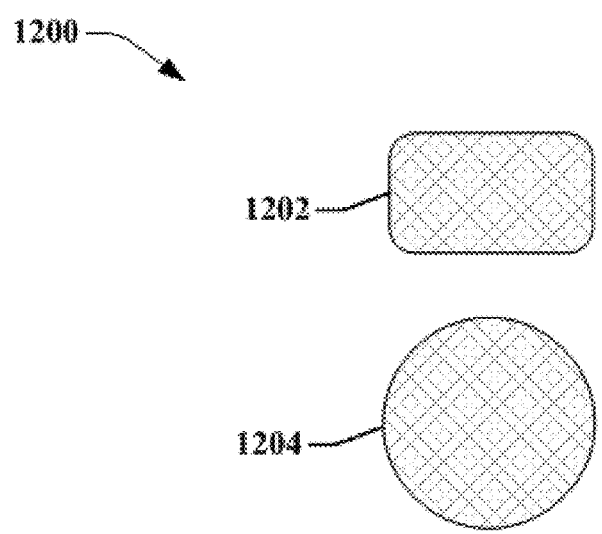
FIG. 12 is a block diagram illustrating an example, non-limiting embodiment of a waveguide coupling system in accordance with various aspects described herein.

It is to be appreciated that while FIGS. 11 and 12 show wires 1104 and 1204 having a circular shape and waveguides 1102 and 1202 having rectangular shapes, this is not meant to be limiting. In other embodiments, wires and waveguides can have a variety of shapes, sizes, and configurations. The shapes can include, but not be limited to: ovals or other ellipsoid shapes, octagons, quadrilaterals or other polygons with either sharp or rounded edges, or other shapes. Additionally, in some embodiments, the wires 1104 and 1204 can be stranded wires comprising smaller gauge wires, such as a helical strand, braid or other coupling of individual strands into a single wire. Any of wires and waveguides shown in the figures and described throughout this disclosure can include one or more of these embodiments.

Figure 13:
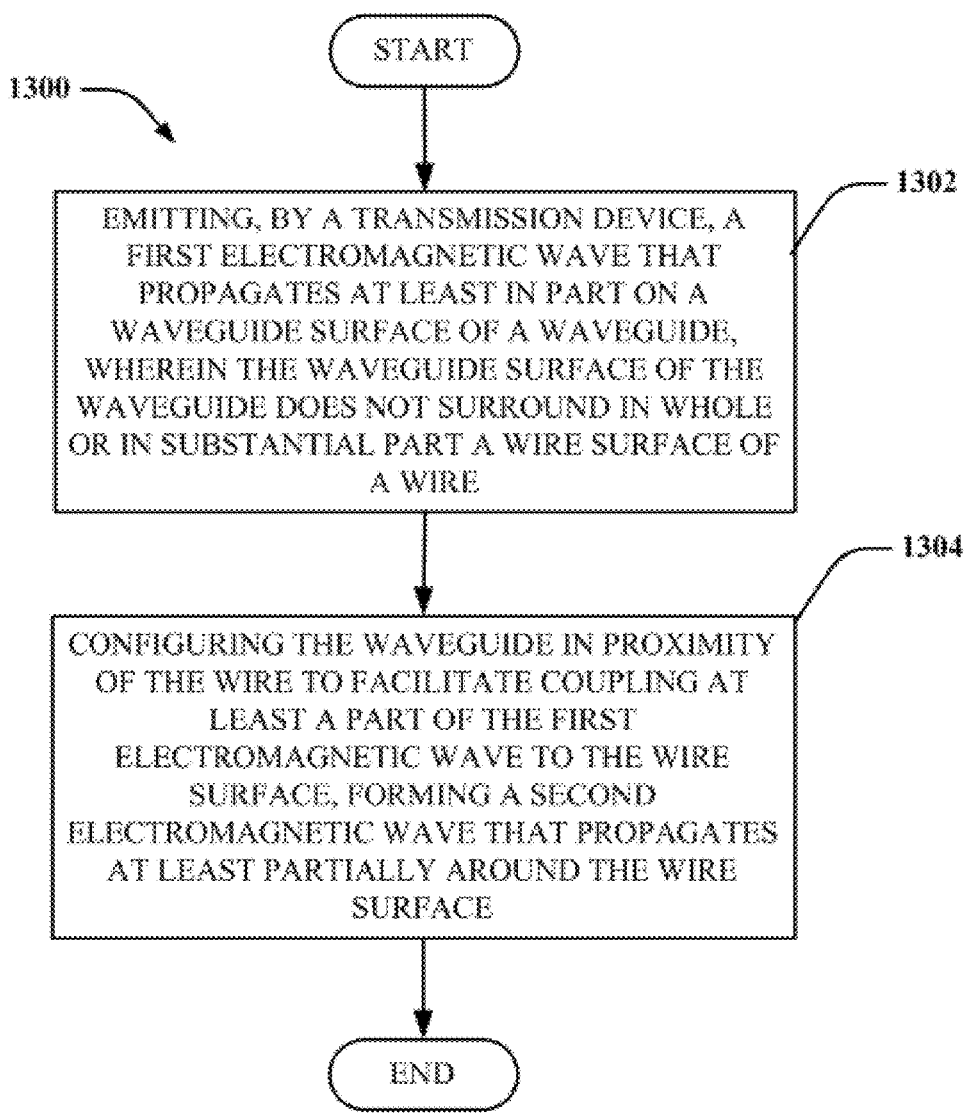
FIG. 13 illustrates a flow diagram of an example, non-limiting embodiment of a method for transmitting a transmission with a dielectric waveguide coupler as described herein.

FIG. 13 illustrates a process in connection with the aforementioned systems. The process in FIG. 13 can be implemented for example by systems 100, 200, 300, 400, 500, 600, 700, 800, and 900 illustrated in FIGS. 1-9 respectively. While for purposes of simplicity of explanation, the process is shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 13 illustrates a flow diagram of an example, non-limiting embodiment of a method for transmitting a transmission with a dielectric waveguide coupler as described herein. Method 1300 can begin at 1302 where a first electromagnetic wave is emitted by a transmission device as a guided wave that propagates at least in part on a waveguide surface of a waveguide, wherein the waveguide surface of the waveguide does not surround in whole or in substantial part a wire surface of a wire. The transmission that is generated by a transmitter can be based on a signal received from a base station device, access point, network, a mobile device, or other signal source.

At 1304, based upon configuring or positioning the waveguide in proximity of the wire, the guided wave then couples at least a part of the first electromagnetic wave to a wire surface, forming a second electromagnetic wave (e.g., a surface wave) that propagates at least partially around the wire surface, wherein the wire is in proximity to the waveguide. This can be done in response to positioning a portion of the dielectric waveguide (e.g., a tangent of a curve of the dielectric waveguide) near and parallel to the wire, wherein a wavelength of the electromagnetic wave is smaller than a circumference of the wire and the dielectric waveguide. The guided wave, or surface wave, stays parallel to the wire even as the wire bends and flexes. Bends can increase transmission losses, which are also dependent on wire diameters, frequency, and materials. The coupling interface between the wire and the waveguide can also be configured to achieve the desired level of coupling, as described herein, which can include tapering an end of the waveguide to improve impedance matching between the waveguide and the wire.

The transmission that is emitted by the transmitter can exhibit one or more waveguide modes. The waveguide modes can be dependent on the shape and/or design of the waveguide. The propagation modes on the wire can be different than the waveguide modes due to the different characteristics of the waveguide and the wire. When the circumference of the wire is comparable in size to, or greater, than a wavelength of the transmission, the guided wave exhibits multiple wave propagation modes. The guided wave can therefore comprise more than one type of electric and magnetic field configuration. As the guided wave (e.g., surface wave) propagates down the wire, the electrical and magnetic field configurations may remain substantially the same from end to end of the wire or vary as the transmission traverses the wave by rotation, dispersion, attenuation or other effects.

Figure 14:
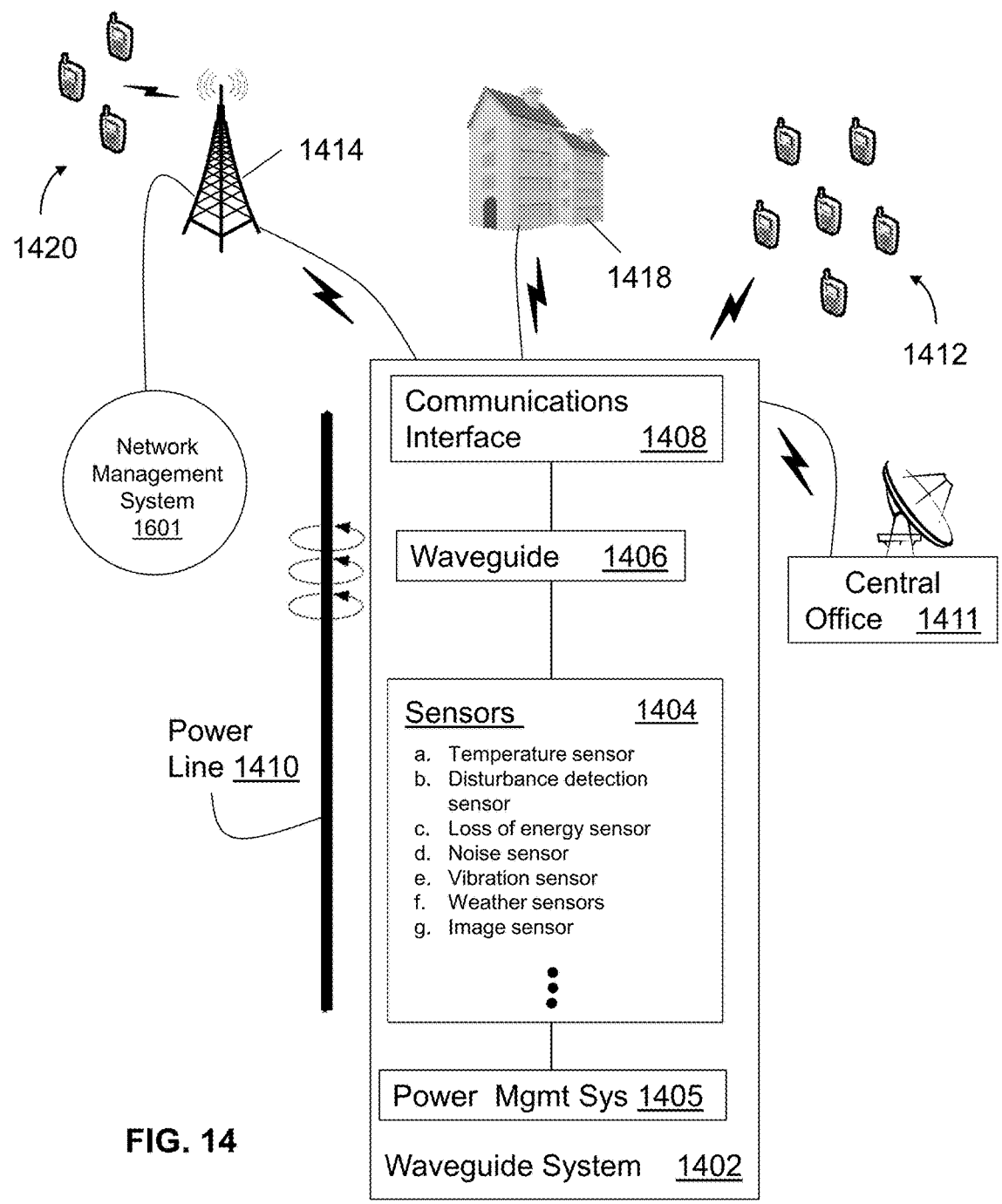
FIG. 14 is a block diagram illustrating an example, non-limiting embodiment of a waveguide system in accordance with various aspects described herein.

FIG. 14 is a block diagram illustrating an example, non-limiting embodiment of a waveguide system 1402 in accordance with various aspects described herein. The waveguide system 1402 can comprise sensors 1404, a power management system 1405, a waveguide 1406, and a communications interface 1408.

The waveguide system 1402 can be coupled to a power line 1410 for facilitating data communications in accordance with embodiments described in the subject disclosure. In an example embodiment, the waveguide 1406 can comprise all or part of the system 500, such as shown in FIG. 5, for inducing electromagnetic waves on a surface of the power line 1410 that longitudinally propagate along the surface of the power line 1410 as described in the subject disclosure. Non-limiting techniques for coupling the waveguide 1406 to the power line 1410 are shown in FIGS. 2-4 and 6. The waveguide 1406 can also serve as a repeater for retransmitting electromagnetic waves on the same power line 1410 or for routing electromagnetic waves between power lines 1410 as shown in FIGS. 7-8.

The communications interface 1408 can comprise the communications interface 501 shown in FIG. 5, in an example embodiment. The communications interface 1408 couples to the waveguide 1406 for up-converting signals operating at an original frequency to electromagnetic waves operating at a carrier frequency that propagate on a surface of a coupling device of the waveguide 1406, such as the dielectric 502 of FIG. 5, and that induce corresponding electromagnetic waves that propagate on a surface of the power line 1410. The power line 1410 can be a wire (e.g., single stranded or multi-stranded) having a conducting surface or insulated surface. The communications interface 1408 can also receive signals from the waveguide 1406 that have been down-converted from electromagnetic waves operating at a carrier frequency to signals at their original frequency.

Signals received by the communications interface 1408 for up-conversion can include without limitation signals supplied by a central office 1411 over a wired or wireless interface of the communications interface 1408, a base station 1414 over a wired or wireless interface of the communications interface 1408, wireless signals transmitted by mobile devices 1420 to the base station 1414 for delivery over the wired or wireless interface of the communications interface 1408, signals supplied by in-building communication devices 1418 over the wired or wireless interface of the communications interface 1408, and/or wireless signals supplied to the communications interface 1408 by mobile devices 1412 roaming in a wireless communication range of the communications interface 1408. In embodiments where the waveguide system 1402 functions as a repeater, such as shown in FIGS. 7-8, the communications interface 1408 may not be included in the waveguide system 1402.

The electromagnetic waves propagating along the surface of the power 1410 can be modulated and formatted to include packets or frames of data that include a data payload and further include networking information (such as header information for identifying one or more destination waveguide systems 1402). The networking information may be provided by the waveguide system 1402 or an originating device such as the central office 1411, the base station 1414, mobile devices 1420, or in-building devices 1418, or a combination thereof. Additionally, the modulated electromagnetic waves can include error correction data for mitigating signal disturbances. The networking information and error correction data can be used by a destination waveguide system 1402 for detecting transmissions directed to it, and for down-converting and processing with error correction data transmissions that include voice and/or data signals directed to recipient communication devices communicatively coupled to the destination waveguide system 1402.

Referring now to the sensors 1404 of the waveguide system 1402, the sensors 1404 can comprise one or more of a temperature sensor 1404a, a disturbance detection sensor 1404b, a loss of energy sensor 1404c, a noise sensor 1404d, a vibration sensor 1404e, an environmental (e.g., weather) sensor 1404f, and/or an image sensor 1404g. The temperature sensor 1404a can be used to measure ambient temperature, a temperature of the waveguide 1406, a temperature of the power line 1410, temperature differentials (e.g., compared to a setpoint or baseline, between 1046 and 1410, etc.), or any combination thereof. In one embodiment, temperature metrics can be collected and reported periodically to a network management system 1601 by way of the base station 1414.

The disturbance detection sensor 1404b can perform measurements on the power line 1410 to detect disturbances such as signal reflections, which may indicate a presence of a downstream disturbance that may impede the propagation of electromagnetic waves on the power line 1410. A signal reflection can represent a distortion resulting from, for example, an electromagnetic wave transmitted on the power line 1410 by the waveguide 1406 that reflects in whole or in part back to the waveguide 1406 from a disturbance in the power line 1410 located downstream from the waveguide 1406.

Figure 15A:
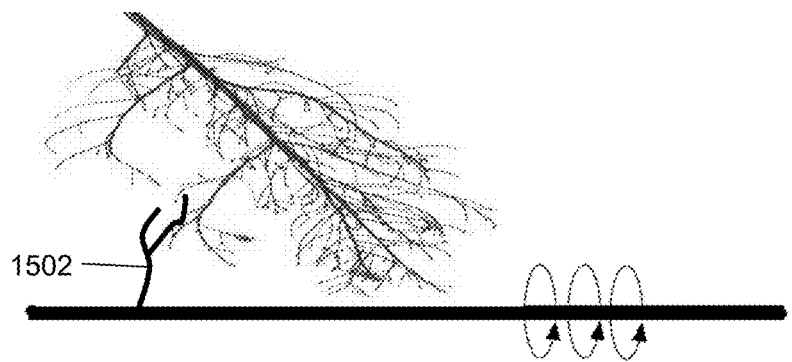
FIGS. 15A, 15B, 15C, 15D, 15E, 15F, and 15G illustrate example, non-limiting embodiments of sources for disturbances detectable by the waveguide system of FIG. 14 as described herein.
Figure 15B:
Figure 15C:
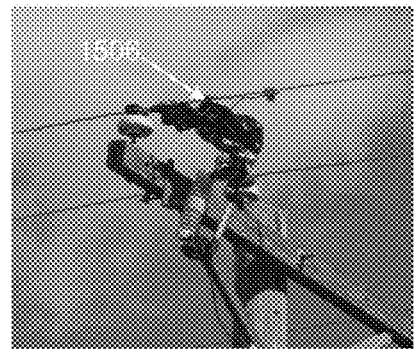
Figure 15D:
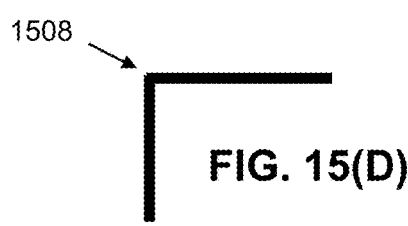
Figure 15E:
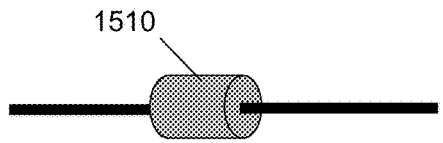
Figure 15F:
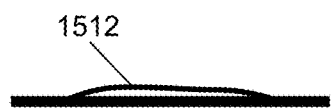
Figure 15G:
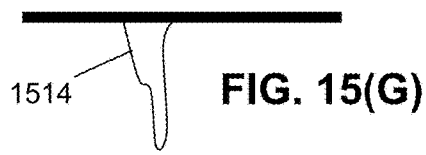

Signal reflections can be caused by obstructions on the power line 1410. For example, a tree limb shown in FIG. 15(A) may cause electromagnetic wave reflections when the tree limb is lying on the power line 1410, or is in close proximity to the power line 1410 which may cause a corona discharge 1502. Other illustrations of obstructions that can cause electromagnetic wave reflections can include without limitation an object 1506 that has been entangled on the power line 1410 as shown in FIG. 15(C) (e.g., clothing, a shoe wrapped around a power line 1410 with a shoe string, etc.), a corroded build-up 1512 on the power line 1410 as shown in FIG. 15(F), or an ice build-up 1514 as shown in FIG. 15 (G). Power grid components may also interfere with the transmission of electromagnetic waves on the surface of power lines 1410. Illustrations of power grid components that may cause signal reflections include without limitation a transformer 1504 illustrated in FIG. 15(B) and a joint 1510 for connecting spliced power lines such as illustrated in FIG. 15(E). A sharp angle 1508 on a power line 1410, as shown in FIG. 15(D), may also cause electromagnetic wave reflections.

The disturbance detection sensor 1404b can comprise a circuit to compare magnitudes of electromagnetic wave reflections to magnitudes of original electromagnetic waves transmitted by the waveguide 1406 to determine how much a downstream disturbance in the power line 1410 attenuates transmissions. The disturbance detection sensor 1404b can further comprise a spectral analyzer circuit for performing spectral analysis on the reflected waves. The spectral data generated by the spectral analyzer circuit can be compared with spectral profiles via pattern recognition, an expert system, curve fitting, matched filtering or other artificial intelligence, classification or comparison technique to identify a type of disturbance based on, for example, the spectral profile that most closely matches the spectral data. The spectral profiles can be stored in a memory of the disturbance detection sensor 1404b or may be remotely accessible by the disturbance detection sensor 1404b. The profiles can comprise spectral data that models different disturbances that may be encountered on power lines 1410 to enable the disturbance detection sensor 1404b to identify disturbances locally. An identification of the disturbance if known can be reported to the network management system 1601 by way of the base station 1414. The disturbance detection sensor 1404b can also utilize the waveguide 1406 to transmit electromagnetic waves as test signals to determine a round-trip time for an electromagnetic wave reflection. The round trip time measured by the disturbance detection sensor 1404b can be used to calculate a distance traveled by the electromagnetic wave up to a point where the reflection takes place, which enables the disturbance detection sensor 1404b to calculate a distance from the waveguide 1406 to the downstream disturbance on the power line 1410.

The distance calculated can be reported to the network management system 1601 by way of the base station 1414. In one embodiment, the location of the waveguide system 1402 on the power line 1410 may be known to the network management system 1601, which the network management system 1601 can use to determine a location of the disturbance on the power line 1410 based on a known topology of the power grid. In another embodiment, the waveguide system 1402 can provide its location to the network management system 1601 to assist in the determination of the location of the disturbance on the power line 1410. The location of the waveguide system 1402 can be obtained by the waveguide system 1402 from a pre-programmed location of the waveguide system 1402 stored in a memory of the waveguide system 1402, or the waveguide system 1402 can determine its location using a GPS receiver (not shown) included in the waveguide system 1402.

The power management system 1405 provides energy to the aforementioned components of the waveguide system 1402. The power management system 1405 can receive energy from solar cells, or from a transformer (not shown) coupled to the power line 1410, or by inductive coupling to the power line 1410 or another nearby power line. The power management system 1405 can also include a backup battery and/or a super capacitor or other capacitor circuit for providing the waveguide system 1402 with temporary power. The loss of energy sensor 1404c can be used to detect when the waveguide system 1402 has a loss of power condition and/or the occurrence of some other malfunction. For example, the loss of energy sensor 1404c can detect when there is a loss of power due to defective solar cells, an obstruction on the solar cells that causes them to malfunction, loss of power on the power line 1410, and/or when the backup power system malfunctions due to expiration of a backup battery, or a detectable defect in a super capacitor. When a malfunction and/or loss of power occurs, the loss of energy sensor 1404c can notify the network management system 1601 by way of the base station 1414.

The noise sensor 1404d can be used to measure noise on the power line 1410 that may adversely affect transmission of electromagnetic waves on the power line 1410. The noise sensor 1404d can sense unexpected electromagnetic interference, noise bursts, or other sources of disturbances that may interrupt transmission of modulated electromagnetic waves on a surface of a power line 1410. A noise burst can be caused by, for example, a corona discharge, or other source of noise. The noise sensor 1404d can compare the measured noise to a noise profile obtained by the waveguide system 1402 from an internal database of noise profiles or from a remotely located database that stores noise profiles via pattern recognition, an expert system, curve fitting, matched filtering or other artificial intelligence, classification or comparison technique. From the comparison, the noise sensor 1404d may identify a noise source (e.g., corona discharge or otherwise) based on, for example, the noise profile that provides the closest match to the measured noise. The noise sensor 1404d can also detect how noise affects transmissions by measuring transmission metrics such as bit error rate, packet loss rate, jitter, packet retransmission requests, etc. The noise sensor 1404d can report to the network management system 1601 by way of the base station 1414 the identity of noise sources, their time of occurrence, and transmission metrics, among other things.

The vibration sensor 1404e can include accelerometers and/or gyroscopes to detect 2D or 3D vibrations on the power line 1410. The vibrations can be compared to vibration profiles that can be stored locally in the waveguide system 1402, or obtained by the waveguide system 1402 from a remote database via pattern recognition, an expert system, curve fitting, matched filtering or other artificial intelligence, classification or comparison technique. Vibration profiles can be used, for example, to distinguish fallen trees from wind gusts based on, for example, the vibration profile that provides the closest match to the measured vibrations. The results of this analysis can be reported by the vibration sensor 1404e to the network management system 1601 by way of the base station 1414.

The environmental sensor 1404f can include a barometer for measuring atmospheric pressure, ambient temperature (which can be provided by the temperature sensor 1404a), wind speed, humidity, wind direction, and rainfall, among other things. The environmental sensor 1404f can collect raw information and process this information by comparing it to environmental profiles that can be obtained from a memory of the waveguide system 1402 or a remote database to predict weather conditions before they arise via pattern recognition, an expert system, knowledge-based system or other artificial intelligence, classification or other weather modeling and prediction technique. The environmental sensor 1404f can report raw data as well as its analysis to the network management system 1601.

The image sensor 1404g can be a digital camera (e.g., a charged coupled device or CCD imager, infrared camera, etc.) for capturing images in a vicinity of the waveguide system 1402. The image sensor 1404g can include an electromechanical mechanism to control movement (e.g., actual position or focal points/zooms) of the camera for inspecting the power line 1410 from multiple perspectives (e.g., top surface, bottom surface, left surface, right surface and so on). Alternatively, the image sensor 1404g can be designed such that no electromechanical mechanism is needed in order to obtain the multiple perspectives. The collection and retrieval of imaging data generated by the image sensor 1404g can be controlled by the network management system 1601, or can be autonomously collected and reported by the image sensor 1404g to the network management system 1601.

Other sensors that may be suitable for collecting telemetry information associated with the waveguide system 1402 and/or the power lines 1410 for purposes of detecting, predicting and/or mitigating disturbances that can impede electromagnetic wave transmissions on power lines 1410 (or any other form of a transmission medium of electromagnetic waves) may be utilized by the waveguide system 1402.

Figure 16:
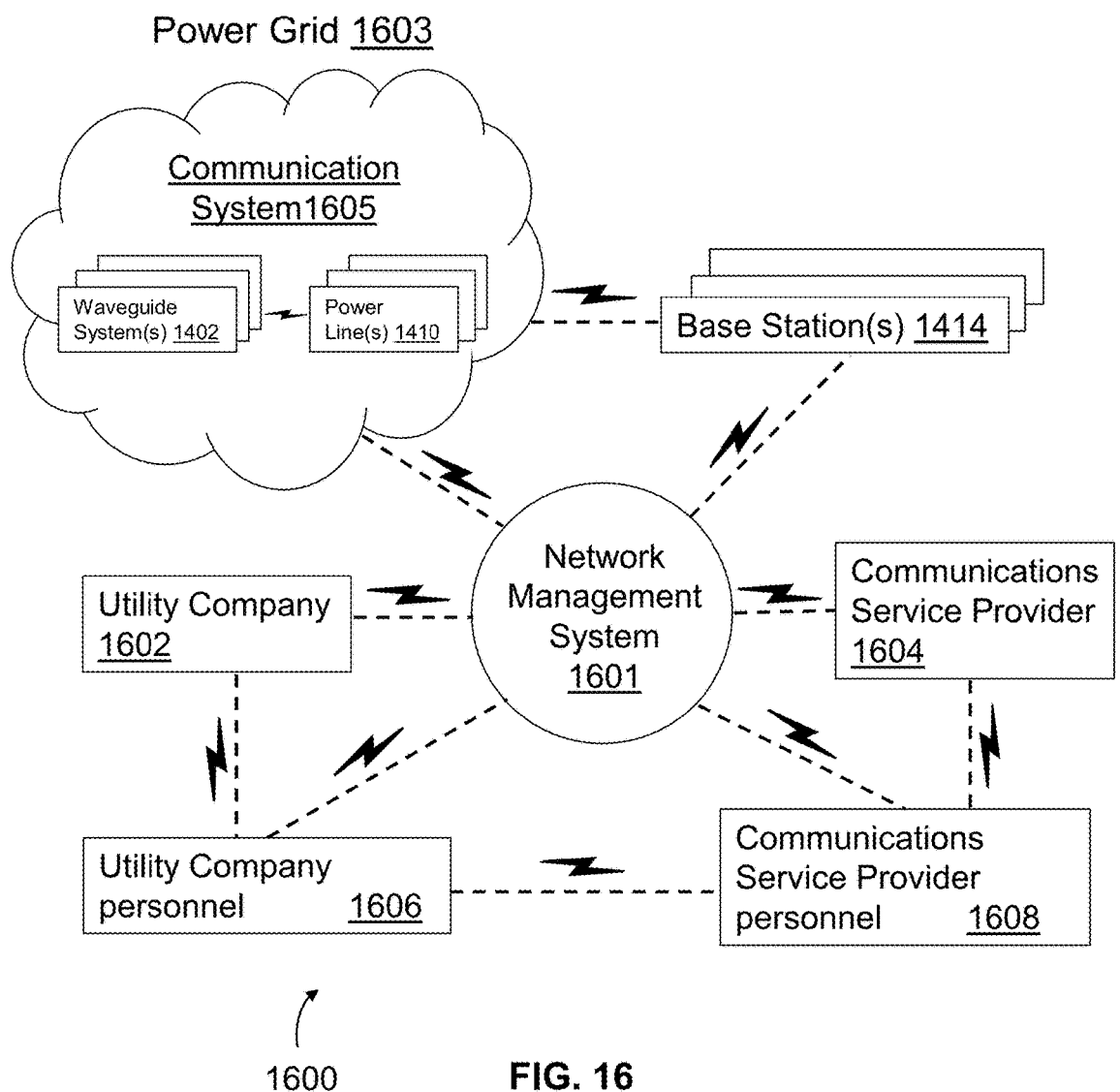
FIG. 16 is a block diagram illustrating an example, non-limiting embodiment of a system for managing a power grid communication system in accordance with various aspects described herein.

FIG. 16 is a block diagram illustrating an example, non-limiting embodiment of a system 1600 for managing a power grid 1603 and a communication system 1605 embedded therein in accordance with various aspects described herein. The communication system 1605 comprises a plurality of waveguide systems 1402 coupled to power lines 1410 of the power grid 1603. At least a portion of the waveguide systems 1402 used in the communication system 1605 can be in direct communication with a base station 1414 and/or the network management system 1601. Waveguide systems 1402 not directly connected to a base station 1414 or the network management system 1601 can engage in communication sessions with either a base station 1414 or the network management system 1601 by way of other downstream waveguide systems 1402 connected to a base station 1414 or the network management system 1601.

The network management system 1601 can be communicatively coupled to equipment of a utility company 1602 and equipment of a communications service provider 1604 for providing each entity, status information associated with the power grid 1603 and the communication system 1605, respectively. The network management system 1601, the equipment of the utility company 1602, and the communications service provider 1604 can access communication devices utilized by utility company personnel 1606 and/or communication devices utilized by communications service provider personnel 1608 for purposes of providing status information and/or for directing such personnel in the management of the power grid 1603 and/or communication system 1605.

Figure 17A:
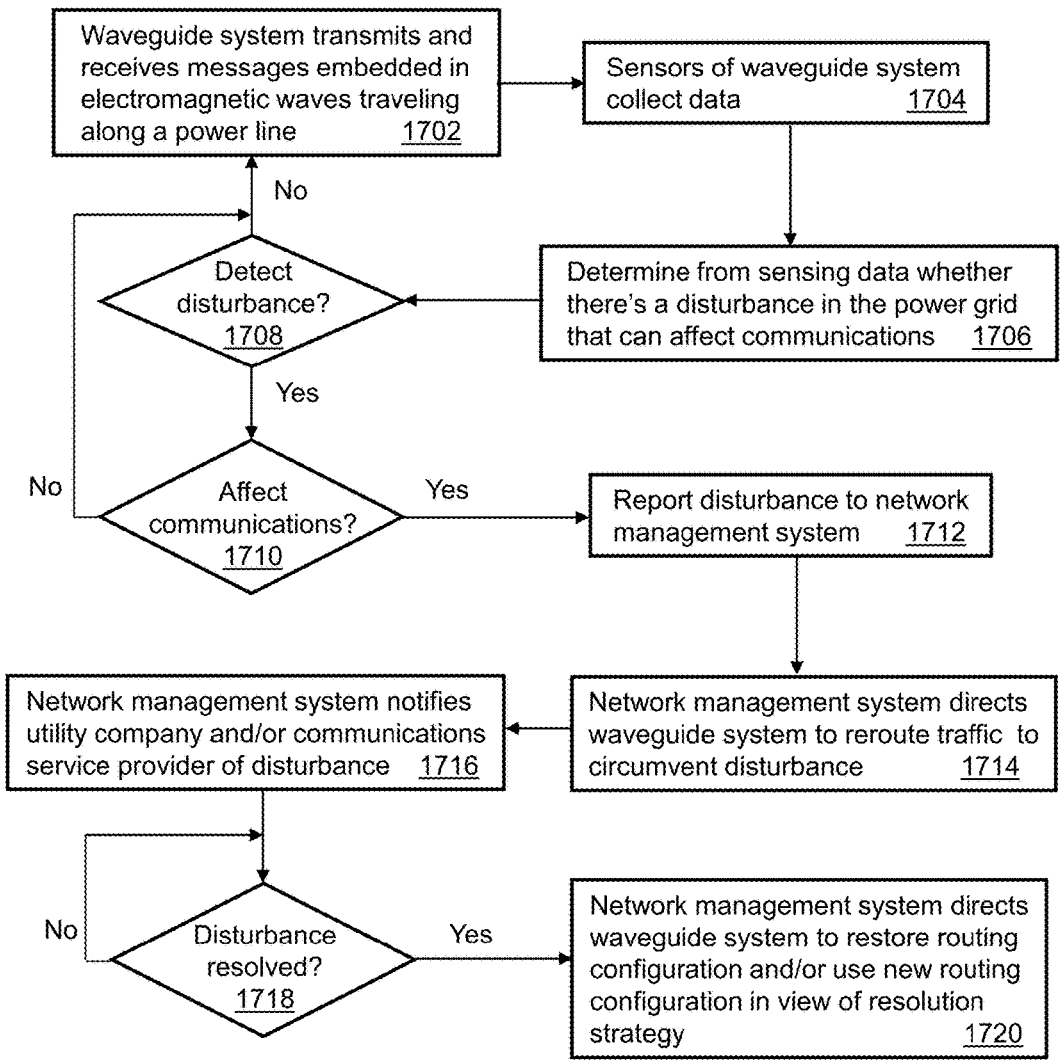
FIG. 17A illustrates a flow diagram of an example, non-limiting embodiment of a method for detecting and mitigating disturbances occurring in a communication network of the system of FIG. 16.

FIG. 17A illustrates a flow diagram of an example, non-limiting embodiment of a method 1700 for detecting and mitigating disturbances occurring in a communication network of the system 1600 of FIG. 16. Method 1700 can begin with step 1702 where a waveguide system 1402 transmits and receives messages embedded in, or forming part of, modulated electromagnetic waves or another type of electromagnetic waves traveling along a surface of a power line 1410. The messages can be voice messages, streaming video, and/or other data/information exchanged between communication devices communicatively coupled to the communication system 1605. At step 1704 the sensors 1404 of the waveguide system 1402 can collect sensing data. In an embodiment, the sensing data can be collected in step 1704 prior to, during, or after the transmission and/or receipt of messages in step 1702. At step 1706 the waveguide system 1402 (or the sensors 1404 themselves) can determine from the sensing data an actual or predicted occurrence of a disturbance in the communication system 1605 that can affect communications originating from (e.g., transmitted by) or received by the waveguide system 1402. The waveguide system 1402 (or the sensors 1404) can process temperature data, signal reflection data, loss of energy data, noise data, vibration data, environmental data, or any combination thereof to make this determination. The waveguide system 1402 (or the sensors 1404) may also detect, identify, estimate, or predict the source of the disturbance and/or its location in the communication system 1605. If a disturbance is neither detected/identified nor predicted/estimated at step 1708, the waveguide system 1402 can proceed to step 1702 where it continues to transmit and receive messages embedded in, or forming part of, modulated electromagnetic waves traveling along a surface of the power line 1410.

If at step 1708 a disturbance is detected/identified or predicted/estimated to occur, the waveguide system 1402 proceeds to step 1710 to determine if the disturbance adversely affects (or alternatively, is likely to adversely affect or the extent to which it may adversely affect) transmission or reception of messages in the communication system 1605. In one embodiment, a duration threshold and a frequency of occurrence threshold can be used at step 1710 to determine when a disturbance adversely affects communications in the communication system 1605. For illustration purposes only, assume a duration threshold is set to 500 ms, while a frequency of occurrence threshold is set to 5 disturbances occurring in an observation period of 10 sec. Thus, a disturbance having a duration greater than 500 ms will trigger the duration threshold. Additionally, any disturbance occurring more than 5 times in a 10 sec time interval will trigger the frequency of occurrence threshold.

In one embodiment, a disturbance may be considered to adversely affect signal integrity in the communication systems 1605 when the duration threshold alone is exceeded. In another embodiment, a disturbance may be considered as adversely affecting signal integrity in the communication systems 1605 when both the duration threshold and the frequency of occurrence threshold are exceeded. The latter embodiment is thus more conservative than the former embodiment for classifying disturbances that adversely affect signal integrity in the communication system 1605. It will be appreciated that many other algorithms and associated parameters and thresholds can be utilized for step 1710 in accordance with example embodiments.

Referring back to method 1700, if at step 1710 the disturbance detected at step 1708 does not meet the condition for adversely affected communications (e.g., neither exceeds the duration threshold nor the frequency of occurrence threshold), the waveguide system 1402 may proceed to step 1702 and continue processing messages. For instance, if the disturbance detected in step 1708 has a duration of 1 ms with a single occurrence in a 10 sec time period, then neither threshold will be exceeded. Consequently, such a disturbance may be considered as having a nominal effect on signal integrity in the communication system 1605 and thus would not be flagged as a disturbance requiring mitigation. Although not flagged, the occurrence of the disturbance, its time of occurrence, its frequency of occurrence, spectral data, and/or other useful information, may be reported to the network management system 1601 as telemetry data for monitoring purposes.

Referring back to step 1710, if on the other hand the disturbance satisfies the condition for adversely affected communications (e.g., exceeds either or both thresholds), the waveguide system 1402 can proceed to step 1712 and report the incident to the network management system 1601. The report can include raw sensing data collected by the sensors 1404, a description of the disturbance if known by the waveguide system 1402, a time of occurrence of the disturbance, a frequency of occurrence of the disturbance, a location associated with the disturbance, parameters readings such as bit error rate, packet loss rate, retransmission requests, jitter, latency and so on. If the disturbance is based on a prediction by one or more sensors of the waveguide system 1402, the report can include a type of disturbance expected, and if predictable, an expected time occurrence of the disturbance, and an expected frequency of occurrence of the predicted disturbance when the prediction is based on historical sensing data collected by the sensors 1404 of the waveguide system 1402.

At step 1714, the network management system 1601 can determine a mitigation, circumvention, or correction technique, which may include directing the waveguide system 1402 to reroute traffic to circumvent the disturbance if the location of the disturbance can be determined. In one embodiment, the waveguide system 1402 detecting the disturbance may direct a repeater 1802 such as the one shown in FIG. 18A to connect the waveguide system 1402 from a primary power line 1804 affected by the disturbance to a secondary power line 1806 to enable the waveguide system 1402 to reroute traffic to a different transmission medium and avoid the disturbance 1801. In an embodiment where the waveguide system 1402 is configured as a repeater, such as repeater 1802, the waveguide system 1402 can itself perform the rerouting of traffic from the primary power line 1804 to the secondary power line 1806. It is further noted that for bidirectional communications (e.g., full or half-duplex communications), the repeater 1802 can be configured to reroute traffic from the secondary power line 1806 back to the primary power line 1804 for processing by the waveguide system 1402.

Figure 18A:
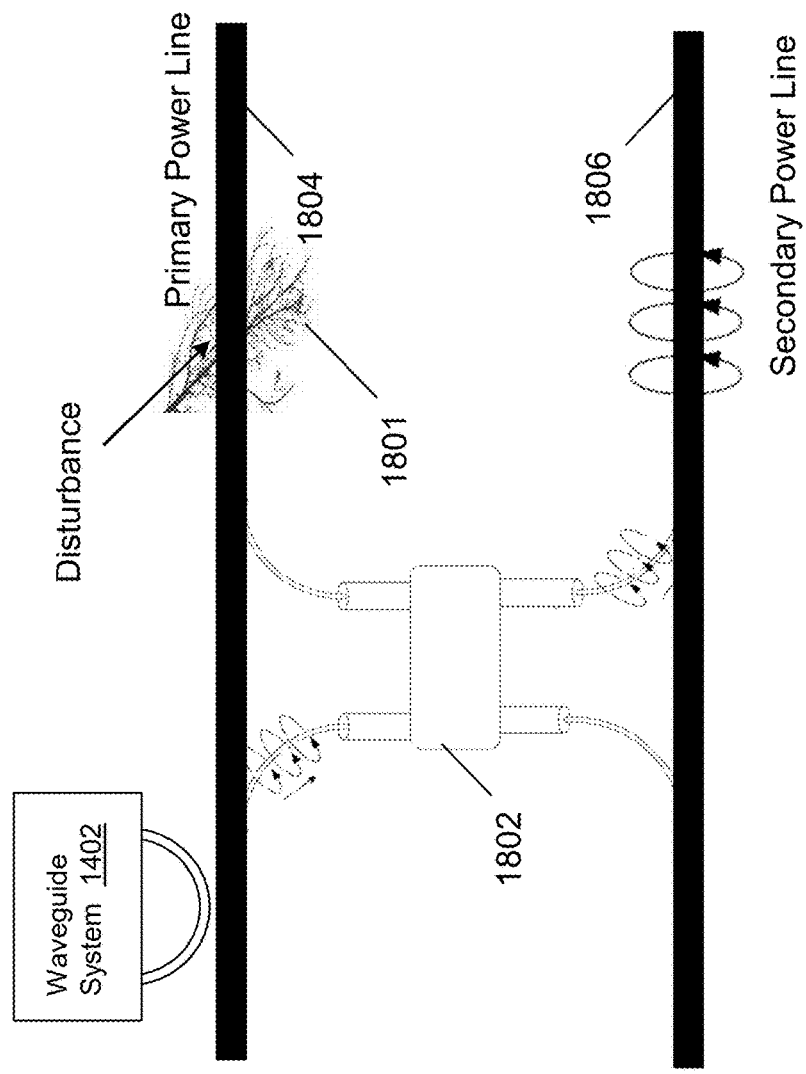
FIG. 18A illustrates an example, non-limiting embodiment for mitigating a disturbance detected by the waveguide system of FIG. 14 as described herein.
Figure 18B:
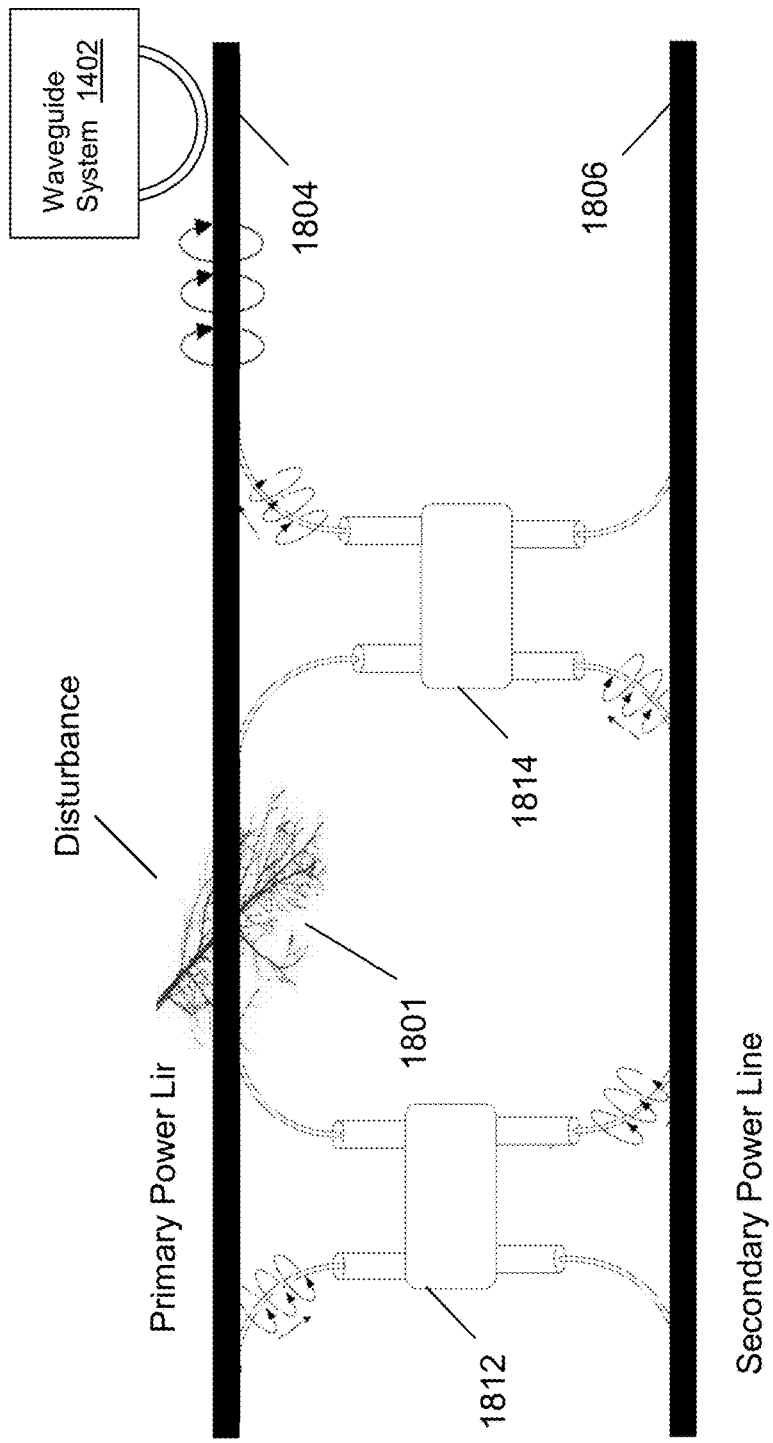
FIG. 18B illustrates another example, non-limiting embodiment for mitigating a disturbance detected by the waveguide system of FIG. 14 as described herein.

In another embodiment, the waveguide system 1402 can redirect traffic by instructing a first repeater 1812 situated upstream of the disturbance and a second repeater 1814 situated downstream of the disturbance to redirect traffic from a primary power line 1804 temporarily to a secondary power line 1806 and back to the primary power line 1804 in a manner that avoids the disturbance 1801 as shown in FIG. 18B. It is further noted that for bidirectional communications (e.g., full or half-duplex communications), the repeaters 1812 and 1814 can be configured to reroute traffic from the secondary power line 1806 back to the primary power line 1804.

To avoid interrupting existing communication sessions occurring on a secondary power line 1806, the network management system 1601 may direct the waveguide system 1402 (in the embodiments of FIGS. 18A-18B) to instruct repeater(s) to utilize unused time slot(s) and/or frequency band(s) of the secondary power line 1806 for redirecting data and/or voice traffic away from the primary power line 1804 to circumvent the disturbance 1801.

At step 1716, while traffic is being rerouted to avoid the disturbance, the network management system 1601 can notify equipment of the utility company 1602 and/or equipment of the communications service provider 1604, which in turn may notify personnel of the utility company 1606 and/or personnel of the communications service provider 1608 of the detected disturbance and its location if known. Field personnel from either party can attend to resolving the disturbance at a determined location of the disturbance. Once the disturbance is removed or otherwise mitigated by personnel of the utility company and/or personnel of the communications service provider, such personnel can notify their respective companies and/or the network management system 1601 utilizing field equipment (e.g., a laptop computer, smartphone, etc.) communicatively coupled to network management system 1601, and/or equipment of the utility company and/or the communications service provider. The notification can include a description of how the disturbance was mitigated and any changes to the power lines 1410 that may change a topology of the communication system 1605.

Once the disturbance has been resolved, the network management system 1601 can direct the waveguide system 1402 at step 1720 to restore the previous routing configuration used by the waveguide system 1402 or route traffic according to a new routing configuration if the restoration strategy used to mitigate the disturbance resulted in a new network topology of the communication system 1605. In another embodiment, the waveguide system 1402 can be configured to monitor mitigation of the disturbance by transmitting test signals on the power line 1410 to determine when the disturbance has been removed. Once the waveguide 1402 detects an absence of the disturbance it can autonomously restore its routing configuration without assistance by the network management system 1601 if it determines the network topology of the communication system 1605 has not changed, or it can utilize a new routing configuration that adapts to a detected new network topology.

Figure 17B:
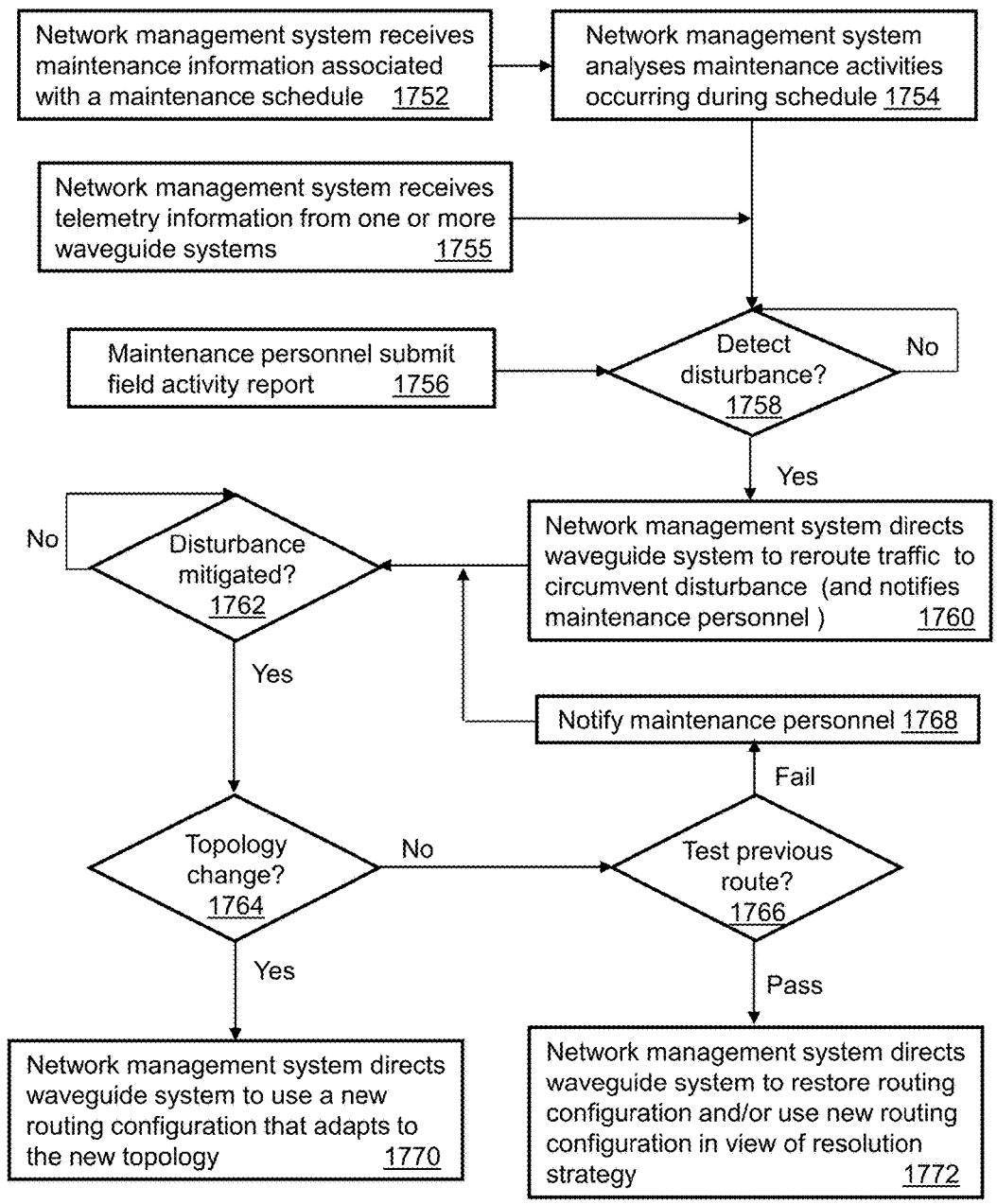
FIG. 17B illustrates a flow diagram of an example, non-limiting embodiment of a method for detecting and mitigating disturbances occurring in a communication network of the system of FIG. 16.

FIG. 17B illustrates a flow diagram of an example, non-limiting embodiment of a method 1750 for detecting and mitigating disturbances occurring in a communication network of the system 1600 of FIG. 16. In one embodiment, method 1750 can begin with step 1752 where a network management system 1601 receives from equipment of the utility company 1602 or equipment of the communications service provider 1604 maintenance information associated with a maintenance schedule. The network management system 1601 can at step 1754 identify from the maintenance information, maintenance activities to be performed during the maintenance schedule. From these activities, the network management system 1601 can detect a disturbance resulting from the maintenance (e.g., scheduled replacement of a power line 1410, scheduled replacement of a waveguide system 1402 on the power line 1410, scheduled reconfiguration of power lines 1410 in the power grid 1603, etc.).

In another embodiment, the network management system 1601 can receive at step 1755 telemetry information from one or more waveguide systems 1402. The telemetry information can include among other things an identity of each waveguide system 1402 submitting the telemetry information, measurements taken by sensors 1404 of each waveguide system 1402, information relating to predicted, estimated, or actual disturbances detected by the sensors 1404 of each waveguide system 1402, location information associated with each waveguide system 1402, an estimated location of a detected disturbance, an identification of the disturbance, and so on. The network management system 1601 can determine from the telemetry information a type of disturbance that may be adverse to operations of the waveguide, transmission of the electromagnetic waves along the wire surface, or both. The network management system 1601 can also use telemetry information from multiple waveguide systems 1402 to isolate and identify the disturbance. Additionally, the network management system 1601 can request telemetry information from waveguide systems 1402 in a vicinity of an affected waveguide system 1402 to triangulate a location of the disturbance and/or validate an identification of the disturbance by receiving similar telemetry information from other waveguide systems 1402.

In yet another embodiment, the network management system 1601 can receive at step 1756 an unscheduled activity report from maintenance field personnel. Unscheduled maintenance may occur as result of field calls that are unplanned or as a result of unexpected field issues discovered during field calls or scheduled maintenance activities. The activity report can identify changes to a topology configuration of the power grid 1603 resulting from field personnel addressing discovered issues in the communication system 1605 and/or power grid 1603, changes to one or more waveguide systems 1402 (such as replacement or repair thereof), mitigation of disturbances performed if any, and so on.

At step 1758, the network management system 1601 can determine from reports received according to steps 1752 through 1756 if a disturbance will occur based on a maintenance schedule, or if a disturbance has occurred or is predicted to occur based on telemetry data, or if a disturbance has occurred due to an unplanned maintenance identified in a field activity report. From any of these reports, the network management system 1601 can determine whether a detected or predicted disturbance requires rerouting of traffic by the affected waveguide systems 1402 or other waveguide systems 1402 of the communication system 1605.

When a disturbance is detected or predicted at step 1758, the network management system 1601 can proceed to step 1760 where it can direct one or more waveguide systems 1402 to reroute traffic to circumvent the disturbance similar to the illustrations of FIG. 18A or 18B. When the disturbance is permanent due to a permanent topology change of the power grid 1603, the network management system 1601 can proceed to step 1770 and skip steps 1762, 1764, 1766, and 1772. At step 1770, the network management system 1601 can direct one or more waveguide systems 1402 to use a new routing configuration that adapts to the new topology. However, when the disturbance has been detected from telemetry information supplied by one or more waveguide systems 1402, the network management system 1601 can notify maintenance personnel of the utility company 1606 or the communications service provider 1608 of a location of the disturbance, a type of disturbance if known, and related information that may be helpful to such personnel to mitigate the disturbance. When a disturbance is expected due to maintenance activities, the network management system 1601 can direct one or more waveguide systems 1402 to reconfigure traffic routes at a given schedule (consistent with the maintenance schedule) to avoid disturbances caused by the maintenance activities during the maintenance schedule.

Returning back step 1760 and upon its completion, the process can continue with step 1762. At step 1762, the network management system 1601 can monitor when the disturbance(s) have been mitigated by field personnel. Mitigation of a disturbance can be detected at step 1762 by analyzing field reports submitted to the network management system 1601 by field personnel over a communications network (e.g., cellular communication system) utilizing field equipment (e.g., a laptop computer or handheld computer/device). If field personnel have reported that a disturbance has been mitigated, the network management system 1601 can proceed to step 1764 to determine from the field report whether a topology change was required to mitigate the disturbance. A topology change can include rerouting a power line 1410, reconfiguring a waveguide system 1402 to utilize a different power line 1410, otherwise utilizing an alternative link to bypass the disturbance and so on. If a topology change has taken place, the network management system 1601 can direct at step 1770 one or more waveguide systems 1402 to use a new routing configuration that adapts to the new topology.

If, however, a topology change has not been reported by field personnel, the network management system 1601 can proceed to step 1766 where it can direct one or more waveguide systems 1402 to send test signals to test a routing configuration that had been used prior to the detected disturbance(s). Test signals can be sent to affected waveguide systems 1402 in a vicinity of the disturbance. The test signals can be used to determine if signal disturbances (e.g., electromagnetic wave reflections) are detected by any of the waveguide systems 1402. If the test signals confirm that a prior routing configuration is no longer subject to previously detected disturbance(s), then the network management system 1601 can at step 1772 direct the affected waveguide systems 1402 to restore a previous routing configuration. If, however, test signals analyzed by one or more waveguide systems 1402 and reported to the network management system 1601 indicate that the disturbance(s) or new disturbance(s) are present, then the network management system 1601 will proceed to step 1768 and report this information to field personnel to further address field issues. The network management system 1601 can in this situation continue to monitor mitigation of the disturbance(s) at step 1762.

In the aforementioned embodiments, the waveguide systems 1402 can be configured to be self-adapting to changes in the power grid 1603 and/or to mitigation of disturbances. That is, one or more affected waveguide systems 1402 can be configured to self-monitor mitigation of disturbances and reconfigure traffic routes without requiring instructions to be sent to them by the network management system 1601. In this embodiment, the one or more waveguide systems 1402 that are self-configurable can inform the network management system 1601 of its routing choices so that the network management system 1601 can maintain a macro-level view of the communication topology of the communication system 1605.

While for purposes of simplicity of explanation, the respective processes are shown and described as a series of blocks in FIGS. 17A and 17B, respectively, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 19:
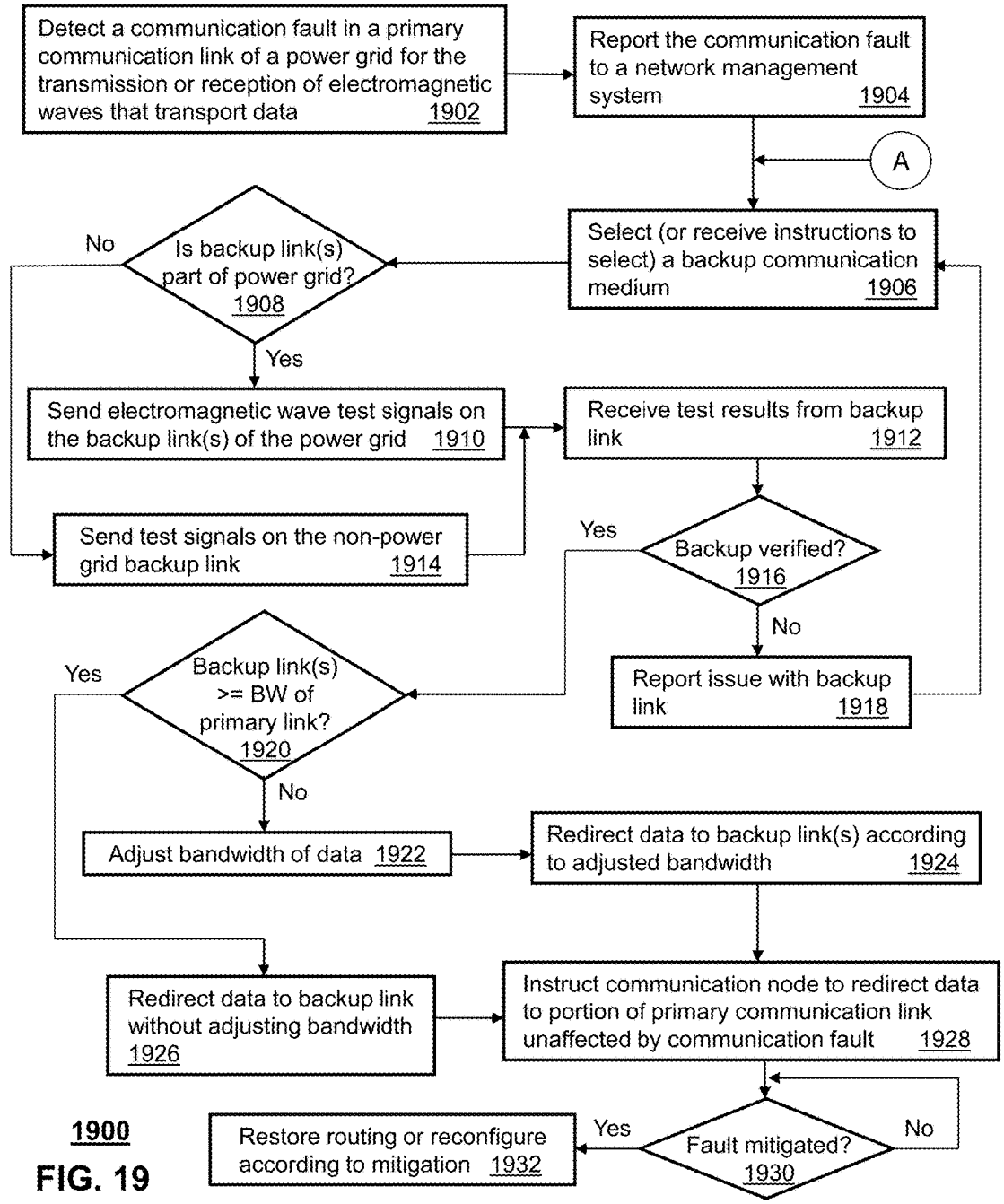
FIG. 19 illustrates a flow diagram of an example, non-limiting embodiment of a method for mitigating communication faults in a communication system of FIG. 20.
Figure 20:
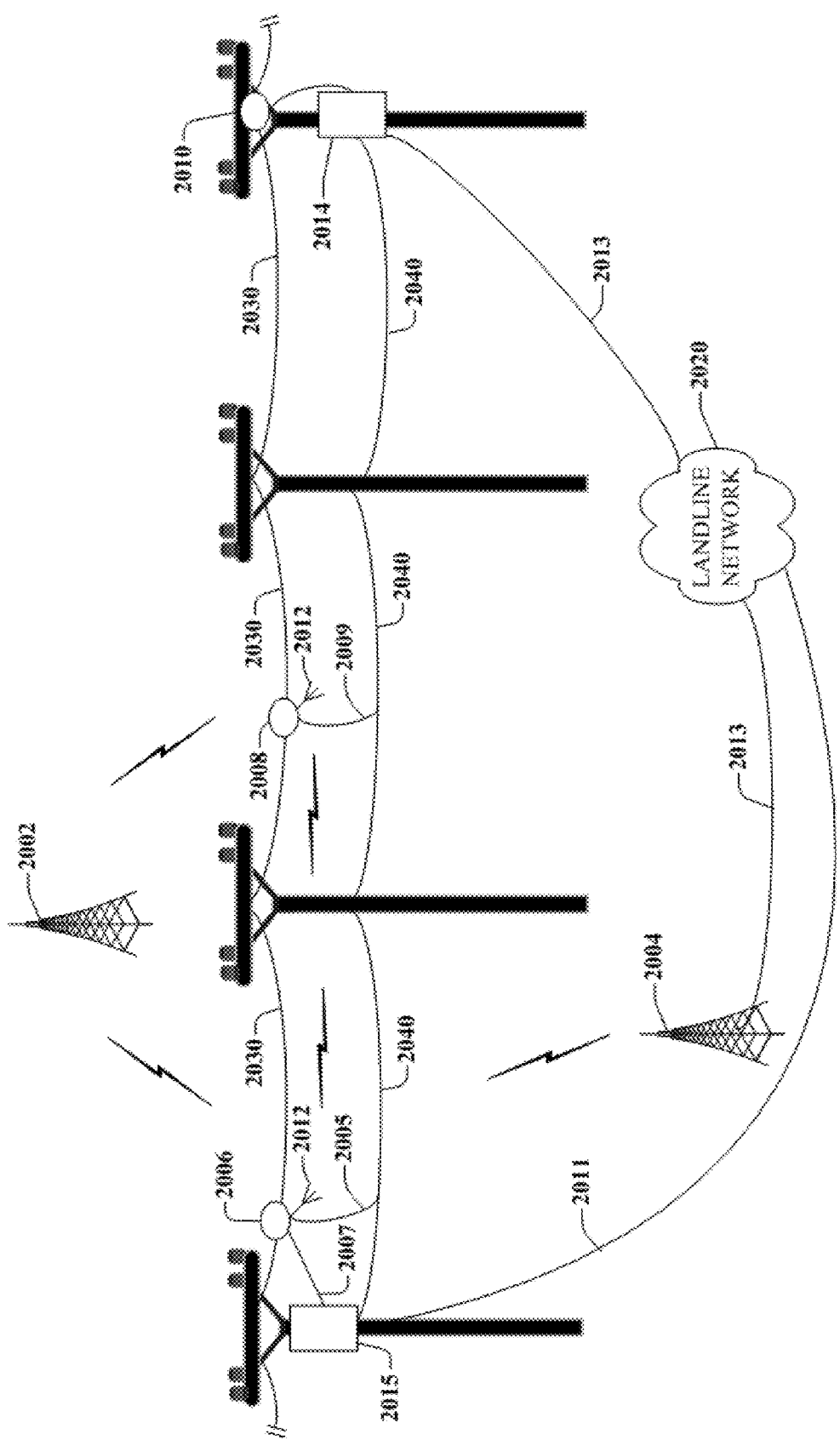
FIG. 20 is a block diagram of an example, non-limiting embodiment of a communication system in accordance with various aspects described herein.

FIG. 19 illustrates a flow diagram of an example, non-limiting embodiment of a method 1900 for mitigating communication faults in a communication system of FIG. 20. Method 1900 can begin at step 1902 where a waveguide system such as shown in FIG. 14 detects a communication fault in a primary communication link depicted by reference 2030 of FIG. 20 (herein referred to as primary communication link 2030). For long-haul communications, the primary communication link 2030 can represent a high voltage power line (e.g., 100 kV-138 kV), an extra high voltage power line (e.g., 230 kV-800 kV), or an ultra-high voltage power line (e.g., >800 kV) of the power grid. Generally, such power lines are placed at a high altitude on utility poles for safety reasons and to reduce a likelihood of obstructions from tree limbs. For short-haul communications (e.g., urban, suburban, or rural areas), the primary communication link 2030 can represent a medium voltage power line (e.g., 4 kV to 69 kV), which are generally positioned above lower voltage power lines, telephone lines, and/or coaxial cable lines.

However, obstructions from tree limbs can happen with such power lines, which as was described previously can be sensed by sensors of the waveguide system described in FIG. 14. Generally, a communication fault can represent any disturbance sensed or detected by the sensors of the waveguide system that can adversely affect the transmission or reception of electromagnetic waves that transport communication data and that propagate on a surface of the primary communication link 2030. A non-limiting illustration of communication data can include voice communication services, internet services, broadcast video services, control data for controlling the distribution of content and/or for establishing voice and/or data communication sessions, voice or data communications from other networks, or other types of data services in any combination thereof.

At step 1904, the waveguide system 1402 can report the communication fault to a network management system 1601 such as shown in FIGS. 14 and 16. In one embodiment, the network management system 1601 can take evasive action by instructing the waveguide system 1402 to select at step 1906 one or more backup communication mediums that provide backup communication services in the event of a communication fault at the primary communication link 2030. In another embodiment, the waveguide system 1402 can autonomously take evasive action to maintain communication services active by selecting at step 1906 one or more backup communication mediums. The waveguide system 1402 can be configured to select a backup communication medium based on selection criteria. The selection criteria can include quality metrics that can be used to verify that the backup communication medium is suitable for backup communication services. Quality metrics can include without limitation a desired communications bandwidth, a desired Quality of Service (QoS), a desired signal to noise ratio, a desired bit error rate performance, a desired packet loss performance, a desired data throughput, a desired jitter performance, a desired latency performance, and so on.

The waveguide system, which can be represented by any of references 2006, 2008, or 2010 of FIG. 20 (herein referred to as waveguide systems 2006, 2008, or 2010) can have multiple options for initiating backup communication services. For example, waveguide system 2006 can have an antenna 2012 that can be coupled to a communications interface such as reference 1408 of FIG. 14 to enable the waveguide system 2006 to engage in wireless communications (e.g., LTE, WiFi, or otherwise) with base station 2002, base station 2004, or other waveguide systems deploying a wireless communications interface with an antenna 2012 such as waveguide system 2008. Waveguide system 2006 can thus redirect communications data to base station 2002 over a first wireless link. Base station 2002 can in turn redirect the communications data to waveguide system 2008 over a second wireless link. Waveguide system 2008 can then retransmit the communications data using electromagnetic waves that propagate on the primary link 2030.

Similarly, waveguide system 2006 can redirect communications data to base station 2004 over a first wireless link. Base station 2004 in turn can redirect the communications data to a landline network 2020 over a high speed wired link 2013 (e.g., fiber). The landline network 2020 can also redirect the communication data to a local base station 2014 (e.g., a microcell) over another high speed link 2013. The local base station 2014 can then supply the communications data to waveguide system 2010 which retransmits the communications data using electromagnetic waves that propagate on the primary communication link 2030. Additionally, waveguide system 2006 can redirect communications data to waveguide system 2008 over a wireless link. Waveguide system 2008 can then retransmit the communications data using electromagnetic waves that propagate on the primary communication link 2030.

In each of the above example embodiments, the communications data is sent by the waveguide system 2006 to the backup communication medium, which redirects it back to a portion of the primary communication link 2030 unaffected by the communication fault. Unaffected portions of the primary communication link 2030 can be identified by the network management system 1601. The network management system 1601 can in turn coordinate the flow of traffic with communication nodes of the backup communication medium selected by waveguide system 2006 to redirect communications data back to unaffected portions of the primary communication link 2030.

Using a wireless link to connect to any of the backup communication mediums may, however, result in less bandwidth than the original bandwidth capacity of the affected primary communication link 2030. In such situations, waveguide system 2006 may need to adjust the bandwidth of the communications data to accommodate retransmission over a selected backup communication medium as will be addressed by method 1900 at steps 1920, 1922 and 1924. To reduce or eliminate the need for bandwidth adjustments, the waveguide system 2006 can select multiple wireless backup communication mediums to mitigate the need for adjusting the bandwidth of the communications data by distributing portions of the communications data between the selected backup communication mediums.

In addition to wireless backup links, the waveguide system 2006 can use a waveguide 2005 (incorporated in waveguide system 2006) that can couple to an unaffected power line in its vicinity such as power line 2040, which can serve as secondary communication link (herein referred to as secondary communication link 2040) for providing backup communication services. For long-haul communications, the secondary communication link 2040 can represent another high power line if more than one high power line is available, or a medium voltage power line if available. For short-haul communications (e.g., urban, suburban, or rural areas), the secondary communication link 2040 can represent a low voltage power line (e.g., less than 1000 volts such as 240V) for distributing electrical power to commercial and/or residential establishments, telephone lines, or coaxial cable lines. The low voltage power line, telephone lines, or coaxial cable lines are generally positioned below the medium voltage power line and thus may be more susceptible to obstructions such as tree limbs that may cause a disturbance that adversely affects the transmission or reception of electromagnetic waves on a surface of secondary communication link 2040.

Secondary communication link 2040 enables waveguide system 2006 to communicate with waveguide system 2008, which also has a waveguide 2009 incorporated therein and coupled to the secondary communication link 2040. In this configuration, the secondary communication link 2040 can be used to bypass a communication fault in the primary communication link 2030 that may be occurring between waveguide system 2006 and waveguide system 2008. In this illustration, waveguide system 2008 can reestablish communication services back to a portion of the primary communication link 2030 that is unaffected by the communication fault detected by waveguide system 2006. If, however, the communication fault on the primary communication link 2030 affects both waveguide system 2006 and waveguide system 2008, waveguide system 2006 can use the secondary communication link 2040 to communicate with the local base station 2014, which can be configured with a waveguide system of its own such as shown in FIG. 14 to receive and transmit electromagnetic waves that transport the communications data and that propagate on a surface of the secondary communication link 2040. The local base station 2014 can in turn supply the communications data to waveguide system 2010 which can redirect its transmission to the primary communication link 2030 to downstream waveguide systems (not shown).

In yet another embodiment, the waveguide system 2006 can also include a link 2007 that couples the waveguide system 2006 to a local base station 2015 (e.g., a microcell). Link 2007 can represent a high speed communication link such as a fiber link enabling the waveguide system 2006 to redirect communications data to the local base station 2015, which in turn can direct communications data to a landline network 2020 that in turn supplies the communications data to another local base station 2014 that can present such signals to waveguide system 2010 for redirecting the communication data back to the primary communication link 2030.

Based on the above illustrations, the waveguide system 2006 has several options for selecting at step 1906 one or more backup communication mediums depending on its bandwidth needs, which include: (1) a wired connection to local base station 2015 via high speed link 2007 which enables waveguide system 2006 to redirect communications data back to the primary communication link 2030 via waveguide system 2010, (2) a connection to secondary communication link 2040 via waveguide 2005 of the waveguide system 2006 which enables waveguide system 2006 to redirect communications data back to the primary communication link 2030 via waveguide system 2008, (3) a connection to secondary communication link 2040 via waveguide 2005 of the waveguide system 2006 which also enables waveguide system 2006 to redirect communications data back to the primary communication link 2030 via waveguide system 2010 using the local base station 2014, (4) a wireless link to base station 2002 which enables waveguide system 2006 to redirect communications data back to the primary communication link 2030 via waveguide system 2008, (5) a wireless link to base station 2004 which enables waveguide system 2006 to redirect communications data back to the primary communication link 2030 via waveguide system 2010 using the local base station 2014, and (6) a wireless link to waveguide system 2008 which can redirect communications data back to the primary communication link 2030.

Once waveguide system 2006 has selected one or more backup communication links, it can proceed to step 1908 where it can determine whether a particular backup communication link is part of the power grid or otherwise (e.g., wireless link or wired link to a local base station). Since it is possible that more than one backup communication link can be selected by waveguide system 2006, steps 1910 and 1914 may be invoked simultaneously or in sequence for each instance of a backup link of the power grid, a backup wireless link, and/or a backup wired link to a local base station.

For backup links of the power grid, the waveguide system 2006 can be configured to transmit electromagnetic wave test signals on the secondary communication link 2040. The electromagnetic wave test signals can be received by waveguide system 2008 and/or local base station 2014 (assuming it has an integrated waveguide system). The test signals can be analyzed by the waveguide system 2008 and/or the local base station 2014. The test signals can be measured, for example, for signal to noise ratio, data throughput, bit error rate, packet loss rate, jitter, latency, and other metrics that can be compared to the selection criteria by waveguide system 2006. The test results can be transmitted back at step 1912 to waveguide system 2006 by waveguide system 2008 and/or by the local base station 2014 over the secondary communication link 2040, or in the case of waveguide system 2008 over a wireless link, and in the case of local base station 2014 over wired links 2013 and 2011. In addition to analyzing test results sent back from waveguide system 2008 and/or local base station 2014 according to the selection criteria, waveguide system 2006 can also perform autonomous tests on the secondary communication link 2040 such as signal reflection measurements and other measurements described in the subject disclosure.

For non-power grid backup links, the waveguide system 2006 can send test signals appropriate for the type of transmission medium being used. In the case of wireless links, the waveguide system 2006 can send wireless test signals to base station 2002, base station 2004, and/or waveguide system 2008. The waveguide system 2006 can determine a received signal strength indication (RSSI) for each wireless link, signal to noise ratios for each wireless link, data throughputs, bit error rates, packet loss rates, and other measurements applicable to the selection criteria for determining the suitability of each wireless link. Test results can also be received at step 1912 by waveguide system 2006 from base station 2002, 2004, and/or waveguide system 2008 over the wireless link. In the case of a wired (non-power grid) link such as link 2007, the waveguide 2006 can send test signals for testing communications with waveguide system 2010. Similarly, test results can be received back from waveguide system 2010 and/or intermediate nodes (e.g., landline network 2020 and/or local base station 2015) for comparison to the selection criteria.

At step 1916, the waveguide system 2006 can assess whether a backup link is suitable for backup communication services in accordance with the selection criteria used by the waveguide system 2006. If a backup link is not available or suitable for backup communication services, the waveguide system 2006 can proceed to step 1918 and report this issue to the network management system 1601 via an available backup link, and proceed to select another backup link (if available) at step 1906. If another backup link is selected, the waveguide system 2006 can perform steps 1908-1912 as previously described. If one or more backup links have been verified at step 1916 to be suitable for backup communication services, then the waveguide system 2006 can proceed to step 1920 to determine if the backup link(s) provide sufficient bandwidth to support the bandwidth being used in the primary communication link 2030 to transport the communications data.

If the backup link(s) cannot support the bandwidth originally used for transmission of the communications data on the primary communication link 2030, the waveguide system 2006 can proceed to step 1922 to adjust the bandwidth of the communications data so that it is suitable for the backup link(s). If real-time transmissions are present, for example, real-time audio or video signals, a transcoder can transcode these real-time signals to reduce the bit rate to conform to the adjusted bandwidth. In another embodiment, the transmission rate of non-real-time signals can be reduced to preserve the quality of service associated with real-time signals included in the communication data. In this step, the waveguide system 2006 can inform the network management system 1601 via an available backup link that the bandwidth of the communications data will be adjusted. The network management system 1601 can in one embodiment inform devices affected by the communication fault (via, for example, backup links) that communications bandwidth must be adjusted to accommodate backup services. Alternatively, the waveguide system 2006 can notify the affected devices via the backup link(s) of the change in bandwidth.

Once bandwidth has been adjusted at step 1922, the waveguide system 2006 can proceed to step 1924 and begin to redirect communications data via the backup link(s). If bandwidth adjustment is not necessary, the waveguide system 2006 can proceed to step 1926 and redirect communications data according to its original bandwidth. In another embodiment, if the bandwidth capacity of the backup link(s) cannot support the bandwidth originally used for transmission of the communications data on the primary communication link 2030, the waveguide system 2006 can proceed to step 1906 to select a different backup link.

In one embodiment, the backup link(s) (i.e., secondary communication links) may be shared with other communication devices (e.g., waveguide systems or other communication nodes). In one embodiment, the waveguide system 2006 can be configured to select an operating frequency for transmitting and receiving communications data over the backup link(s) that differs from the operating frequency used by the other communication devices. In another embodiment, the waveguide system 2006 can be configured to select time slot assignments for transmitting and receiving communications data over the backup link(s) that differs from time slot assignments used by the other communication devices. In yet another embodiment, the waveguide system 2006 can be configured to select a combination of one or more operating frequencies and one or more time slot assignments for transmitting and receiving communications data over the backup link(s) that differ from one or more operating frequencies and one or more time slot assignments used by the other communication devices.

In instances where the backup link(s) have communication access to the power grid at a point where the primary communication link 2030 is unaffected by the communication fault, the waveguide system 2006 can instruct at step 1928 one or more communication nodes in the backup link(s) to redirect the communications data back to the primary communication link 2030 at an unaffected location in the power grid determined by the waveguide system 2006 or at an unaffected location identified by the network management system 1601 and conveyed to the waveguide system 2006, thereby circumventing the communication fault.

While the backup link(s) are in use, the network management system 1601 can be directing personnel of a power utility or communications company to resolve the communication fault as previously described in the subject disclosure. Once the fault has been resolved at step 1930, the network management system 1601 can instruct at step 1932 the waveguide system 2006 (and other communication nodes in the backup link(s)) to restore or reconfigure routing of the communications data according a mitigation strategy used to resolve the communication fault. Alternatively, the waveguide system 2006 can monitor the power grid for mitigation of the communication fault, and autonomously determine whether it can reuse a prior routing configuration or whether it must use a new routing configuration based on a detectable change in the network topology of the power grid. It will be appreciated that communication faults detected by one or more waveguide systems 2006 can be the result of power outages due to broken power lines caused by weather conditions, malfunctioning transformers, or otherwise. The network management system 1601 can also be used to coordinate mitigation of power outages based on communication fault notices sent to the network management system 1601 by one or more waveguide systems 2006. It is also appreciated that secondary communication links (e.g., backup links) can also be represented by underground transmission mediums such as conduits, underground power lines, and so on.

While for purposes of simplicity of explanation, the respective processes are shown and described as a series of blocks in FIG. 19, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. It is further noted that the processes of FIG. 19 can be further modified to perform any of the embodiments described in the subject disclosure, such as, for example, embodiments relating to circumventing disturbances in a power grid such as shown in FIGS. 18A and 18B.

Figure 21:
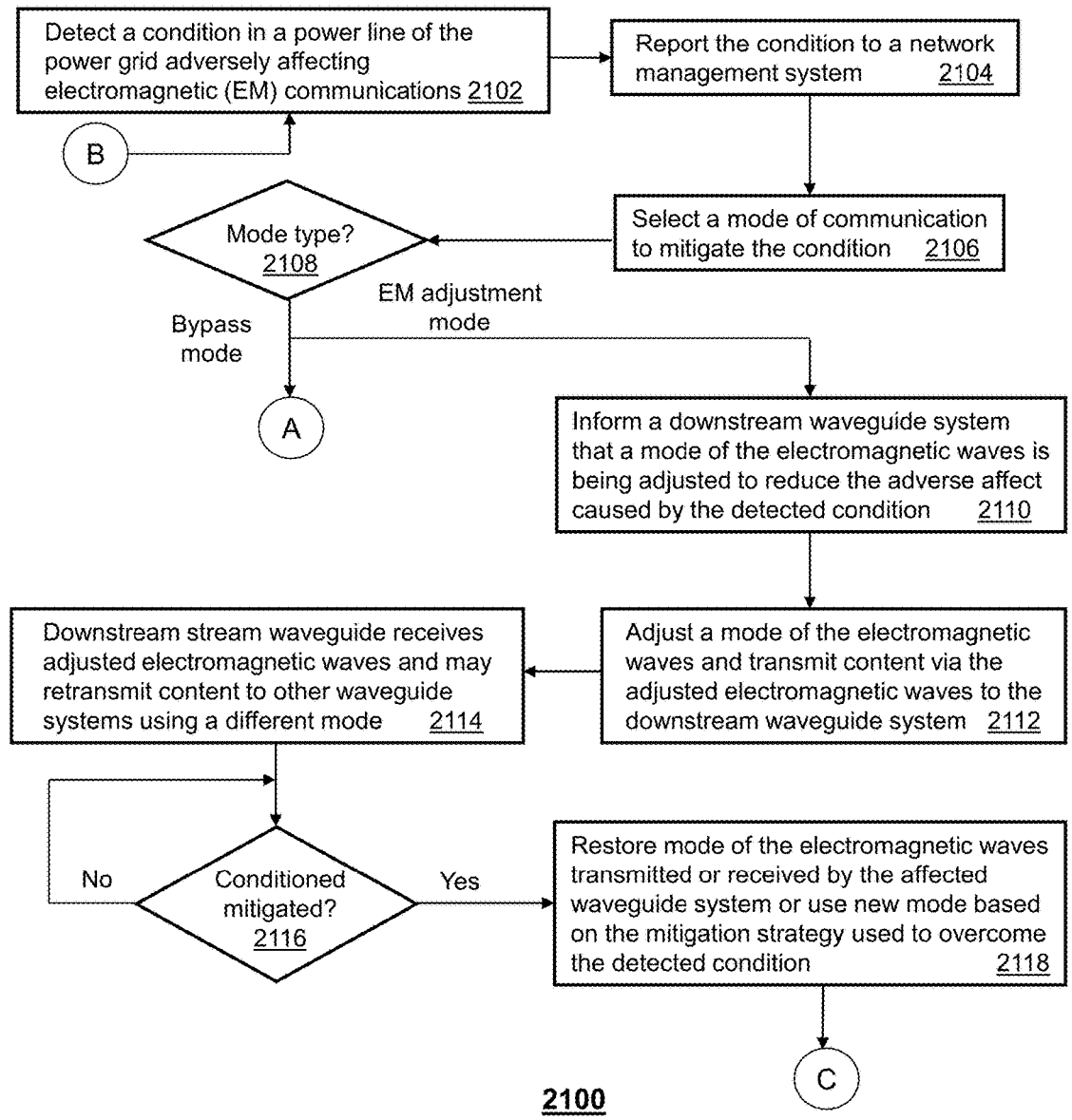
FIG. 21 illustrates a flow diagram of an example, non-limiting embodiment of a method for adjusting a communication mode in a communication system.

FIG. 21 illustrates a flow diagram of an example, non-limiting embodiment of a method 2100 for adjusting a communication mode in a communication system such as the communication system 1605 of FIG. 16. Method 2100 can begin with step 2102 in which a condition in a power line 1410 is detected by a waveguide system 1402, the condition adversely affecting electromagnetic wave communications on the power line 1410. Conditions that may adversely affect electromagnetic wave communications on the power line 1410 may include, without limitation, impairments detectable by the sensors 1404 of the waveguide system 1402 such as the obstructions depicted in FIG. 15, scheduled maintenance of the power line 1410 by field personnel, ad hoc maintenance performed by field personnel, or other conditions detectable by the waveguide system 1402 and/or the network management system 1601. When adverse condition(s) are detected by the waveguide system 1402 (referred to herein as the affected waveguide system 1402) they can be reported at step 2104 to the network management system 1601 and possibly by other neighboring waveguide systems detecting the same condition(s).

At step 2106 a mode of communication can be selected autonomously by the affected waveguide system 1402 according to the adverse condition it has detected at step 2102, or the affected waveguide system 1402 can select the mode of communication based according to instructions given by the network management system 1601. In instances where the adverse condition cannot be remedied without repairs by field personnel and the condition severely affects communications between the affected waveguide system 1402 and other waveguide systems (e.g., a down power line), the type of communication mode selected at step 2108 may be a bypass mode to avoid the affected power line 1410 altogether. The bypass mode can be implemented according to method 1900 of FIG. 19, in which a secondary communication link (or backup link) is used to bypass the adverse condition detected at step 2102. If, however, the adverse condition can be remedied at least in part by the affected waveguide system 1402 without a bypass mode, the waveguide system 1402 can instead select a mode of communication at step 2106 that involves adjusting characteristics of electromagnetic waves transmitted or received by the affected waveguide system 1402.

Figure 22:
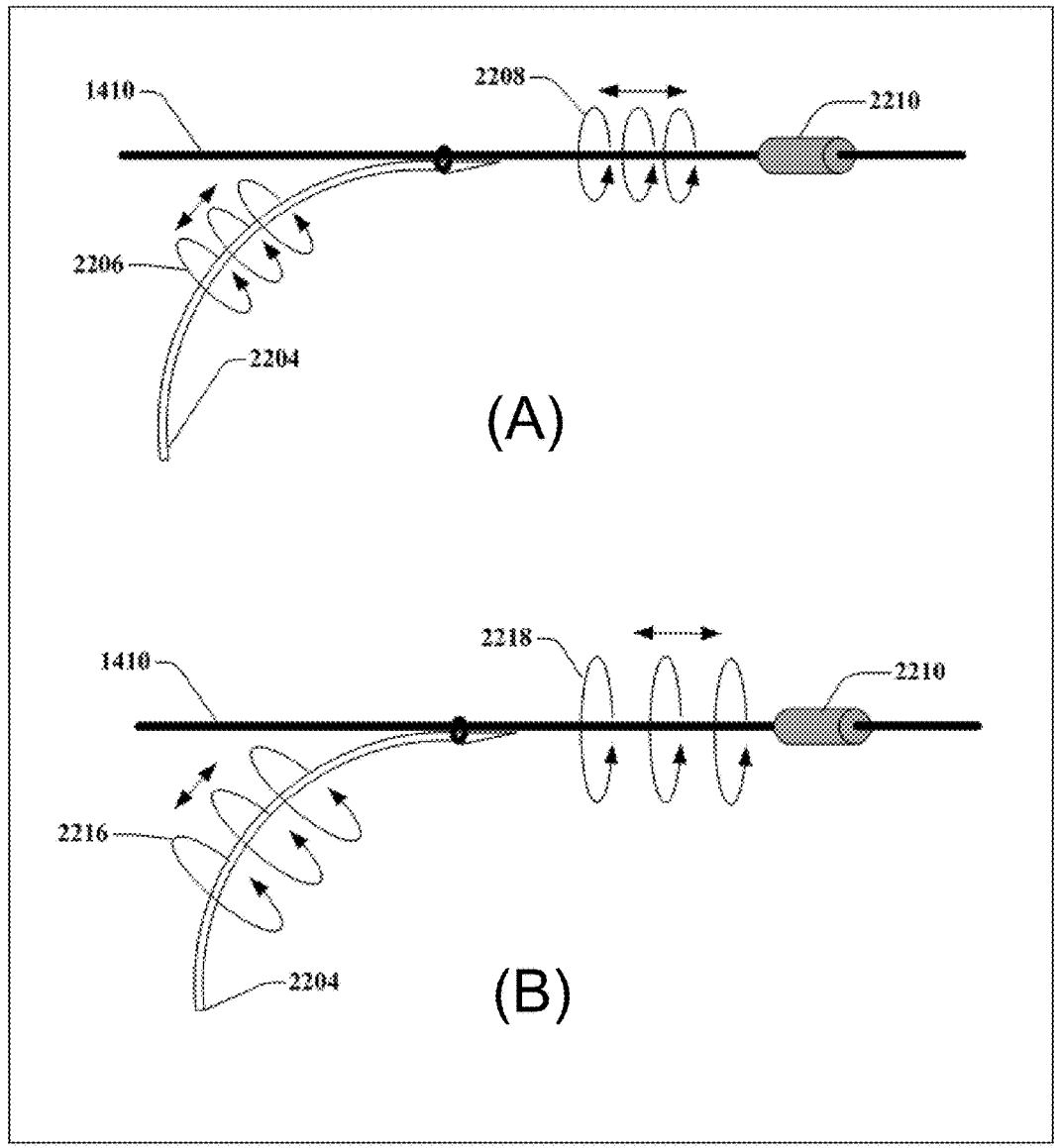
FIG. 22 is a block diagram of an example, non-limiting embodiment of a waveguide system that adjusts a communication mode in accordance with various aspects described herein.

FIG. 22 illustrates by way of example an obstruction 2210 (e.g., a joint for connecting spliced power lines) which can degrade or impair transmission or reception of electromagnetic waves 2208 propagating on an outer surface of the power line 1410. As described in earlier embodiments, when the waveguide system 1402 is in an operational mode that involves transmitting electromagnetic waves, it begins with the generation of electromagnetic waves 2206 propagating on an outer surface of the waveguide 2204 which in turn couple onto an outer surface of the power line 1410 to form electromagnetic waves 2208. On the other hand, when the waveguide system 1402 is in an operational mode for receiving electromagnetic waves, the electromagnetic waves 2208 propagating on the power line 1410 couple onto an outer surface of the waveguide 2204 to form electromagnetic waves 2206 also described previously in the subject disclosure.

In each mode of operation, the obstruction 2210 shown in FIG. 22 can adversely affect the propagation of the electromagnetic waves by attenuating the electromagnetic waves, causing electromagnetic wave reflections, or otherwise degrading, impairing or altering the electromagnetic waves in a manner that may cause propagation losses, or other harmful effects which can reduce a quality of communication services in the communication system 1605 of FIG. 16. To remedy these effects, the affected waveguide system 1402 can be configured to adjust characteristics of the electromagnetic waves transmitted or received thereby. For example, the affected waveguide system 1402 can adjust a wave propagation mode of the electromagnetic waves transmitted or received thereby. In one embodiment, the affected waveguide system 1402 can adjust the wave propagation mode by adjusting a wavelength of the electromagnetic waves to generate adjusted electromagnetic waves 2216 on the waveguide 2204 which in turn couple onto the outer surface of the power line 2202 as electromagnetic waves 2218 having similar wavelengths. The affected waveguide system 1402, for example, can increase the wavelength of the electromagnetic waves to make the electromagnetic waves propagating on the power line 1410 less susceptible to attenuation by the impairment 2210.

It will be appreciated that due to potential non-linear effects caused by the impairment 2210 there may be circumstances when decreasing the wavelength of the electromagnetic waves may improve the propagation of the electromagnetic waves through the impairment 2210. The affected waveguide system 1410 may therefore engage in testing whether increasing or decreasing the wavelength of the electromagnetic waves improves communications.

It will be further appreciated that the affected waveguide system 1402 can also be configured to adjust the wave propagation mode of the electromagnetic waves by adjusting a fundamental mode of the electromagnetic waves, one or more asymmetric modes of the electromagnetic waves, spatial orientations of the one or more asymmetric modes of the electromagnetic waves, or any combination thereof. Adjusting the fundamental mode, asymmetric modes, or spatial orientations of the asymmetric modes may further include adjusting the wavelength of these modes. Additionally, other characteristics of the electromagnetic waves can be adjusted by the affected waveguide system 1402 such as, for example, amplitude, phase, carrier frequency, modulation techniques, and so on. Similarly, error correction techniques used in conjunction with data transported by the electromagnetic waves can be adjusted by the affected waveguide system 1402 to improve the ability to reconstruct portions of data corrupted by the impairment 2210. Thus, any combination of the aforementioned adjustments of the electromagnetic waves and adjustments in error correction schemes can be performed by the affected waveguide system 1402 to mitigate, eliminate and/or reduce adverse condition(s) detected at step 2102.

To validate any of the above adjustments, the affected waveguide system 1402 can be configured to transmit electromagnetic wave test signals on the power line 1410 to determine, for example, whether increasing or decreasing the wavelength of the electromagnetic waves, adjusting the fundamental and/or asymmetric modes, and/or adjusting the error correction scheme improves communications on the affected power line 1410. Testing can be performed in coordination with a downstream waveguide system using loop back techniques whereby, for example, the downstream waveguide system loops back the test signals sent by the affected waveguide system 1402 so that the affected waveguide system 1402 can analyze these signals. Alternatively, the downstream waveguide system can change its termination impedance to intentionally cause signal reflections of the test signals which enables the waveguide system 1402 to analyze such signals. In yet another embodiment, the downstream waveguide system can perform measurements and communicate such measurements back to the affected waveguide system 1402 as feedback data for analysis.

Once the waveguide system 1402 has chosen a mitigation strategy for adjusting the electromagnetic waves based on the above tests, the affected waveguide system 1402 can inform the downstream waveguide system at step 2110 how it intends to transmit signals. The notice provided to the downstream waveguide system can include information associated with parameters of the electromagnetic waves that are being adjusted by the affected waveguide system 1402 (e.g., changes to wavelength, fundamental mode, asymmetric modes, spatial orientation of asymmetric modes, carrier frequency, magnitude, phase, error correction, etc.). Once this information has been communicated to or otherwise coordinated with the downstream waveguide system, the affected waveguide system 1402 can begin at step 2112 to transmit or receive the adjusted electromagnetic waves thereby resuming communications with the downstream waveguide system.

In one embodiment, if the downstream waveguide system is located after the impairment 2210, the downstream waveguide system can receive the adjusted electromagnetic waves from the affected waveguide system 1402 and thereafter retransmit data retrieved from the adjusted electromagnetic waves with a different mode of communication for transmitting or receiving electromagnetic waves with other waveguide systems. The mode of communication chosen by the downstream waveguide system to communicate with other waveguide systems may be similar to or the same as the mode of communication previously used by the affected waveguide system 1402.

While the affected waveguide system 1402 is using the new mode of communication to mitigate the adverse condition detected at step 2102, the affected waveguide system 1402 can periodically monitor at step 2116 whether the adverse condition detected at step 2102 has been mitigated. This step can be the result of the network management system 1601 receiving information from field personnel indicating that the condition has been addressed, eliminated, removed, modified or otherwise mitigated, and then informing the affected waveguide system 1402 of this change. Alternatively, or in combination, the affected waveguide system 1402 can perform testing (via test signals sent thereby) to determine if the adverse condition has been addressed, eliminated, removed, modified or otherwise mitigated. If the adjusted mode of communication used by the affected waveguide system 1402 restores a quality of communication services that is considered satisfactory by the network management system 1601, then steps 2116-2118 may not be necessary, and any alarm condition raised by the affected waveguide system 1402 may be removed locally and at the network management system 1601.

When a source of degradation, disruption or impairment on power line 1410, such impairment 2210, requires repair, field personnel may utilize a passive waveguide having no active circuits (e.g., a cylindrical or rectangular strip of dielectric material) to address or remedy the effects of impairment 2210. Opposite ends of the passive waveguide can be coupled to unaffected portions of the power line 1410 located at opposite ends of the impairment 2210 to cause the electromagnetic waves to bypass the impairment 2210 and thereby propagate on an outer surface of the passive waveguide. Alternatively, a repeater 710 having active circuits such as shown in FIGS. 7 and 9 can be placed at opposite ends of the impairment 2210 to bypass the impairment. In yet another embodiment, a dielectric sleeve can be placed around the impairment 2210 so that electromagnetic waves travel on an outer surface of the sleeve. In another embodiment, field personnel can apply dielectric material on the impairment 2210 with a spray that emits a dielectric material that adheres to the impairment 2210, or by manually applying a compound of dielectric material that adheres to the impairment 2210. It will be appreciated that if the impairment is not caused by the affected power line 1410, such as a fallen tree branch or other obstructions, then removal of the obstruction would be the mitigation strategy likely chosen by field personnel.

Once the adverse condition detected at step 2102 has been addressed, eliminated, removed, modified or otherwise mitigated by any of the techniques described in the subject disclosure, the affected waveguide system 1402 can restore at step 2118 an original mode of communication used by the affected waveguide system 1402 for transmitting and receiving electromagnetic waves, or a new mode of communication maybe chosen by the affected waveguide system 1402 as a result of the mitigation strategy calling for a modification of the electromagnetic wave characteristics and/or a route of communications in the power grid 1603. The change in mode of communication may be determined by testing performed by the affected waveguide system 1402 and/or in response to instructions provided by the network management system 1601 to the affected waveguide system 1402.

It will be appreciated that other conditions may adversely affect electromagnetic wave communications on a transmission medium such as a power line. For example, water droplets can accumulate on an uninsulated power line (i.e., bare wire) due to rain and/or excessive humidity. Water droplets may be present on a top side or bottom side of an outer surface of the uninsulated power line. The accumulated droplets may in turn cause an attenuation of the electromagnetic waves traveling on the outer surface of the uninsulated power line and/or cause other distortions that may result in propagation losses and/or signal distortions. The embodiments of method 2100 of FIG. 21 can be used to reduce the adverse effects of water droplets, such as, for example, adjusting the wavelength of the electromagnetic waves. The affected waveguide system 1402 can also adjust the phase and/or magnitude of the electromagnetic waves singly or in combination with adjusting the wavelength.

Generally, electromagnetic waves on an uninsulated power line are symmetric electromagnetic waves operating according to a fundamental mode. However, the water droplets may cause asymmetric modes to arise. The affected waveguide system 1402 can take advantage of the asymmetric modes and use multiple instances of dielectric waveguides 2204 having different spatial positions (e.g., northeast, southeast, southwest and northwest) to in turn cause a spatial positioning of the asymmetric modes in a manner that may avoid water droplets located on a topside and/or bottom side of the uninsulated power line. The affected waveguide system 1402 can test one dielectric waveguide 2204 at a time, or multiple dielectric waveguides 2204 simultaneously. The affected waveguide system 1402 can also utilize an electromechanical system having, for example, linear motors that can rotate the multiple dielectric waveguides 2204 about the uninsulated power line. Additionally, a downstream waveguide system can have the same or similar configuration as the affected waveguide system 1402 (e.g., multiple and rotatable dielectric waveguides 2204). The affected waveguide system 1402 can communicate with the downstream waveguide system and coordinate any of the above tests by exchanging messages over a control channel of the affected power line 1410 (if possible), a wireless link between waveguide systems shown in FIG. 20, or by way of base station 2002.

Other or similar techniques described in the subject disclosure can be used to mitigate conditions that may be adverse to the transmission and/or reception of electromagnetic waves propagating on a surface of a transmission medium such as, without limitation, an insulated or uninsulated wire, underground wires, above or below ground conduits with a dielectric surface, and so on.

While for purposes of simplicity of explanation, the respective processes are shown and described as a series of blocks in FIG. 21, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. It is further noted that the processes of FIG. 21 can be further modified to perform any of the embodiments described in the subject disclosure.

Figure 23:
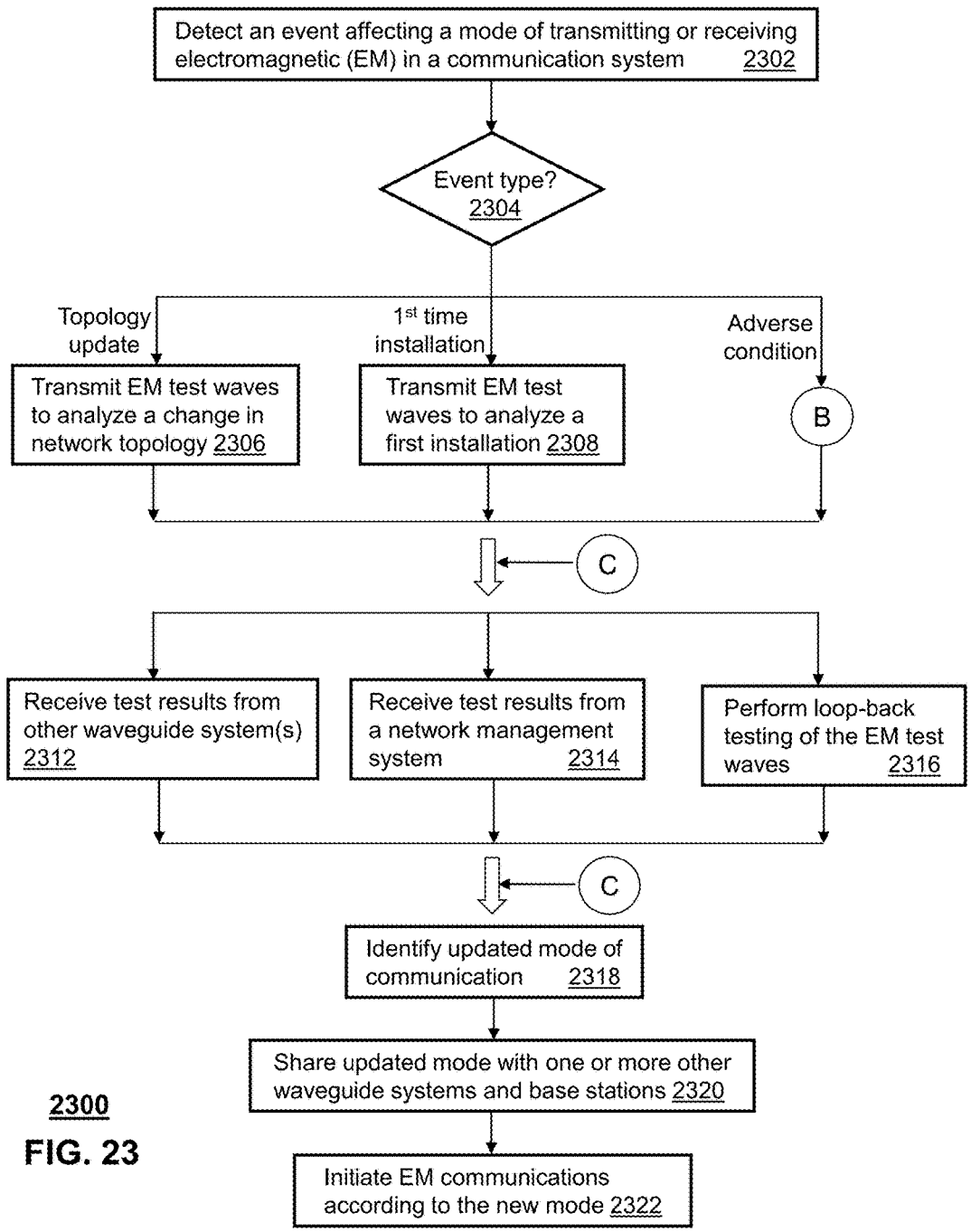
FIG. 23 illustrates a flow diagram of an example, non-limiting embodiment of a method for responding to an event occurring in a communication system.

FIG. 23 illustrates a flow diagram of an example, non-limiting embodiment of a method 2300 for responding to an event occurring in a communication system such as the communication system 1605 of FIG. 16. An event can represent any condition occurring or predicted to occur that adversely affects communications in one or more links (e.g., power lines) of communication system 1605. Method 2300 can begin with step 2302 where an event is detected by a waveguide system 1402. In one embodiment, the event type detected at step 2304 by the waveguide system 1402 can be a change in a network topology of the communication system 1605, for example, resulting from repairs and/or maintenance activity by field personnel. The change in network topology can also be a result of the use of secondary communication links (backup links) by one or more waveguide systems 1402 when responding to an adverse condition (e.g., down power lines). In another embodiment, the event type can be a first-time installation of a waveguide system 1402 (e.g., physical installation and/or a network installation), or a reset or restart event of the waveguide system 1402. At the time of installation of a waveguide system 1402 on a power line 1410, the waveguide system 1402 will need to determine how to configure electromagnetic wave communications between itself and other waveguide system(s) (e.g., selection of a carrier frequency to use, selection of a symmetric and/or asymmetric mode of communication, selection of power modes, protocol(s) selection, etc.). Similar actions can be performed, as part of a reboot sequence, if a waveguide system is reset or otherwise restarts (or alternatively, if the waveguide system changes). In yet another embodiment, the event type can be detection of an adverse condition (such as described by method 2100 of FIG. 21) that impairs the transmission or reception of electromagnetic waves or otherwise an event that could potentially impact the communication services of the waveguide system 1402 or other waveguide systems in communication with the waveguide system 1402.

The event detected by the waveguide system 1402 at step 2302 can be responsive to receiving at the waveguide system 1402 information provided by the network management system 1601 that describes an event (e.g., an event type, a time of occurrence of the event, recommended configuration(s) of the waveguide system 1402 to respond to the detected event, etc.). In one embodiment, the event detected by the waveguide system 1402 at step 2302 can be responsive to self-monitoring by the waveguide system 1402 such as, for example, using a state table to detect a first-time use of the waveguide system 1402, a reset, reboot, restart or power cycling of the waveguide system 1402 as well as other state changes requiring a communication mode analysis. Self-monitoring by the waveguide system 1402 can also include sending test packets in the electromagnetic waves directed to one or more waveguide systems to detect changes in a network topology of the communication system 1605, or a portion thereof, and using the sensors 1404 to test adverse conditions affecting the transmission or reception of electromagnetic waves (or communications data contained therein) as previously described. Events detected at step 2302 by the waveguide system 1402 can also be the result of a combination of receiving event information from the network management system 1601 and self-monitoring by the waveguide system 1402.

When a network topology change is detected, the waveguide system 1402 can generate and send at step 2306 electromagnetic test waves to determine how the network topology, or a portion thereof, has changed and/or how it affects transmission or reception of electromagnetic waves. In one embodiment, the network management system 1601 can provide information to the waveguide system 1402 that describes the new network topology, or differences/changes compared to the prior network topology. In another embodiment, the waveguide system 1402 can determine a change to the network topology without assistance of the network management system 1601 using the electromagnetic test waves. In the former embodiment, the electromagnetic test waves enable the waveguide system 1402 to determine which signal characteristics of the electromagnetic waves provide a desirable link performance between the waveguide system 1402 and other waveguide systems of the new network topology described by the network management system 1601. In the latter embodiment the waveguide system 1402 uses the electromagnetic test waves to determine how the network topology has changed (i.e., which power lines and/or waveguide systems are reachable) and thereafter (or contemporaneously) determines signal characteristics of the electromagnetic waves that provide a desirable link performance between the waveguide system 1402 and other waveguide systems of the new network topology.

To make these determinations, the electromagnetic test waves can be adjusted by the waveguide system 1402 for different modulation modes (e.g., phase shift keying, frequency shift keying, quadrature amplitude modulation, amplitude modulation, multi-carrier modulation and via multiple access techniques such as frequency division multiplexing, time division multiplexing, code division multiplexing, multiplexing via differing wave propagation modes and via other modulation and access strategies). The electromagnetic test waves can also be adjusted by the waveguide system 1402 for different multi-input multi-output (MIMO) modes for increasing the reliability of data communications in circumstances where the waveguide system 1402 includes multiple transmit or receive couplers to support MIMO communications. The electromagnetic test waves can also be adjusted by the waveguide system 1402 for different error correction modes for increasing the reliability of data communications, different wavelengths or carrier frequencies, different phases, different magnitudes, different spatial orientations of asymmetric modes, different spectral allocations, different network addresses to test different communication nodes in the new topology (e.g., waveguide system nodes, base station nodes, etc.), or any combination thereof. Similarly, for first time installation or other scenarios like resets, reboots, or restarts, the waveguide system 1402 can generate and send at step 2308 electromagnetic test waves (that can be adjusted as described above) to determine how best to establish communications with downstream waveguide systems, how to configure characteristics of electromagnetic waves transmitted and received from downstream waveguide systems, and so on. When the event is an adverse condition such as described for method 2100 of FIG. 21, the waveguide system 1402 can perform testing as described by method 2100.

Steps 2306 and 2308, and adverse condition testing depicted as step (B), can require coordinated testing between downstream waveguide system(s) and the waveguide system 1402 such as, for example, by sharing measurements/test results at step 2312, receiving test results from the network management system 1601 at step 2314, and/or establishing loop-back tests between the waveguide system 1402 and other waveguide system(s) at step 2316, among other possibilities. The waveguide system 1402 can identify at step 2318 an updated mode of communication based on an analysis of the electromagnetic test waves by the waveguide system 1402, and/or based on test results received from other waveguide systems and/or the network management system 1601 and then analyzed by the waveguide system 1402.

If the event is a first time installation, then the updated mode of communication can represent a first instance of a mode of communication chosen by the waveguide system 1402 for transmitting and receiving electromagnetic waves on the power line 1410. For other events such as changes to network topology and/or adverse conditions detected, the updated mode can replace a previous mode of communication used by the waveguide system 1402. The updated mode can include among other things, a chosen mode for transmitting electromagnetic waves (e.g., wavelength/carrier frequency, phase, magnitude, spatial positioning of asymmetric mode, number of asymmetric modes, spectral allocation, etc.). The updated mode can also represent a routing strategy for communicating with downstream waveguide system(s).

At step 2320, the waveguide system 1402 can share the new updated mode of communication with one or more other waveguide systems, base station(s), or other communication nodes of communication system 1605. Once this information has been shared, and downstream waveguide systems have acknowledged the update, the waveguide system 1402 can initiate electromagnetic wave communications according to the updated mode. For adverse conditions (step B), the waveguide system 1402 can perform any combination or subset of the steps of method 2100 of FIG. 21 and combine the results (e.g., step C) with any of the steps of method 2300 shown by illustration in FIG. 23.

Method 2300 can be repeated each time an event arises that may result in a change in a mode of communication by any of the waveguide systems of communication system 1605. While for purposes of simplicity of explanation, the respective processes are shown and described as a series of blocks in FIG. 23, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. It is further noted that the processes of FIG. 23 can be further modified to perform any of the embodiments described in the subject disclosure.

Figure 24:
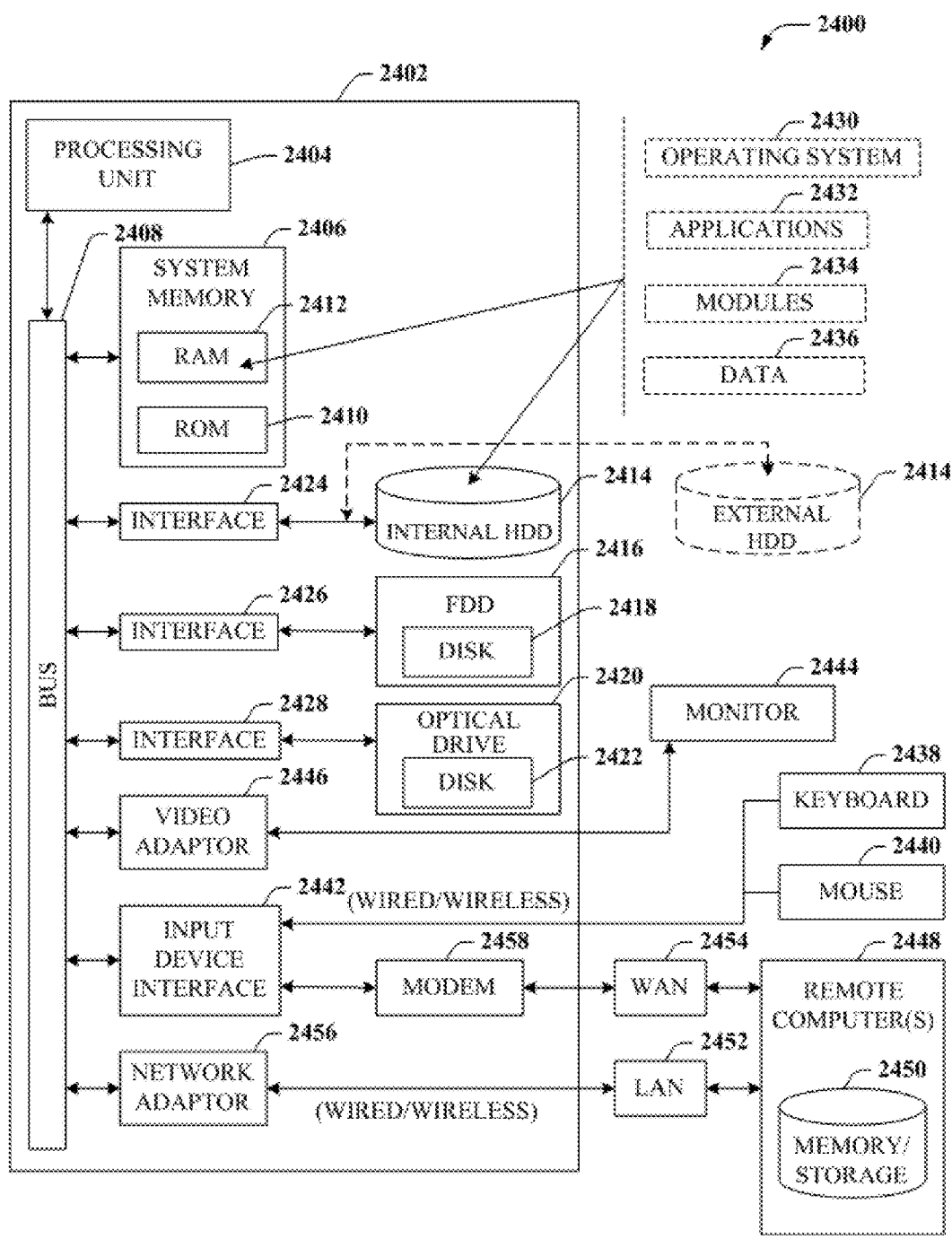
FIG. 24 is a block diagram of an example, non-limiting embodiment of a computing environment in accordance with various aspects described herein.

Referring now to FIG. 24, there is illustrated a block diagram of a computing environment in accordance with various aspects described herein. In order to provide additional context for various embodiments of the embodiments described herein, FIG. 24 and the following discussion are intended to provide a brief, general description of a suitable computing environment 2400 in which the various embodiments of the subject disclosure can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 24, the example environment 2400 for transmitting and receiving signals via or forming at least part of a base station (e.g., base station devices 102, 104, or 520) or central office (e.g., central office 101, 1411, or 2000). At least a portion of the example environment 2400 can also be used for repeater devices (e.g., repeater devices 710, or 806). The example environment can comprise a computer 2402, the computer 2402 comprising a processing unit 2404, a system memory 2406 and a system bus 2408. The system bus 2408 couples system components including, but not limited to, the system memory 2406 to the processing unit 2404. The processing unit 2404 can be any of various commercially available processors. Dual microprocessors and other multi-processor architectures can also be employed as the processing unit 2404.

The system bus 2408 can be any of several types of bus structure that can further interconnect to a memory bus (with or without a memory controller), a peripheral bus, and a local bus using any of a variety of commercially available bus architectures. The system memory 2406 comprises ROM 2410 and RAM 2412. A basic input/output system (BIOS) can be stored in a non-volatile memory such as ROM, erasable programmable read only memory (EPROM), EEPROM, which BIOS contains the basic routines that help to transfer information between elements within the computer 2402, such as during startup. The RAM 2412 can also comprise a high-speed RAM such as static RAM for caching data.

The computer 2402 further comprises an internal hard disk drive (HDD) 2414 (e.g., EIDE, SATA), which internal hard disk drive 2414 can also be configured for external use in a suitable chassis (not shown), a magnetic floppy disk drive (FDD) 2416, (e.g., to read from or write to a removable diskette 2418) and an optical disk drive 2420, (e.g., reading a CD-ROM disk 2422 or, to read from or write to other high capacity optical media such as the DVD). The hard disk drive 2414, magnetic disk drive 2416 and optical disk drive 2420 can be connected to the system bus 2408 by a hard disk drive interface 2424, a magnetic disk drive interface 2426 and an optical drive interface 2428, respectively. The interface 2424 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2402, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 2412, comprising an operating system 2430, one or more application programs 2432, other program modules 2434 and program data 2436. All or portions of the operating system, applications, modules, and/or data can also be cached in the RAM 2412. The systems and methods described herein can be implemented utilizing various commercially available operating systems or combinations of operating systems. Examples of application programs 2432 that can be implemented and otherwise executed by processing unit 2404 include the diversity selection determining performed by repeater device 806. Base station device 508 shown in FIG. 5, also has stored on memory many applications and programs that can be executed by processing unit 2404 in this exemplary computing environment 2400.

A user can enter commands and information into the computer 2402 through one or more wired/wireless input devices, e.g., a keyboard 2438 and a pointing device, such as a mouse 2440. Other input devices (not shown) can comprise a microphone, an infrared (IR) remote control, a joystick, a game pad, a stylus pen, touch screen or the like. These and other input devices are often connected to the processing unit 2404 through an input device interface 2442 that can be coupled to the system bus 2408, but can be connected by other interfaces, such as a parallel port, an IEEE 1394 serial port, a game port, a universal serial bus (USB) port, an IR interface, etc.

A monitor 2444 or other type of display device can be also connected to the system bus 2408 via an interface, such as a video adapter 2446. It will also be appreciated that in alternative embodiments, a monitor 2444 can also be any display device (e.g., another computer having a display, a smart phone, a tablet computer, etc.) for receiving display information associated with computer 2402 via any communication means, including via the Internet and cloud-based networks. In addition to the monitor 2444, a computer typically comprises other peripheral output devices (not shown), such as speakers, printers, etc.

The computer 2402 can operate in a networked environment using logical connections via wired and/or wireless communications to one or more remote computers, such as a remote computer(s) 2448. The remote computer(s) 2448 can be a workstation, a server computer, a router, a personal computer, portable computer, microprocessor-based entertainment appliance, a peer device or other common network node, and typically comprises many or all of the elements described relative to the computer 2402, although, for purposes of brevity, only a memory/storage device 2450 is illustrated. The logical connections depicted comprise wired/wireless connectivity to a local area network (LAN) 2452 and/or larger networks, e.g., a wide area network (WAN) 2454. Such LAN and WAN networking environments are commonplace in offices and companies, and facilitate enterprise-wide computer networks, such as intranets, all of which can connect to a global communications network, e.g., the Internet.

When used in a LAN networking environment, the computer 2402 can be connected to the local network 2452 through a wired and/or wireless communication network interface or adapter 2456. The adapter 2456 can facilitate wired or wireless communication to the LAN 2452, which can also comprise a wireless AP disposed thereon for communicating with the wireless adapter 2456.

When used in a WAN networking environment, the computer 2402 can comprise a modem 2458 or can be connected to a communications server on the WAN 2454 or has other means for establishing communications over the WAN 2454, such as by way of the Internet. The modem 2458, which can be internal or external and a wired or wireless device, can be connected to the system bus 2408 via the input device interface 2442. In a networked environment, program modules depicted relative to the computer 2402 or portions thereof, can be stored in the remote memory/storage device 2450. It will be appreciated that the network connections shown are example and other means of establishing a communications link between the computers can be used.

The computer 2402 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

Figure 25:
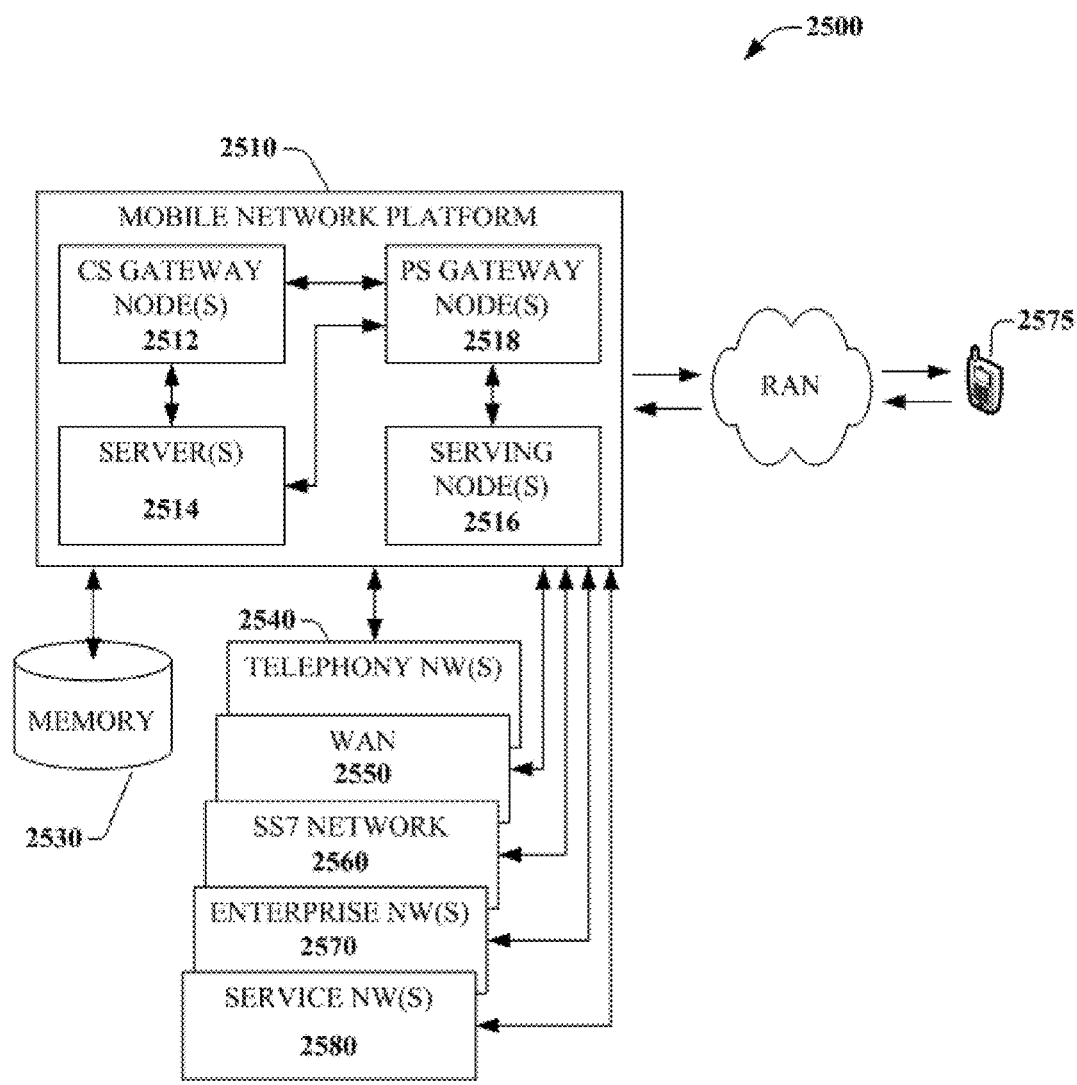
FIG. 25 is a block diagram of an example, non-limiting embodiment of a mobile network platform in accordance with various aspects described herein.

FIG. 25 presents an example embodiment 2500 of a mobile network platform 2510 that can implement and exploit one or more aspects of the disclosed subject matter described herein. In one or more embodiments, the mobile network platform 2510 can generate and receive signals transmitted and received by base stations (e.g., base station devices 102, 104 or 520), central office (e.g., central office 101, 1411, or 2000), or repeater devices (e.g., repeater devices 710, or 806) associated with the disclosed subject matter. Generally, wireless network platform 2510 can comprise components, e.g., nodes, gateways, interfaces, servers, or disparate platforms, that facilitate both packet-switched (PS) (e.g., internet protocol (IP), frame relay, asynchronous transfer mode (ATM)) and circuit-switched (CS) traffic (e.g., voice and data), as well as control generation for networked wireless telecommunication. As a non-limiting example, wireless network platform 2510 can be included in telecommunications carrier networks, and can be considered carrier-side components as discussed elsewhere herein. Mobile network platform 2510 comprises CS gateway node(s) 2512 which can interface CS traffic received from legacy networks like telephony network(s) 2540 (e.g., public switched telephone network (PSTN), or public land mobile network (PLMN)) or a signaling system #7 (SS7) network 2570. Circuit switched gateway node(s) 2512 can authorize and authenticate traffic (e.g., voice) arising from such networks. Additionally, CS gateway node(s) 2512 can access mobility, or roaming, data generated through SS7 network 2570; for instance, mobility data stored in a visited location register (VLR), which can reside in memory 2530. Moreover, CS gateway node(s) 2512 interfaces CS-based traffic and signaling and PS gateway node(s) 2518. As an example, in a 3GPP UMTS network, CS gateway node(s) 2512 can be realized at least in part in gateway GPRS support node(s) (GGSN). It should be appreciated that functionality and specific operation of CS gateway node(s) 2512, PS gateway node(s) 2518, and serving node(s) 2516, is provided and dictated by radio technology(ies) utilized by mobile network platform 2510 for telecommunication.

In addition to receiving and processing CS-switched traffic and signaling, PS gateway node(s) 2518 can authorize and authenticate PS-based data sessions with served mobile devices. Data sessions can comprise traffic, or content(s), exchanged with networks external to the wireless network platform 2510, like wide area network(s) (WANs) 2550, enterprise network(s) 2570, and service network(s) 2580, which can be embodied in local area network(s) (LANs), can also be interfaced with mobile network platform 2510 through PS gateway node(s) 2518. It is to be noted that WANs 2550 and enterprise network(s) 2560 can embody, at least in part, a service network(s) like IP multimedia subsystem (IMS). Based on radio technology layer(s) available in technology resource(s) 2517, packet-switched gateway node(s) 2518 can generate packet data protocol contexts when a data session is established; other data structures that facilitate routing of packetized data also can be generated. To that end, in an aspect, PS gateway node(s) 2518 can comprise a tunnel interface (e.g., tunnel termination gateway (TTG) in 3GPP UMTS network(s) (not shown)) which can facilitate packetized communication with disparate wireless network(s), such as Wi-Fi networks.

In embodiment 2500, wireless network platform 2510 also comprises serving node(s) 2516 that, based upon available radio technology layer(s) within technology resource(s) 2517, convey the various packetized flows of data streams received through PS gateway node(s) 2518. It is to be noted that for technology resource(s) 2517 that rely primarily on CS communication, server node(s) can deliver traffic without reliance on PS gateway node(s) 2518; for example, server node(s) can embody at least in part a mobile switching center. As an example, in a 3GPP UMTS network, serving node(s) 2516 can be embodied in serving GPRS support node(s) (SGSN).

For radio technologies that exploit packetized communication, server(s) 2514 in wireless network platform 2510 can execute numerous applications that can generate multiple disparate packetized data streams or flows, and manage (e.g., schedule, queue, format . . . ) such flows. Such application(s) can comprise add-on features to standard services (for example, provisioning, billing, customer support . . . ) provided by wireless network platform 2510. Data streams (e.g., content(s) that are part of a voice call or data session) can be conveyed to PS gateway node(s) 2518 for authorization/authentication and initiation of a data session, and to serving node(s) 2516 for communication thereafter. In addition to application server, server(s) 2514 can comprise utility server(s), a utility server can comprise a provisioning server, an operations and maintenance server, a security server that can implement at least in part a certificate authority and firewalls as well as other security mechanisms, and the like. In an aspect, security server(s) secure communication served through wireless network platform 2510 to ensure network's operation and data integrity in addition to authorization and authentication procedures that CS gateway node(s) 2512 and PS gateway node(s) 2518 can enact. Moreover, provisioning server(s) can provision services from external network(s) like networks operated by a disparate service provider; for instance, WAN 2550 or Global Positioning System (GPS) network(s) (not shown). Provisioning server(s) can also provision coverage through networks associated to wireless network platform 2510 (e.g., deployed and operated by the same service provider), such as the distributed antennas networks shown in FIG. 1(*s*) that enhance wireless service coverage by providing more network coverage. Repeater devices such as those shown in FIGS. 7, 8, and 9 also improve network coverage in order to enhance subscriber service experience by way of UE 2575.

It is to be noted that server(s) 2514 can comprise one or more processors configured to confer at least in part the functionality of macro network platform 2510. To that end, the one or more processor can execute code instructions stored in memory 2530, for example. It is should be appreciated that server(s) 2514 can comprise a content manager 2515, which operates in substantially the same manner as described hereinbefore.

In example embodiment 2500, memory 2530 can store information related to operation of wireless network platform 2510. Other operational information can comprise provisioning information of mobile devices served through wireless platform network 2510, subscriber databases; application intelligence, pricing schemes, e.g., promotional rates, flat-rate programs, couponing campaigns; technical specification(s) consistent with telecommunication protocols for operation of disparate radio, or wireless, technology layers; and so forth. Memory 2530 can also store information from at least one of telephony network(s) 2540, WAN 2550, enterprise network(s) 2560, or SS7 network 2570. In an aspect, memory 2530 can be, for example, accessed as part of a data store component or as a remotely connected memory store.

In order to provide a context for the various aspects of the disclosed subject matter, FIG. 25, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that perform particular tasks and/or implement particular abstract data types.

Figure 26:
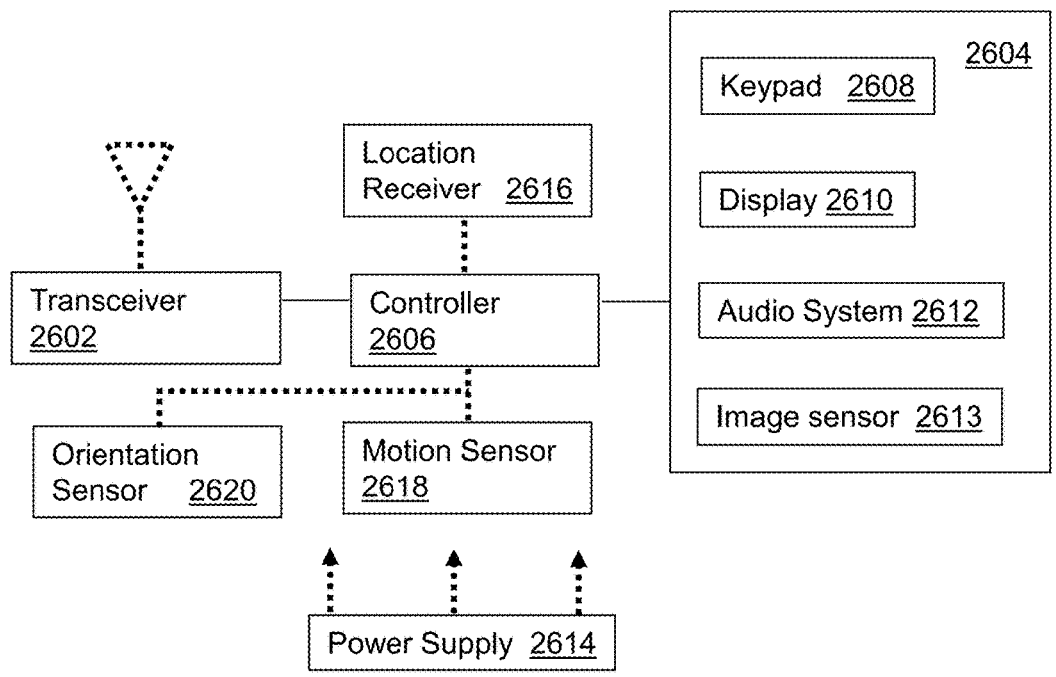
FIG. 26 is a block diagram of an example, non-limiting embodiment of a communication device in accordance with various aspects described herein.

FIG. 26 depicts an illustrative embodiment of a communication device 2600. The communication device 2600 can serve as an illustrative embodiment of devices such as mobile devices and in-building devices referred to by the subject disclosure (e.g., in FIGS. 1 and 14).

The communication device 2600 can comprise a wireline and/or wireless transceiver 2602 (herein transceiver 2602), a user interface (UI) 2604, a power supply 2614, a location receiver 2616, a motion sensor 2618, an orientation sensor 2620, and a controller 2606 for managing operations thereof. The transceiver 2602 can support short-range or long-range wireless access technologies such as Bluetooth®, ZigBee®, WiFi, DECT, or cellular communication technologies, just to mention a few (Bluetooth® and ZigBee® are trademarks registered by the Bluetooth® Special Interest Group and the ZigBee® Alliance, respectively). Cellular technologies can include, for example, CDMA-1x, UMTS/HSDPA, GSM/GPRS, TDMA/EDGE, EV/DO, WiMAX, SDR, LTE, as well as other next generation wireless communication technologies as they arise. The transceiver 2602 can also be adapted to support circuit-switched wireline access technologies (such as PSTN), packet-switched wireline access technologies (such as TCP/IP, VoIP, etc.), and combinations thereof.

The UI 2604 can include a depressible or touch-sensitive keypad 2608 with a navigation mechanism such as a roller ball, a joystick, a mouse, or a navigation disk for manipulating operations of the communication device 2600. The keypad 2608 can be an integral part of a housing assembly of the communication device 2600 or an independent device operably coupled thereto by a tethered wireline interface (such as a USB cable) or a wireless interface supporting for example Bluetooth®. The keypad 2608 can represent a numeric keypad commonly used by phones, and/or a QWERTY keypad with alphanumeric keys. The UI 2604 can further include a display 2610 such as monochrome or color LCD (Liquid Crystal Display), OLED (Organic Light Emitting Diode) or other suitable display technology for conveying images to an end user of the communication device 2600. In an embodiment where the display 2610 is touch-sensitive, a portion or all of the keypad 2608 can be presented by way of the display 2610 with navigation features.

The display 2610 can use touch screen technology to also serve as a user interface for detecting user input. As a touch screen display, the communication device 2600 can be adapted to present a user interface having graphical user interface (GUI) elements that can be selected by a user with a touch of a finger. The touch screen display 2610 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 2610 can be an integral part of the housing assembly of the communication device 2600 or an independent device communicatively coupled thereto by a tethered wireline interface (such as a cable) or a wireless interface.

The UI 2604 can also include an audio system 2612 that utilizes audio technology for conveying low volume audio (such as audio heard in proximity of a human ear) and high volume audio (such as speakerphone for hands free operation). The audio system 2612 can further include a microphone for receiving audible signals of an end user. The audio system 2612 can also be used for voice recognition applications. The UI 2604 can further include an image sensor 2613 such as a charged coupled device (CCD) camera for capturing still or moving images.

The power supply 2614 can utilize common power management technologies such as replaceable and rechargeable batteries, supply regulation technologies, and/or charging system technologies for supplying energy to the components of the communication device 2600 to facilitate long-range or short-range portable communications. Alternatively, or in combination, the charging system can utilize external power sources such as DC power supplied over a physical interface such as a USB port or other suitable tethering technologies.

The location receiver 2616 can utilize location technology such as a global positioning system (GPS) receiver capable of assisted GPS for identifying a location of the communication device 2600 based on signals generated by a constellation of GPS satellites, which can be used for facilitating location services such as navigation. The motion sensor 2618 can utilize motion sensing technology such as an accelerometer, a gyroscope, or other suitable motion sensing technology to detect motion of the communication device 2600 in three-dimensional space. The orientation sensor 2620 can utilize orientation sensing technology such as a magnetometer to detect the orientation of the communication device 2600 (north, south, west, and east, as well as combined orientations in degrees, minutes, or other suitable orientation metrics).

The communication device 2600 can use the transceiver 2602 to also determine a proximity to a cellular, WiFi, Bluetooth®, or other wireless access points by sensing techniques such as utilizing a received signal strength indicator (RSSI) and/or signal time of arrival (TOA) or time of flight (TOF) measurements. The controller 2606 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 2600.

Other components not shown in FIG. 26 can be used in one or more embodiments of the subject disclosure. For instance, the communication device 2600 can include a slot for adding or removing an identity module such as a Subscriber Identity Module (SIM) card or Universal Integrated Circuit Card (UICC). SIM or UICC cards can be used for identifying subscriber services, executing programs, storing subscriber data, and so on.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

Some of the embodiments described herein can also employ artificial intelligence (AI) to facilitate automating one or more features described herein. For example, artificial intelligence can be used to determine positions around a wire that dielectric waveguides 604 and 606 should be placed in order to maximize transfer efficiency. The embodiments (e.g., in connection with automatically identifying acquired cell sites that provide a maximum value/benefit after addition to an existing communication network) can employ various AI-based schemes for carrying out various embodiments thereof. Moreover, the classifier can be employed to determine a ranking or priority of the each cell site of the acquired network. A classifier is a function that maps an input attribute vector, $x=(x1, x2, x3, x4, \ldots, xn)$, to a confidence that the input belongs to a class, that is, $f(x)=confidence(class)$. Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches comprise, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated, one or more of the embodiments can employ classifiers that are explicitly trained (e.g., via a generic training data) as well as implicitly trained (e.g., via observing UE behavior, operator preferences, historical information, receiving extrinsic information). For example, SVMs can be configured via a learning or training phase within a classifier constructor and feature selection module. Thus, the classifier(s) can be used to automatically learn and perform a number of functions, including but not limited to determining according to a predetermined criteria which of the acquired cell sites will benefit a maximum number of subscribers and/or which of the acquired cell sites will add minimum value to the existing communication network coverage, etc.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A method, comprising:
   transmitting, by a waveguide system via a coupler, electromagnetic test waves on a transmission medium, wherein the electromagnetic test waves propagate at least in part on an outer surface of the transmission medium and are directed to another waveguide system coupled to the transmission medium, wherein the electromagnetic test waves propagate, without requiring an electrical return path, on the outer surface of the transmission medium; and
   based on an analysis of the electromagnetic test waves, determining, by the waveguide system, an updated wave propagation mode of communication for transmitting or receiving, along the transmission medium, adjusted electromagnetic waves between the waveguide system via the coupler and the another waveguide.

2. The method of claim 1, further comprising:
   determining, by the waveguide system, an event associated with communication services provided by the waveguide system; and
   generating, by the waveguide system, the electromagnetic test waves responsive to detecting the event.

3. The method of claim 2, wherein the event comprises a first-time installation of the waveguide system.

4. The method of claim 2, wherein the event comprises a change in a network topology of a communication system.

5. The method of claim 2, wherein the event comprises a condition adversely affecting transmission or reception of electromagnetic waves on the transmission medium.

6. The method of claim 2, wherein the determining the event comprises receiving event data from a network management system, the event data being descriptive of the event.

7. The method of claim 1, wherein the electromagnetic test waves have a plurality of wavelengths.

8. The method of claim 1, wherein the electromagnetic test waves have a plurality of spectral allocations.

9. The method of claim 1, wherein the electromagnetic test waves have a plurality of spatial orientations of asymmetric modes included in the electromagnetic test waves.

10. The method of claim 1, wherein the electromagnetic test waves have a plurality of phases or a plurality of magnitudes.

11. The method of claim 1, wherein the electromagnetic test waves have a plurality of network addresses, each network address selectively directing portions of the electromagnetic test waves to a plurality of waveguide systems including the another waveguide system to determine a network topology of a communication system.

12. The method of claim 1, wherein the electromagnetic test waves have a plurality of modulation modes, and wherein the electromagnetic test waves have a plurality of error correction modes.

13. The method of claim 1, further comprising receiving or transmitting, by the waveguide system, electromagnetic waves according to the updated wave propagation mode of communication, wherein the updated wave propagation mode of communication results in an adjustment of a characteristic of the electromagnetic waves or data transported by the electromagnetic waves.

14. A waveguide system, comprising:
   a coupler that facilitates transmission or reception of electromagnetic waves that propagate at least in part along a surface of a transmission medium, wherein the electromagnetic waves enable communication services with another waveguide system coupled to the transmission medium via a mode of communication;
   a memory that stores instructions; and
   a processor coupled to the memory, wherein responsive to executing the instructions, the processor performs operations comprising:
      transmitting, via the coupler, electromagnetic test waves on the surface of the transmission medium, wherein the electromagnetic test waves propagate, without requiring an electrical return path, on the surface of the transmission medium; and
      based on an analysis of the electromagnetic test waves, determining an updated wave propagation mode of communication for transmitting or receiving adjusted electromagnetic waves along the transmission medium.

15. The waveguide system of claim 14, wherein the operations further comprise detecting an event potentially impacting the communication services, and wherein the transmission medium enables the communication services with the another waveguide system, and wherein the processor comprises a plurality of processors operating in a distributed processing environment.

16. The waveguide system of claim 15, wherein the event comprises a first-time installation of the waveguide system, a reset of the waveguide system, or a change in a network topology of a communication system from which the waveguide system operates.

17. The waveguide system of claim 14, wherein the operations further comprise generating the electromagnetic test waves according to a plurality of wavelengths, a plurality of phases, a plurality of magnitudes, a plurality of carrier frequencies, a plurality of spatial orientations of asymmetric modes included in the electromagnetic test waves, a plurality of network addresses, a plurality of modulation modes, or a plurality of error correction modes.

18. The waveguide system of claim 14, wherein the operations further comprise receiving or transmitting the adjusted electromagnetic waves according to the updated wave propagation mode of communication, and wherein the updated wave propagation mode of communication is associated with an adjustment of a characteristic of the electromagnetic waves previously transmitted or received by the waveguide system, or data transported by the adjusted electromagnetic waves.

19. A machine-readable storage device, comprising instructions, which when executed by a processor of a waveguide system, cause the processor to perform operations comprising:
   detecting an event associated with a mode of transmitting or receiving, via a coupler, electromagnetic waves on an outer surface of a transmission medium;

identifying according to the event an updated wave propagation mode for transmitting or receiving adjusted electromagnetic waves on the outer surface of the transmission medium; and transmitting or receiving, via the coupler, the adjusted electromagnetic waves based on the updated wave propagation mode, wherein the adjusted electromagnetic waves propagate, without requiring an electrical return path, along the transmission medium.

20. The machine-readable storage device of claim 19, wherein the identifying the updated wave propagation mode comprises:

transmitting test signals on the transmission medium; and identifying the updated wave propagation mode according to the transmitting of the test signals.

* * * * *